United States Patent
Devarajan et al.

(10) Patent No.: US 9,525,428 B2
(45) Date of Patent: Dec. 20, 2016

(54) RANDOMLY SAMPLING REFERENCE ADC FOR CALIBRATION

(71) Applicant: ANALOG DEVICES, INC., Norwood, MA (US)

(72) Inventors: Siddharth Devarajan, Arlington, MA (US); Eric Otte, Boston, MA (US); Nevena Rakuljic, San Diego, CA (US); Carroll C. Speir, Pleasant Garden, NC (US)

(73) Assignee: ANALOG DEVICES, INC., Norwood ( * ) Notice: Subject to any disclaimer, the term of this patent is extended or adjusted under 35 U.S.C. 154(b) by 0 days.

(21) Appl. No.: 14/955,905

(22) Filed: Dec. 1, 2015

(65) Prior Publication Data

US 2016/0182075 A1    Jun. 23, 2016

Related U.S. Application Data

(60) Provisional application No. 62/093,391, filed on Dec. 17, 2014.

(51) Int. Cl.
*H03M 1/12*    (2006.01)
*H03M 1/10*    (2006.01)
(Continued)

(52) U.S. Cl.
CPC ........... *H03M 1/128* (2013.01); *H03M 1/1019* (2013.01); *H03M 1/1028* (2013.01);
(Continued)

(58) Field of Classification Search
CPC .. H03M 1/121; H03M 1/1215; H03M 1/1028; H03M 1/28; H03M 1/1265
See application file for complete search history.

(56) References Cited

U.S. PATENT DOCUMENTS

| | | |
|---|---|---|
| 5,047,772 A | 9/1991 | Ribner |
| 5,187,481 A | 2/1993 | Hiller |

(Continued)

FOREIGN PATENT DOCUMENTS

EP    3 021 489    5/2016

OTHER PUBLICATIONS

Ex-Parte Quayle Office Action issued in U.S. Appl. No. 14/955,888, mailed Apr. 7, 2016, 11 pages.
(Continued)

*Primary Examiner* — Howard Williams
(74) *Attorney, Agent, or Firm* — Patent Capital Group

(57) ABSTRACT

Analog-to-digital converters (ADCs) can have errors which can affect their performance. To improve the performance, many techniques have been used to compensate or correct for the errors. When the ADCs are being implemented with sub-micron technology, ADCs can be readily and easily equipped with an on-chip microprocessor for performing a variety of digital functions. The on-chip microprocessor and any suitable digital circuitry can implement functions for reducing those errors, enabling certain undesirable artifacts to be reduced, and providing a flexible platform for a highly configurable ADC. The on-chip microprocessor is particularly useful for a randomized time-interleaved ADC. Moreover, a randomly sampling ADC can be added in parallel to a main ADC for calibration purposes. Furthermore, the overall system can include an efficient implementation for correcting errors in an ADC.

20 Claims, 23 Drawing Sheets

(51) Int. Cl.
*H03M 1/46* (2006.01)
*H03M 3/00* (2006.01)

(52) U.S. Cl.
CPC ............. *H03M 1/121* (2013.01); *H03M 1/46* (2013.01); *H03M 1/462* (2013.01); *H03M 1/468* (2013.01); *H03M 3/382* (2013.01); *H03M 3/498* (2013.01); *H03M 1/12* (2013.01)

(56) References Cited

U.S. PATENT DOCUMENTS

| | | | |
|---|---|---|---|
| 5,239,299 A | 8/1993 | Apple et al. | |
| 5,493,298 A | 2/1996 | Bartz | |
| 5,638,071 A | 6/1997 | Capofreddi et al. | |
| 6,771,203 B1 | 8/2004 | Nairn | |
| 6,784,814 B1 | 8/2004 | Nair et al. | |
| 6,894,530 B1 | 5/2005 | Davidson et al. | |
| 6,900,750 B1 | 5/2005 | Nairn | |
| 6,982,664 B1 | 1/2006 | Nairn | |
| 7,053,804 B1 | 5/2006 | Nairn | |
| 7,138,933 B2 | 11/2006 | Nairn | |
| 7,161,514 B2* | 1/2007 | Tamba | H03M 1/1038 341/120 |
| 7,245,638 B2* | 7/2007 | Agazzi | H03M 1/0624 370/516 |
| 7,250,885 B1 | 7/2007 | Nairn | |
| 7,372,386 B1 | 5/2008 | Maloberti et al. | |
| 7,602,323 B2 | 10/2009 | Galton et al. | |
| 7,843,373 B2 | 11/2010 | Carreau | |
| 7,961,123 B2* | 6/2011 | Nagarajan | H03M 1/1057 341/118 |
| 8,368,571 B2 | 2/2013 | Siragusa | |
| 8,723,707 B2 | 5/2014 | Ali | |
| 8,890,729 B2 | 11/2014 | Lewis et al. | |
| 9,041,571 B2 | 5/2015 | Wang et al. | |
| 9,294,112 B1 | 3/2016 | Devarajan et al. | |
| 2006/0097901 A1 | 5/2006 | Draxelmayr et al. | |
| 2006/0238397 A1 | 10/2006 | Nairn | |
| 2010/0220000 A1 | 9/2010 | Carreau | |
| 2011/0001645 A1 | 1/2011 | Messier et al. | |
| 2012/0075129 A1* | 3/2012 | Kidambi | H03M 1/1052 341/118 |
| 2013/0120174 A1 | 5/2013 | Ali | |
| 2013/0321053 A1 | 12/2013 | Bogner et al. | |
| 2014/0152478 A1 | 6/2014 | Lewis et al. | |
| 2015/0280725 A1* | 10/2015 | van Engelen | H03M 1/0678 341/118 |
| 2016/0182073 A1 | 6/2016 | Speir et al. | |
| 2016/0182074 A1 | 6/2016 | Speir et al. | |

OTHER PUBLICATIONS

Ex-Parte Quayle Office Action issued in U.S. Appl. No. 14/955,916, 6 pages.
John P. Keane et al., *Background Interstage Gain Calibration Technique for Pipelined ADCs*, Department of Electrical and Computer Engineering, University of California, Davis, CA, Manuscript submitted Oct. 9, 2003; revised May 6, 2004, 33 pages.
Carl R. Grace et al., *A 12-bit 80-Msample/s Pipelined ADC with Bootstrapped Digital Calibration*, University of California, Davis, CA, Dec. 9, 2004, 36 pages.
Eric Siragusa et al., *A Digitally Enhanced 1.8-V 15-bit 40-MSample/s CMOS Pipelined ADC*, IEEE Journal of Solid State Circuits, vol. 39, No. 12, Dec. 2004, 13 pages.
Andrew N. Karanicolas et al., *A 15-b 1-Msample/s Digitally Self-Calibrated Pipeline ADC*, IEEE Journal of Solid State Circuits, vol. 28, No. 12, Dec. 1993, 9 pages.
Robert Jewett et al., *FA 8.4: A 12b 128MSample/s ADC with 0.05LSB DNL*, ISSCC97 / Session 8 / Data Converters / Paper FA 8.4, 1997 IEEE International Solid State Circuits Conference, 3 pages.
Ozan E. Eroğan et al., *WA 18.1: A 12b Digital-Background-Calibrated Algorithmic ADC with -90dB THD*, ISSCC99 / Session 18 / Paper WA 18.1, 1999 IEEE International Solid State Circuits Conference, 3 pages.
Ozan E. Eroğan et al., *A 12-b Digital-Background-Calibrated Algorithmic ADC with -90-dB THD*, IEEE Journal of Solid State Circuits, vol. 34, No. 12, Dec. 1999, 9 pages.
Mohammad Taherzadeh-Sani et al., *Digital Background Calibration of Interstage-Gain and Capacitor-Mismatch Errors in Pipelined ADCs*, ISCAS 2006, 4 pages.
Takashi Oshima et al., *Novel Sampling Timing Background Calibration for Time-Interleaved A/D Converters*, © 2009 IEEE, 978-1-4244-4480-9/09, 4 pages.
Li Ding et al., *An Efficient DAC and Interstage Gain Error Calibration Technique for Multi-bit Pipelined ADCs*, © 2010 IEEE, 978-1-4244-7456-1/10, 4 pages.
Bob Vergruggen, *Digitally Assisted Analog to Digital Converters*, High-Performance AD and DA Converters, IC Design in Scaled Technologies and Time-Domain Signal Processing, DOI: 10-1007-978-3-319-07938-7_2 © Springer International Publishing, Switzerland 2015, 21 pages.
AD7705/AD7706/AD7707 Instrument Converter FAQs: Calibration, Analog Devices, Ver. 1.06 10/03, Instrumentation Center Tech Note, www.analog.com/sigma-delta, 4 pages.
Zhang Yiwen et al., *A 14-bit 200-MS/s time-interleaved ADC with sample-time error calibration*, Journal of Semiconductors, vol. 33, No. 10, Oct. 2012, 6 pages.
V. Ferragina et al., *Gain and Offset Mismatch Calibration in Time-Interleaved Multipath A/D Sigma-Delta Modulators*, IEEE Transactions on Circuits and Systems I: Regular Papers, vol. 51, Issue 12, Dec. 2004, 10 pages.
Karen Anundson et al., *Pipeline ADC with a Nonlinear Gain Stage and Digital Correction*, Worcester Polytechnic Institute, Mar. 2011, 92 pages.
Ivan Timothy Bogue, *Digitally Assisted ADCs*, Dissertation, The University of Michigan, 2008, 97 pages.
Sun Kexu et al., *A fast combination calibration of foreground and background for pipelined ADCs*, © 2012 Chinese Institute of Electronics, Journal of Semiconductors, vol. 33, No. 6, Jun. 2012, 11 pages.
Abhilash Nair et al., *Design of a 16-bit 10MHZ Pipeline ADC Using the Split-ADC Architecture in 0.25µCMOS*, Worcester Polytechnic Institute, Oct. 15, 2007, 97 pages.
Jonathan Harris, *Interleaved ADCs: The Basics*, Planet Blog, Sep. 10, 2014, retrieved from http.//www.planetanalog.com/author.asp?section_id=3041&doc_id=559992, 3 pages.
Ashish Kumar et al., *Reducing EMI in digital systems through spread spectrum clock generators*, Cypress Perform, EE Time Design, Feb. 2011, 6 pages.
Justo Lapiedra, *Spread Spectrum Clocking Using the CDCS502/503*, Application Report SCAA103—Aug. 2009, Texas Instruments, 6 pages.
AN-804 *Improving A/D Converter Performance Using Dither*, Texas Instruments, Literature No. SNOA232, 10 pages.
*Spread Spectrum Clocking*, Microsemi White Paper, Jun. 2015 © 2015 Microsemi Corporation, 6 pages.
Francesco Zanini, *Architectural Improvements Towards an Efficient 16-18 Bit 100-200 MSPS ADC, Master Engineering Science Thesis*, Institute of Microelectronics and Wireless Systems, Department of Electronic Engineering, National University of Ireland, Maynooth Ireland, May 10, 2007, 203 pages.
Notice of Allowance issued in U.S. Appl. No. 14/955,916 mailed Apr. 26, 2016, 11 pages.
EP Search Report issued in EP Patent Application Serial No. 15200032.9 mailed Jun. 9, 2016, 14 pages.
Huawen Jin et al., *Time-Interleaved A/D Converter with Channel Randomization*, 0-7803-3583-X/97 © 1997 IEEE, 4 pages.
Boris Murmann, *A 12-bit 75-MS/s Pipelined ADC Using Open-Loop Residue Amplification*, IEEE Journal of Solid-State Circuits, vol. 38, No. 12, Dec. 2003, 12 pages.
Yun-Shiang Shu et al., *A 15-bit Linear 20-MS/s Pipelined ADC Digitally Calibrated With Signal-Dependent Dithering*, IEEE Journal of Solid-State Circuits, vol. 40, No. 2, Feb. 2008, 10 pages.

(56) References Cited

OTHER PUBLICATIONS

Tim Regan et al., *Easy-to-use Spread Spectrum Clock Generator Reduces EMI and More*, Design Features, Linear Technology Magazine, Feb. 2004, 6 pages.

\* cited by examiner

RANDOMLY SAMPLING REFERENCE ADC FOR CALIBRATION

PRIORITY DATA

This patent application receives benefit from or claims priority to U.S. Provisional Application 62/093,391, entitled "DIGITALLY ASSISTED TECHNIQUES FOR ANALOG-TO-DIGITAL CONVERTERS" filed on Dec. 17, 2014. The provisional application is incorporated by reference herein in its entirety.

TECHNICAL FIELD OF THE DISCLOSURE

The present invention relates to the field of integrated circuits, in particular to digitally assisted techniques usable for analog-to-digital converters.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon, e.g., light, sound, temperature or pressure for data processing purposes. Designing an ADC is a non-trivial task because each application may have different needs in performance, power, cost and size. ADCs are used in a broad range of applications including communications, energy, healthcare, instrumentation and measurement, motor and power control, industrial automation and aerospace/defense. As the applications needing ADCs grow, the need for accurate and reliable conversion performance also grows.

Generally speaking ADCs are electronic devices that convert a continuous physical quantity carried by an analog signal to a digital number that represents the quantity's amplitude (or to a digital signal carrying that digital number). An ADC is typically composed of many devices making up an integrated circuit or a chip. An ADC is usually defined by the following application requirements: its bandwidth (the range of frequencies of analog signals it can properly convert to a digital signal), its resolution (the number of discrete levels the maximum analog signal can be divided into and represented in the digital signal), and its signal to noise ratio (how accurately the ADC can measure signal relative to the noise the ADC introduces). ADCs have many different designs, which can be chosen based on the application requirements. In many cases, it is not trivial to design an ADC that meets the application requirements while providing adequate performance.

Overview

Analog-to-digital converters (ADCs) can have errors which can affect their performance, in particular, their (effective) resolution. Speed and resolution is often a tradeoff, where higher speed ADCs tend to have lower resolution. As the speed of ADCs become faster, the need for measures to compensate or correct for these errors is higher so that the ADCs do not gain speed while losing resolution. To improve the performance, many techniques have been used to compensate or correct for the errors. When the ADCs are being implemented with sub-micron technology, ADCs can be readily and easily equipped with an on-chip microprocessor for performing a variety of digital functions. The on-chip microprocessor and any suitable digital circuitry can implement a wealth of functions for reducing those errors, enabling certain undesirable artifacts to be reduced, and providing a flexible platform for a highly configurable ADC. The on-chip microprocessor is particularly useful for a randomized time-interleaved ADC. Moreover, a randomly sampling ADC can be added in parallel to a main ADC (e.g., randomized time-interleaved ADC) for calibration purposes. Furthermore, the overall system can include an efficient implementation for correcting errors in an ADC (e.g., a multi-stage ADC).

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Understanding Analog-to-Digital Converters (ADCs)

There are many flavors of ADCs, each aiming to output a digital representation of the analog input provided to the ADC. The following passages discusses several of these flavors.

Figure 1:
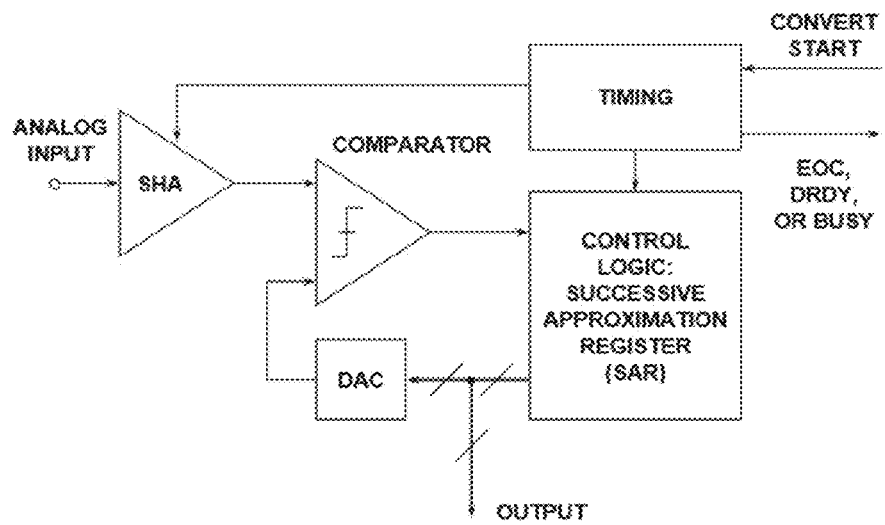
FIG. 1 shows an exemplary successive-approximation ADC, according to some embodiments of the disclosure.
Figure 2:
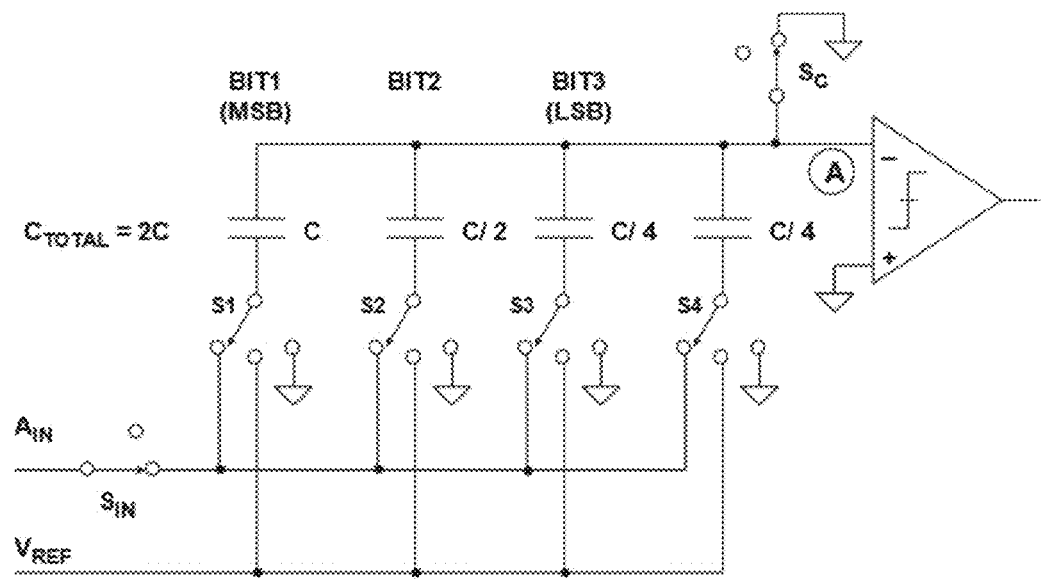
FIG. 2 shows an exemplary internal DAC used for an SAR ADC, according to some embodiments of the disclosure.

One example flavor of ADCs is the Successive Approximation Register ADC (SAR ADC). SAR ADCs are used often for data acquisition applications, especially where multiple channels are to be digitized. FIG. 1 shows an exemplary successive-approximation ADC, according to some embodiments of the disclosure. In one example, on the assertion of the CONVERTSTART command the sample-and-hold (SHA) is placed in the hold mode, and all the bits of the successive approximation register (SAR) are reset to "0" except the MSB which is set to "1". The SAR output drives the internal digital-to-analog converter (DAC). If the DAC output is greater than the analog input, this bit in the SAR is reset, otherwise it is left set. The next most significant bit is then set to "1". If the DAC output is greater than the analog input, this bit in the SAR is reset, otherwise it is left set. The process is repeated with each bit in turn. When all the bits have been set, tested, and reset or not as appropriate, the contents of the SAR correspond to the value of the analog input, and the conversion is complete. These bit "tests" can form the basis of a serial output version SAR-based ADC. Other algorithms besides this one can be used to generate the digital representation of the analog input. The accuracy of the SAR ADC can be affected by the accuracy of the internal DAC. FIG. 2 shows an exemplary internal DAC used for an SAR ADC, according to some embodiments of the disclosure. The exemplary internal DAC, shown using switched capacitor or charge redistribution techniques, can determine the overall accuracy and linearity of the SAR ADC. Even with precise lithography, matching of the capacitors is not always perfect, and can degrade the performance of the SAR ADC if left untrimmed.

Figure 3:
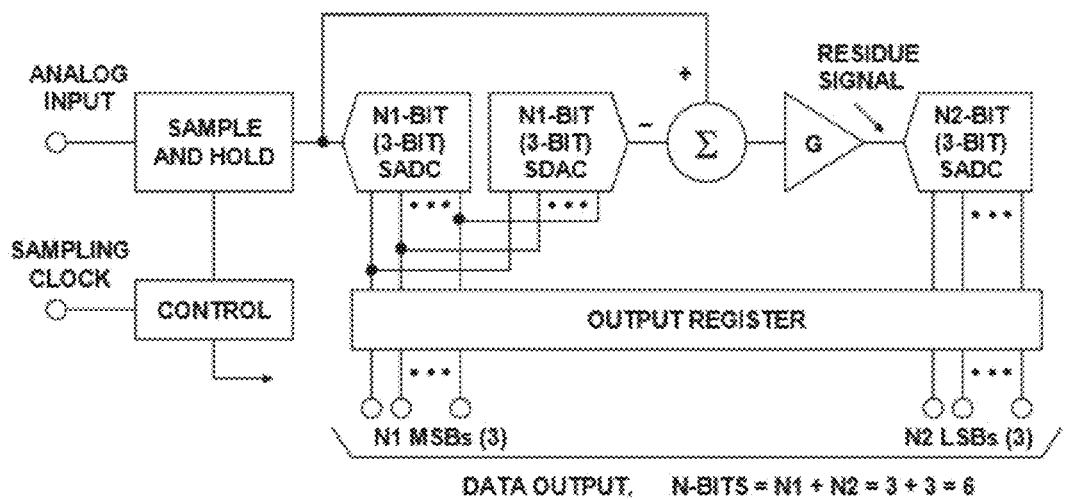
FIG. 3 shows an exemplary subranging ADC, according to some embodiments of the disclosure.
Figure 4:
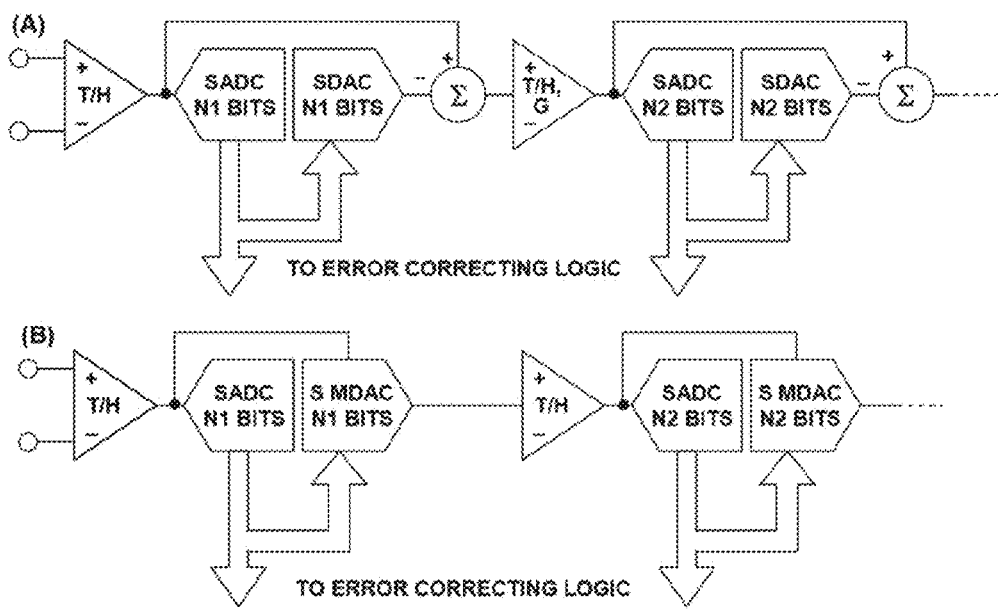
FIG. 4 shows two exemplary pipelined ADCs, according to some embodiments of the disclosure.

Another example flavor of ADCs is the pipelined ADC, which is typically categorized as a high speed ADC (e.g., with sample rates above 5 million samples per second (MSPS) or even above 10 MSPS). Pipelined ADCs are used often with video, sampling radio applications, instrumentation (digital oscilloscopes, digital spectrum analyzers), etc. Pipelined ADCs have their origins in subranging ADCs. FIG. 3 shows an exemplary subranging ADC, according to some embodiments of the disclosure. As illustrated by this example, a subranging ADC has two stages: a "coarse" conversion of N1 bits in the MSB sub-ADC (SADC), followed by a "fine" conversion of N2 bits in the LSB SADC. The N1-bit "coarse" conversion is converted back to analog by an N1 bit sub-DAC (SDAC), and subtracted from the held analog signal and amplified to generate a residue signal. The residue signal is then applied to the N2 bit SADC. Typically, for the subranging architecture to operate satisfactorily, both the N1 SADC and SDAC are better than N-bits accurate (N=N1+N2). The residue signal offset and gain is adjusted such that it fills the range of the N2 SADC to avoid missing codes. Any non-linearity or drift in the N2 SADC would also cause missing codes if it exceeds 1 LSB referenced to N-bits. When the interstage alignment is not correct, missing codes would appear in the overall ADC transfer function. To increase the speed of the subranging ADC, pipelined ADCs are introduced. FIG. 4 shows two pipelined ADCs, according to some embodiments of the disclosure. Pipelined ADCs has a digitally corrected subranging architecture, in which each of the two stages operates on the data for one-half of the conversion cycle, and then passes its residue output to the next stage in the "pipeline" prior to the next phase of the sampling clock. In the top drawing (A), two pipelined stages use an interstage track and hold (T/H) to provide interstage gain and give each stage some amount of time to process the signal at is input. The interstage T/H serves as an analog delay line—it is timed to enter the hold mode when the first-stage conversion is complete. This allows more settling time for the internal SADCs, SDACs, and amplifiers, and allows the pipelined converter to operate at a much higher overall sampling rate than a non-pipelined version. The term "pipelined" refers to the ability of one stage to process data from the previous stage during any given clock cycle. At the end of each phase of a particular clock cycle, the output of a given stage is passed on to the next stage using the T/H functions and new data is shifted into the stage. The digital outputs of all but the last stage in the "pipeline" can be stored in the appropriate number of shift registers so that the digital data arriving at the correction logic corresponds to the same sample. In the bottom drawing (B), an alternative architecture, a multiplying DAC is used to provide the appropriate amount of interstage gain as well as the subtraction function. In pipelined ADCs, phases of the clocks to the T/H amplifiers are important for achieving desired performance. It is understood by one skilled in the art that there are many different implementations or designs for a pipelined ADC. For instance, some pipelined ADCs uses flash converters as building blocks, but some ADCs utilize other architectures for the individual ADCs. Flash converters make use of parallel comparators each operating at a slightly different reference voltage determined by a resistor ladder network.

Figure 5:
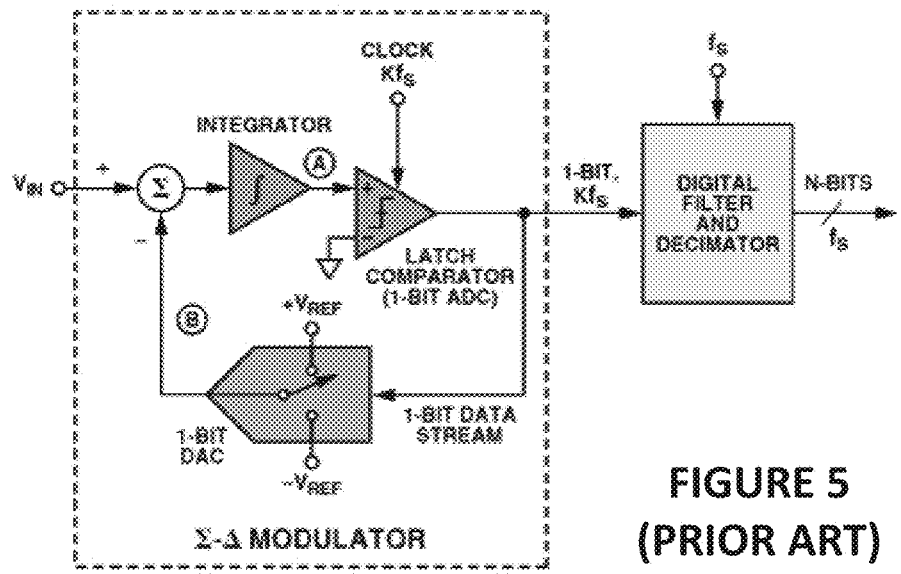
FIG. 5 shows an exemplary sigma-delta modulator, according to some embodiments of the disclosure.
Figure 6:
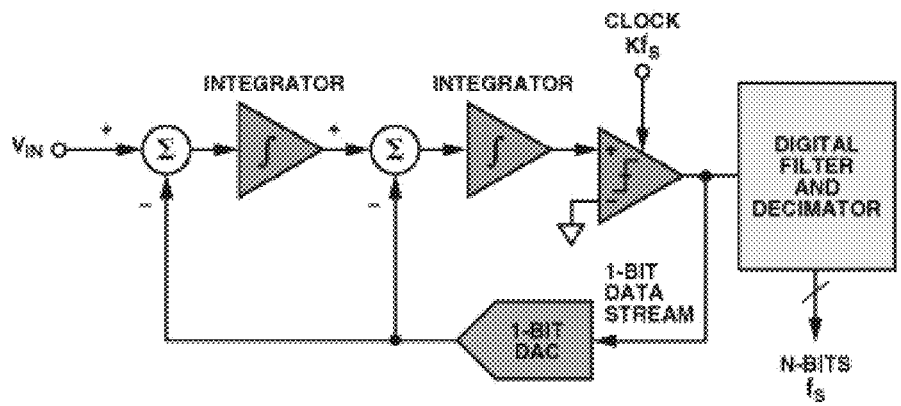
FIG. 6 shows an exemplary second-order sigma-delta modulator, according to some embodiments of the disclosure.
Figure 6:
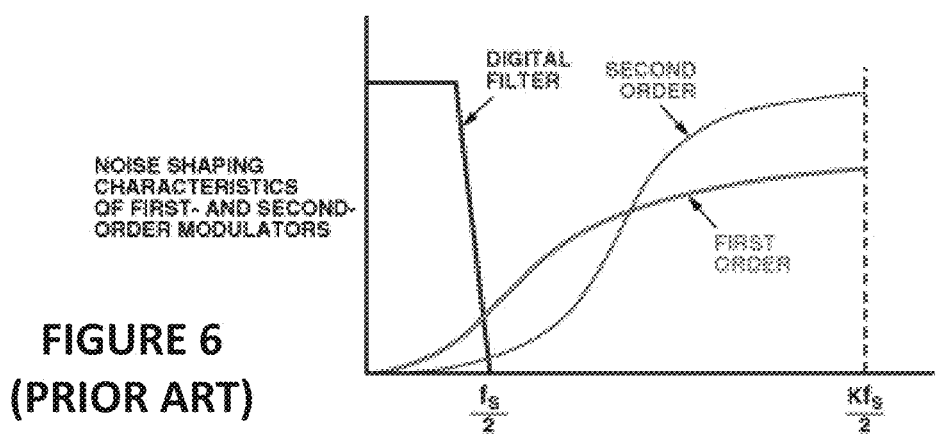

Yet another flavor of ADCs is the sigma-delta ADC, which is often used in precision industrial measurement, voiceband, and audio application space. The concepts used in sigma-delta ADCs are oversampling, noise shaping, digital filtering, and decimation. In a noise spectrum for traditional "Nyquist" operation, where the ADC input signal falls between dc and $f_S/2$, and the quantization noise is uniformly spread over the same bandwidth. The process of oversampling, followed by digital filtering and decimation, increases the signal-to-noise ratio (SNR) within the Nyquist bandwidth (dc-to-$f_S/2$ region). Moreover, when a sigma-delta modulator is used, the quantization noise can be shaped such that most of it occurs outside the bandwidth of interest, thereby further increasing the SNR in the dc-to-$f_S/2$ region. FIG. 5 shows an exemplary sigma-delta modulator, according to some embodiments of the disclosure. The exemplary modulator includes a 1-bit ADC (e.g., a comparator) and a 1-bit DAC (e.g., a switch). Although there are a number of multibit sigma-delta ADCs, those using the single-bit modulator have the advantage of inherently excellent differential linearity. The output of the modulator is a 1-bit stream of data. The modulator can accomplish the noise-shaping function by acting as a low-pass filter for the signal and a high-pass filter for the quantization noise. Although the simple first-order single-bit $\Sigma$-$\Delta$ ADC is inherently linear and monotonic because of the 1-bit ADC and 1-bit DAC, it does not provide sufficient noise shaping for high-resolution applications. Increasing the number of integrators in the modulator (similar to adding poles to a filter) provides more noise shaping at the expense of a more complex design. FIG. 6 shows an exemplary second-order sigma-delta modulator, according to some embodiments of the disclosure. Besides showing the architecture, the figure also shows the improvement in the noise shaping characteristic compared to a first-order modulator. Higher-order modulators (greater than third order) are difficult to stabilize and present significant design challenges.

Figure 7A:
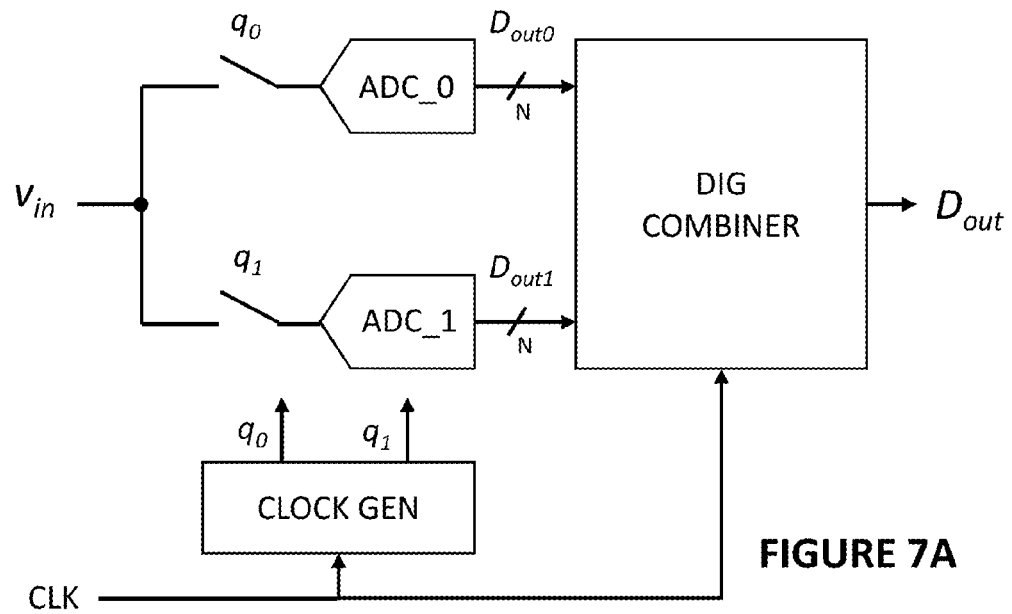
FIG. 7A shows an exemplary time-interleaved ADC having two sub-ADCs.
Figure 7B:
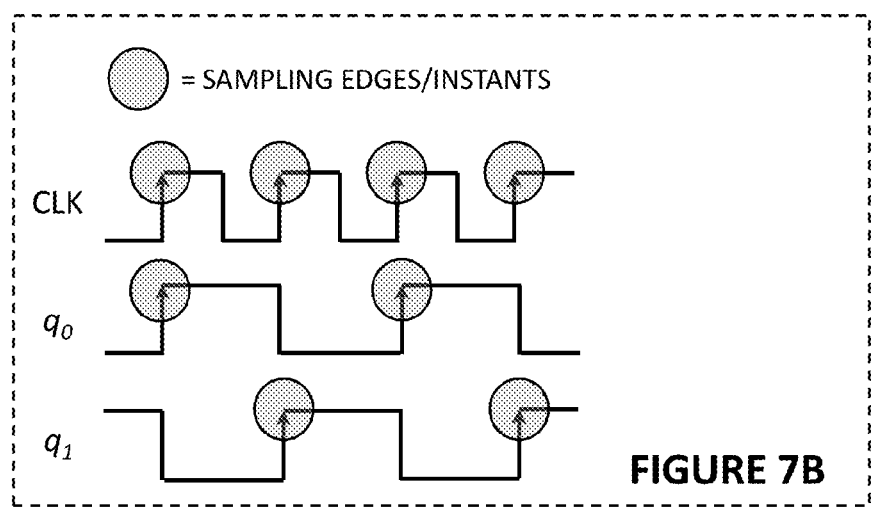
FIG. 7B shows a timing diagram illustrating sampling edges for the exemplary time-interleaved ADC of FIG. 7A.

Yet a further flavor of ADCs is the time-interleaved ADC, where an ADC has M multiple sub-ADCs (of any suitable architecture), which are running at a sample rate of 1/M of the overall system sample rate. The result drastically increases to increase the sample rate of the overall ADC. Many (low-speed) ADCs can be used in parallel, operating in sequence in a time-interleaved fashion, using appropriate clocking to increase the effective combined ADC sampling rate. FIG. 7A shows an exemplary time-interleaved ADC having two sub-ADCs, and FIG. 7B shows a timing diagram illustrating sampling edges for the exemplary time-interleaved ADC of FIG. 7A. In particular, FIG. 7A shows an example of a time-interleaved ADC having two sub-ADCs, ADC_0 and ADC_1, each able to produce Y million samples per second (MS/s). Together, with appropriate clocking shown in FIG. 7B, the two sub-ADCs can provide an overall sampling rate up to 2×Y MS/s. The appropriate clocking can be provided by clock generator ("clock gen" block) to produce clock signals or selection signals, $q_0$ and $q_1$, having different phases, to alternately select a sub-ADC for converting the analog input signal to a digital output. Referring back to FIG. 7A, the two sub-ADCs, ADC_0 and ADC_1, alternately (i.e., in sequential order or according to a fixed sequence) sample the input signal $v_{in}$ and produce corresponding digital outputs, $D_{out0}$ and $D_{out1}$ respectively, which are then combined by the digital combiner ("dig combiner" block) to produce the Y MS/s digital output $D_{out}$. In this example, the sub-ADCs operate according to a fixed sequence of [ . . . ADC_0, ADC_1, ADC_0, ADC_1, ADC_0, ADC_1, . . . ], e.g., in a round-robin fashion. A time-interleaved ADC having two sub-ADC is described herein as an example for understanding the operations of a time-interleaved ADC, and is not intended to be limiting to the disclosure. Other time-interleaved ADCs having more than two sub-ADCs are envisioned by the disclosure. Furthermore, time-interleaved ADCs having three or more sub-ADCs can operate in a fixed sequence, a randomized sequence, or a pseudo-randomized sequence.

Two or more ADCs can sample, interleaved in time according to a randomized sequence or a pseudo-randomized sequence, the analog input. In such an example, the ADCs can be built fast enough that having as little as two ADCs can sample the analog input in a randomized sequence. In some embodiments, three or more ADCs can sample, interleaved in time according to a randomized sequence or pseudo-randomized sequence. In such an example, one or more of the three or more ADCs may be "busy", while two or more ones of the three or more ADCs may be "idle" (waiting to be selected/used). When the next sample is to be made, one of the "idle" ADCs can be selected at random from the ones which are "idle" to take the next sample in the pseudo-randomized sequence.

Yet another flavor of ADCs are multi-stage ADCs comprising multiple stages of analog-to-digital conversion, or multiple ADCs in cascade. Each stage generally includes an ADC. Stages can use the same or different ADC architectures to resolve different parts of digital output code. Typically, a first analog-to-digital conversion stage resolves the most significant bit(s) based on the analog input and generates an output for the second (following the first) analog-to-digital conversion stage. The output can be a residue representing the difference between the analog input and the digital output generated by a particular stage (i.e., the value of the most significant bit(s) resolved by the first stage). The second analog-to-digital conversion stage then performs analog-to-digital conversion on the residue signal to resolve further bit(s) of the digital output. The second stage can generate a further residue signal for following stage(s) of the multi-stage ADC. In some cases, a successive approximation register ADC can be considered a multi-stage ADC (e.g., if a segmented design is implemented to resolve the most significant bits using a simple ADC and further bits are resolved by a SAR charge distribution architecture). Residue type ADCs including two-step ADCs, algorithmic ADCs, and pipeline ADCs are also considered as multi-stage ADCs. While the algorithmic ADCs can reuse a single stage, each phase the single ADC is being reused can be considered a stage in the multi-stage ADC. Another form of multi-stage ADCs is a multi-stage noise shaping sigma-delta (MASH) ADC, comprising multiple stages of delta-sigma ADCs or a combination of other type(s) of ADCs (e.g., flash ADC) and delta-sigma ADC(s).

The above-described ADC architectures are not intended to be limiting to the disclosure. One skilled in the art that other architectures are envisioned by the present disclosure.

Errors and Artifacts of ADCs

Although circuit designers aim to design and fabricate the perfect ADC, the circuitry of resulting ADC are often not perfect, or may not operate exactly as intended due to limitations in fabrication. Sometimes the circuitry's behavior may also deviate from intended or desirable behavior due to changes in operating conditions such as temperature, and aging of the substrate. These deviations can often lead to ADCs having undesirable errors and artifacts. For SAR ADCs, the one common source of error is the mismatches of the capacitors of the internal DAC. For delta-sigma ADCs, sources of error include offset errors, gain errors, and linearity errors. For pipelined ADCs, the sources of error include comparator offset errors, reference voltage errors, phases of the clocks fed to the interstage T/H, thermal noise, sampling clock jitter, capacitor mismatch, interstage gain stage error, gain stage offset, interstage gain non-linearity, sub-ADC errors, sub-DAC errors, etc. For interleaved ADCs, sources of error for the individual sub-ADCs are present, as well as mismatches between the sub-ADCs in gain, offset, timing, bandwidth can exist.

Introduction of Microprocessors on-chip with ADCs

Figure 8:
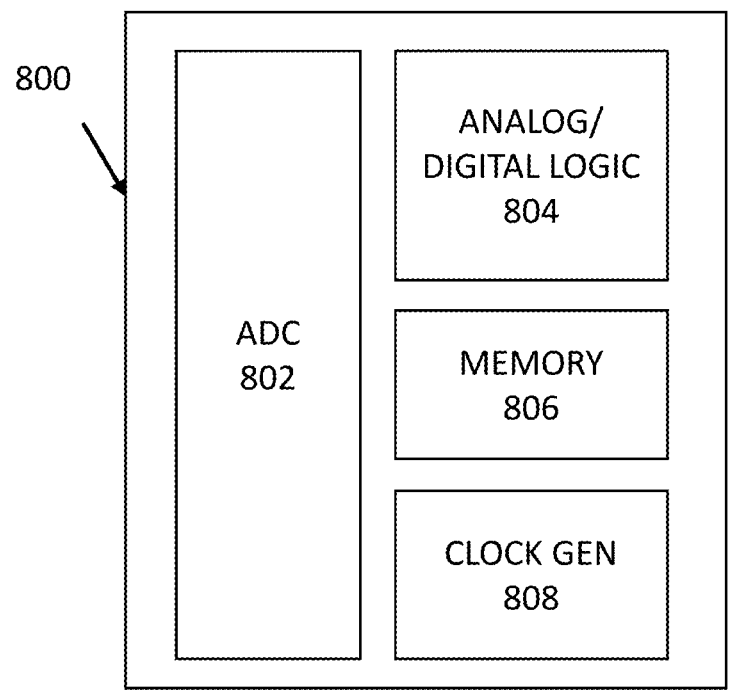
FIG. 8 shows an exemplary layout of a conventional ADC chip having dedicated and specialized analog or digital processing circuitry.

In conventional ADCs, dedicated and specialized analog and/or digital circuitry are provided on-chip or off-chip with the ADCs to measure, compensate and/or correct these errors. In some cases, the dedicated and specialized analog or digital circuitry can perform pre-/post processing of signals. FIG. 8 shows an exemplary layout of a conventional ADC chip having dedicated and specialized analog or digital processing circuitry. It can be seen from the illustrative chip area layout of a chip 800 has an ADC 802 area, an analog/digital logic 804 area for calibration ("cal") and/or pre-/post-processing of signals, an optional memory 806 area for storing output digital data, and a clock generator 808 ("clock gen") area for generating clock signals. Providing these dedicated and specialized analog or digital logic can add significant complexity and design time. Also, the circuitry is fixed without considerable configurability.

Figure 9:
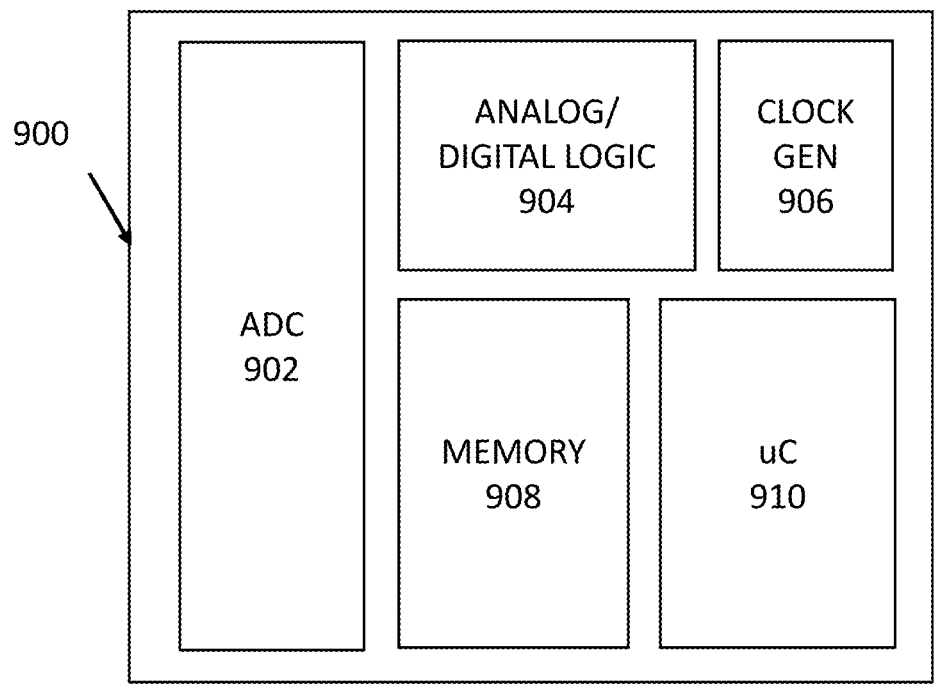
FIG. 9 shows an exemplary layout of a ADC chip having an on-chip microprocessor, according to some embodiments of the disclosure.

FIG. 9 shows an exemplary layout of an improved ADC chip having an on-chip microprocessor, according to some embodiments of the disclosure. It can be seen from the illustrative chip area layout of a chip 900 has an ADC 902 area, an analog/digital logic 904 area for performing parts of calibration and/or pre-/post-processing of signals, an on-chip microprocessor (uP) 910 area for performing at least some parts of calibration and/or pre-/post-processing of signals, a memory 908 area for storing data and/or instructions executable by the uP 910, and a clock generator 906 ("clock gen") area for generating clock signals.

Within the context of the present disclosure, the on-chip uP (e.g., on-chip uP 910) generally include circuitry that can perform functions of a processing unit, or a central processing unit. The on-chip uP can include one or more arithmetic and logic unit (ALUs) as computation units, which can perform operations such as addition, subtraction, multiplication, AND, OR, XOR, etc. The on-chip uP can include a register file or some form of memory for storing states, data, etc. The on-chip uP can include a control logic section which can retrieve instruction operation codes from memory, and initiates a sequence of operations to be executed by one or more ALUs. The on-chip uP can include interfaces for accessing data and/or instructions from other parts of the chip, e.g., such as data from the ADC. The on-chip uP can include interfaces for writing data in other parts of the chip as well. The on-chip uP may include one or more interrupts that the ADC or any specialized circuitry can use to wake up the on-chip uP and/or trigger particular function(s) of the on-chip uP.

One important advantage of providing an on-chip uP is the flexibility that the uP can provide over the conventional ADC (e.g., such as the one shown in FIG. 8). Another important advantage is that an on-chip uP has a set of computation units readily available for performing parts of calibration and/or pre-/post-processing of signals, making the on-chip uP highly suitable for providing digital functions for assisting the ADC. The uP being on-chip can also communicate with the ADC in a much faster manner than an off-chip uP. The uP also lends itself easily to accommodate an architecture where the on-chip uP can act as the central controller for digitally controlling various parts of the chip, including the ADC and the digital/analog logic. For instance, the uP can be used to address failure mechanisms (phased-locked loop locks, out of range conditions, etc.) of an ADC system. In some embodiments, the uP can perform control-like functions which can advantageously control clocking/sampling of the ADC to limit spurious emissions of the ADC (or any suitable system).

Flexibility of on-chip Microprocessor

Without having to rely on dedicated and specialized circuitry fixed on-chip, the on-chip uP can be configured to execute any suitable instructions to perform desired operations. This provides the technical advantage of being able to provide one chip which can adapt to many applications having different sets of requirements. Generally speaking, the on-chip uP is provided on the same semiconductor substrate as the ADC itself. The on-chip uP can provide different levels of configurability without requiring silicon changes. In some cases, the on-chip uP can be pre-loaded with different chunks of code designed for different applications in, e.g., non-volatile memory (NVM), read-only memory (ROM). Fuses can be used to provide a (one-time) selection of the desired chunk(s) of code to be executed by the uP, e.g., after tape-out, at the factory before the chip is delivered to the customer, or at the customer site prior to using the chip. One or more signals or pins can also be used to select (once or multiple times) the desired chunk(s) of code to be executed by the uP. In some embodiments, an interface can also be provided to allow a user of the chip to load one or more chunks of code onto (volatile) memory to be executed by the uP. Effectively, the functions being performed by the uP for assisting the ADC can be changed or upgraded without silicon changes. This advantage can be useful for updating or changing the calibration algorithms being performed, the operations of the digital/analog logic, and/or operations performed for pre-/post processing of signals. The configurability of the on-chip uP, and its accompanying on-chip memory also allows different parameters and/or variables to be set/configured/updated on demand, e.g., to accommodate different operating conditions, different environments of the chip (over time), and different application requirements.

Broadly speaking, an interface to the uP can allow characteristics or parameters of the ADC to be changed. For instance, the interface to the uP can configure the ADC to run in different modes of operation (e.g., test mode, high power mode, low power mode, high performance mode, low performance mode, high frequency mode, low frequency mode, etc.). The interface to the uP can also allow configuration of the ADC to turn on or off certain channels within the ADC, change the resolution of the ADC, adjust the dynamic range of the ADC, etc. Furthermore, the interface to the uP can enable certain functions such as the logging of errors, abnormal events, etc. and access to on-chip or off-chip memory can access the logs. In some cases, the interface to the uP can allow users to select one or more presets of functions and/or parameters for certain applications.

Techniques for calibration are evolving as the resolution for converters continue to grow higher and/or the speed for converters continue to grow faster. For instance, previous techniques applied to 6-bit or 8-bit converter is less likely to be applicable to 12-bit, 14-bit, 16-bit, 18-bit (or more) converters. Some of the calibration functions described herein can address issue of increasing requirements, which may lead to calibration functions which are more sophisticated or specialized for different applications. For this reason, having a flexible platform for configuring calibration to meet different sets of application requirements can be particularly advantageous. For instance, specialized calibration functions can be selectively applied to push the performance higher depending on the application.

Moving Towards More Digital Processing as Technology Nodes Get Smaller

Generally speaking, many conventional architectures implement calibration functions using specialized analog hardware instead of using an on-chip uP, or the architectures implement specialized digital hardware instead of using an on-chip uP. There can be several tradeoffs between implementing functions using specialized circuitry versus implementing functions using the on-chip uP. In one example, specialized circuitry can be faster and consumes less power than an on-chip uP. In another example, specialized circuitry can take up less area on-chip than providing an on-chip uP. In yet another example, specialized circuitry is fixed is far less configurable than functions executable by an on-chip uP. In yet a further example, the computation blocks in an uP are "ready-to-use" (i.e., already designed), thus can be considered easier to implement than having to design the specialized circuitry for implementing the same computation blocks. In yet an even further example, some types of functions (e.g., mathematical computations, control functions) can be easier to implement using the internal digital logic of an uP than having to implement those functions with specialized circuitry.

As the technology nodes of Complementary metal-oxide-semiconductor (CMOS) process technology become smaller, digital correction and processing becomes cheaper. One reason for moving towards digital correction, and go as far to provide an on-chip uP, is that the digital processing gets cheaper in area and power relative to analog processing. For this reason, converters leverage digital post processing, e.g., record what data outputs, and run digital multiply to correct it, without significant costs in power and area. Before, doing multiply with specialized digital circuitry would have been very power hungry and large in area 180 nm node. However, in 28 nm technology node, digital processing is far cheaper. Digital processing using an on-chip uP, as explained herein, can be more adaptive and flexible too. It is important to note that it is harder to do better analog processing for converters in deep submicron nodes, which can demand more (digital) correction and processing. For these reasons, performing digital correction and/or processing using an on-chip uP provides significant technical advantages over any power or cost increases for providing an on-chip uP.

The Interface Between Specialized Circuitry and the on-Chip uP

Figure 10:
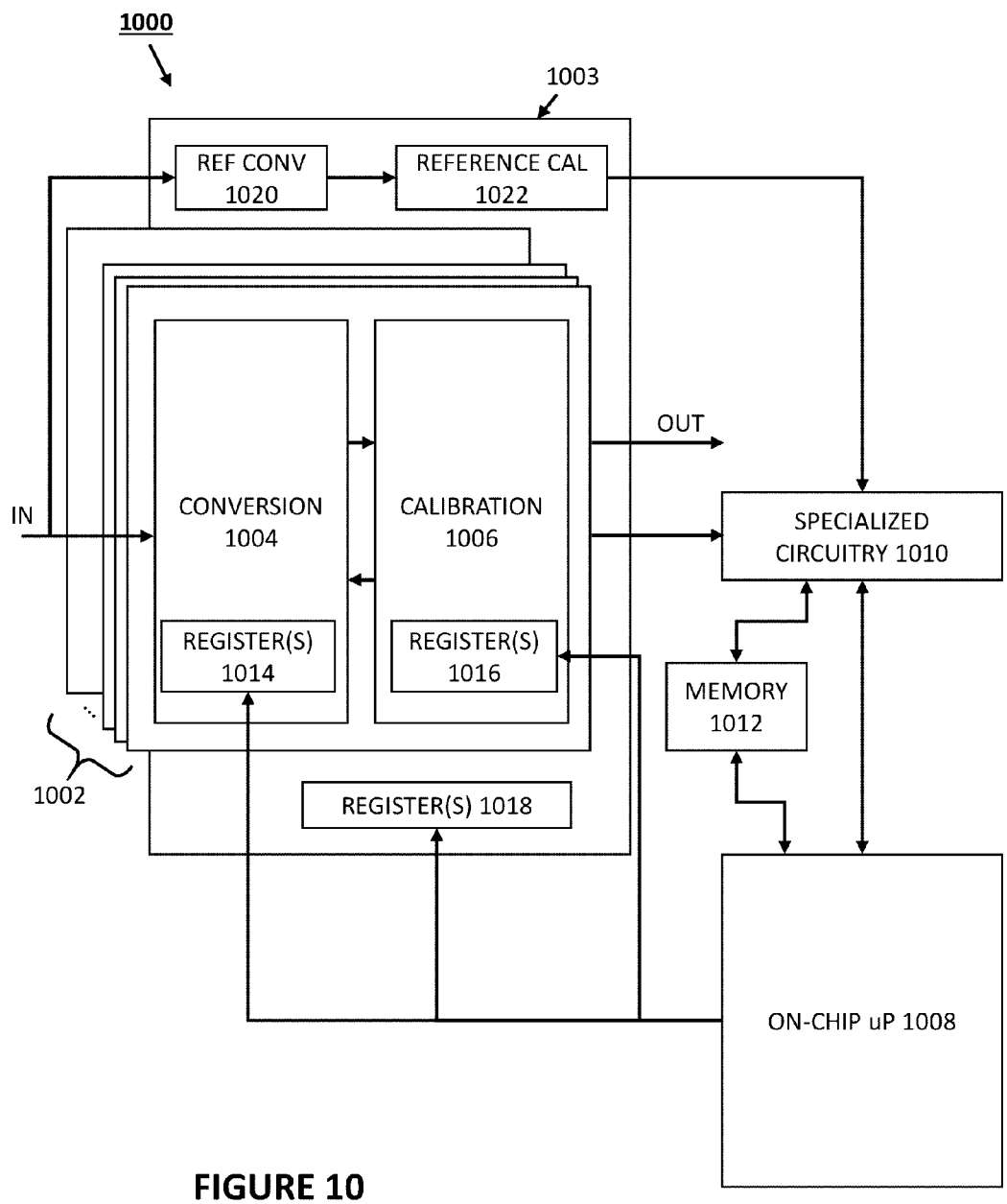
FIG. 10 shows a system diagram having a converter and an on-chip microprocessor, according to some embodiments of the disclosure.

FIG. 10 shows a system diagram having a converter and an on-chip microprocessor, according to some embodiments of the disclosure. The system 1000 shows a converter 1002. In this example, for purposes of illustration, the converter 1002 include one ADC, or a plurality of sub-ADCs (illustrated as a plurality of layers). For at least one or more of the ADCs, the converter 1002 can include conversion circuitry 1004 for making a conversion of the input signal IN to generate an output signal OUT. The ADC part 1004 can be coupled to calibration circuitry 1006 which can correct the signal in the digital domain, and/or compensate for errors in some part of the signal chain of the conversion circuitry 1004, e.g., in the analog domain. For some embodiments, the system 1000 further includes a reference converter 1003 (the converter 1002 would then be considered as the main converter). In this example, the reference converter 1003 which can include reference conversion circuitry 1020 and optionally reference calibration circuitry 1022. Generally, the reference converter 1003 provides an additional signal path (converting IN alongside with converter 1002), which can serve as a reference for the calibration algorithms.

Further to converter 1002, an on-chip uP 1008 is provided to implement one or more functions assisting and/or controlling the system. For instance, the on-chip uP 1008 can implement adaptation/training algorithms for calibrating converter 1002.

In many high speed applications, the converter 1002 is operating at a very fast rate (e.g., gigahertz) when compared with the on-chip uP 1008 (e.g., megahertz). For this reason, high speed specialized circuitry can be provided to provide measurements at a slower rate for the on-chip uP 1008. The slower rate of the measurements can be programmable or adjusted on the fly as well. To accommodate the slower on-chip uP 1008, measured data of the converter 1002 can be recorded by specialized circuitry 1010. Specialized circuitry 1010 can writing the measured data in a memory 1012, and the recording of the measured data is typically not performed by the on-chip uP 1008. The specialized circuitry 1010 can serve as an interface between the converter 1002 and the on-chip uP 1008. The specialized circuitry 1010 can include analog circuitry, digital circuitry, or both. The measured data of the converter 1002 can, once recorded, be accessed by the on-chip uP 1008 at a reduced rate. The on-chip uP 1008 can poll the memory 1012 for measured data, or the specialized circuitry 1010 can send an interrupt to the on-chip uP 1008. The on-chip uP 1008 can read the measurement data from the memory 1012, and perform any suitable algorithm(s) which can update the state variables for the calibration algorithms to generate coefficient(s) which can be used to calibrate the ADC, or used by specialized circuitry 1010 for compensating and/or correction of errors. The coefficient(s) can be written (by the on-chip uP 1008 or the specialized circuitry 1010) to memory elements that are accessible by the converter 1002 or the specialized circuitry 1010 to compensate and/or correct errors. The on-chip uP 1008 can write coefficient(s) to one or more of the following: register(s) accessible by the conversion circuitry 1004, register(s) accessible by the calibration circuitry 1006, and register(s) accessible by the reference ADC 1003. If multiple channels (sub-ADCs for example) are used, any one or more of the channels can include its own set of associated register(s) to which the on-chip uP 1008 can write coefficient(s). These register(s) can be accessible by the respective conversion circuitry and/or calibration circuitry.

On-chip uP as an Adaptation or Training Engine

The slower speed of the uP lends itself to performing functions where the speed of the functions and processing do not need to run at the rate of the ADC. For instance, the uP can be used to implement an adaptation or training engine. The ADC can be provisioned with a set of predetermined coefficients (e.g., via factory calibration), and the uP can run an adaptation or training algorithm that can update the coefficients during the lifetime of the device. Typically such adaptation or training algorithm is preferably running at a slower speed than the ADC to avoid reacting too quickly to aberrant conditions. Adaptation or training algorithms can also be computationally complex, but can be readily implemented using the ALU(s) of the on-chip uP.

Implementing adaptation or training algorithm is not trivial. Preferably, the algorithm should not change the coefficients of the system towards an undesirable direction under certain pathological condition. For this reason, the adaptation or training algorithm is preferably agile, and easily adaptable. Implementing the algorithm using the flexible platform of the uP can help provide such agility and adaptability. Many conventional adaptation or training algorithm can assume there is a lot of activity in the input signal, and the conventional algorithm could potentially wander off if there is no activity for a period of time. One function the uP can advantageously provide is the ability to detect certain conditions in the input or other parts of the ADC so that the adaptation or training algorithm can adjust appropriately (adjust or tune certain variables or adaptation rates of the algorithm, or turn on or off at least part of the algorithm, shift to use different algorithm(s), etc.) based on those conditions. For instance, the uP can adapt based on small signals versus large signals, low frequency versus high frequency, lots of activity versus no or very little activity, etc. In some cases, specialized circuitry can be provided to detect such conditions, or a reference ADC can be used to get an objective view of the input signal or infer conditions of the ADC. Such flexibility can allow the ADC to operate over a wide range of conditions or types of input signals with ranging characteristics, statistics, or signature.

Taxonomy of Calibration and Digitally Assisted Functions

Many functions related to an ADC, e.g., calibration, pre-/post-processing, can be performed at least in part by the on-chip uP and/or specialized circuitry (typically digital circuitry, but can include mixed-signal circuitry). The present disclosure describes a variety of these functions, and the on-chip uP or specialized digital circuitry can provide any one or more of the functions to meet or exceed the application requirements. It is envisioned by the disclosure that many of the functions can cooperate or be provided in combination.

To better understand the functions that can be performed by on-chip uP or specialized digital circuitry, the following table illustrates some of the taxonomy which can be used to describe the varying functions.

| | The following taxonomy is meant to be illustrative and not limiting: |
|---|---|
| How is the uP or specialized digital circuitry performing the function? | Digitally-assisted clocking, where digital circuitry can be used to control clocking and sampling (e.g., assist in generating the desired clock signals) |
| | Calibration, where the on-chip uP can be used to perform some operations for determining one or more errors, and/or computing error coefficients which can be used to compensate for the error in the analog domain or correct for the error in the digital domain. |
| | Pre-processing of analog input signals to the ADC, where the on-chip uP can control circuitry that improves/conditions the input signal prior to conversion |
| | Adjust the converter signal chain, where the on-chip uP can configure the converter signal chain to adjust or fix the signal chain |
| | Post-processing of digital output signals of the ADC, where the on-chip uP can control digital circuitry to improve the output signal after conversion or perform the digital post-processing itself |
| What is the on-chip uP or specialized digital circuitry attempting to fix or what issue are the uP or specialized digital circuitry trying to address? | Noise |
| | Undesirable spurs in the spectrum |
| | Static errors |
| | Dynamic errors (e.g., amplifier distortions) |
| | Aging effects |
| | Mismatches between channels, e.g., interleaved channels |
| | Input, or input frequency dependent distortions |
| | Clocking issues |
| | Linearity issues (integral non-linearity, dynamic non-linearity) |
| | Offset errors |
| | Gain errors |
| | Quadrature error correction |
| | Digital pre-distortion |
| | Sample-order dependent effects (e.g., for randomized interleaved ADCs) |
| | (many other types of errors are envisioned by the disclosure) |
| What is the feature provided or enabled by on-chip uP or specialized digital circuitry | Capacitor correction in DACs |
| | "Large" dither injections for the multiplying DAC (MDAC) and (flash ADC) of stage in a pipeline converter |
| | "Small" dither injections for the MDAC |
| | Interstage gain error (IGE) calibration |
| | Interstage memory error (IME) calibration related to a situation where a present sample is influenced by a past sample |
| | Kickback calibration (e.g., stage 1 of a pipeline ADC kicking back to input of a pipeline ADC when capacitors are switched back onto the input) |
| | Interleaving gain correction |
| | Interleaving DC correction |
| | Interleaving timing correction |
| | Interleaving bandwidth correction |
| | Sample order dependent error correction (caused by sub-ADCs that took previous samples interfering with one another) |
| | Flash/MDAC timing skew or delay trimming |
| | Comparator trimming/Flash ADC comparator offsets |
| | (Flash) ADC/MDAC mismatch error correction |
| | Buffer/Sampler NLC |
| When is the on-chip uP or specialized digital circuitry performing its function? | When device is in the factory (e.g., devices are trimmed using fuses and/or non-volatile memory, before the converter is shipped to the customer) |
| | Foreground (e.g., at start up or power up, offline with test vectors) |
| | Background (e.g., continually, or without the converter being taken offline) |

-continued

| The following taxonomy is meant to be illustrative and not limiting: |
| --- |
| In-situ calibration (e.g., injecting a signal that makes its way into the signal chain to fix parts of the system) Self-calibration (e.g., calibration with or without being triggered by a user or external inputs) System (sys) trim/calibration (e.g., providing an interface to the on-chip uP to allow a user to access to controls and/or algorithms that can calibrate devices the chip either in the foreground or background, and/or provide signal hookups (allowing a user to provide a desired input) that can better inform the training/adaptation algorithms for calibration) A combination of any one or more of the above (e.g., perform factory calibration and store parameters in non-volatile memory and perform foreground and/or background to update parameters in volatile memory or revert back to factory parameters) |

Spread Spectrum Clocking or Sampling for the uP and/or the ADC

Figure 11:
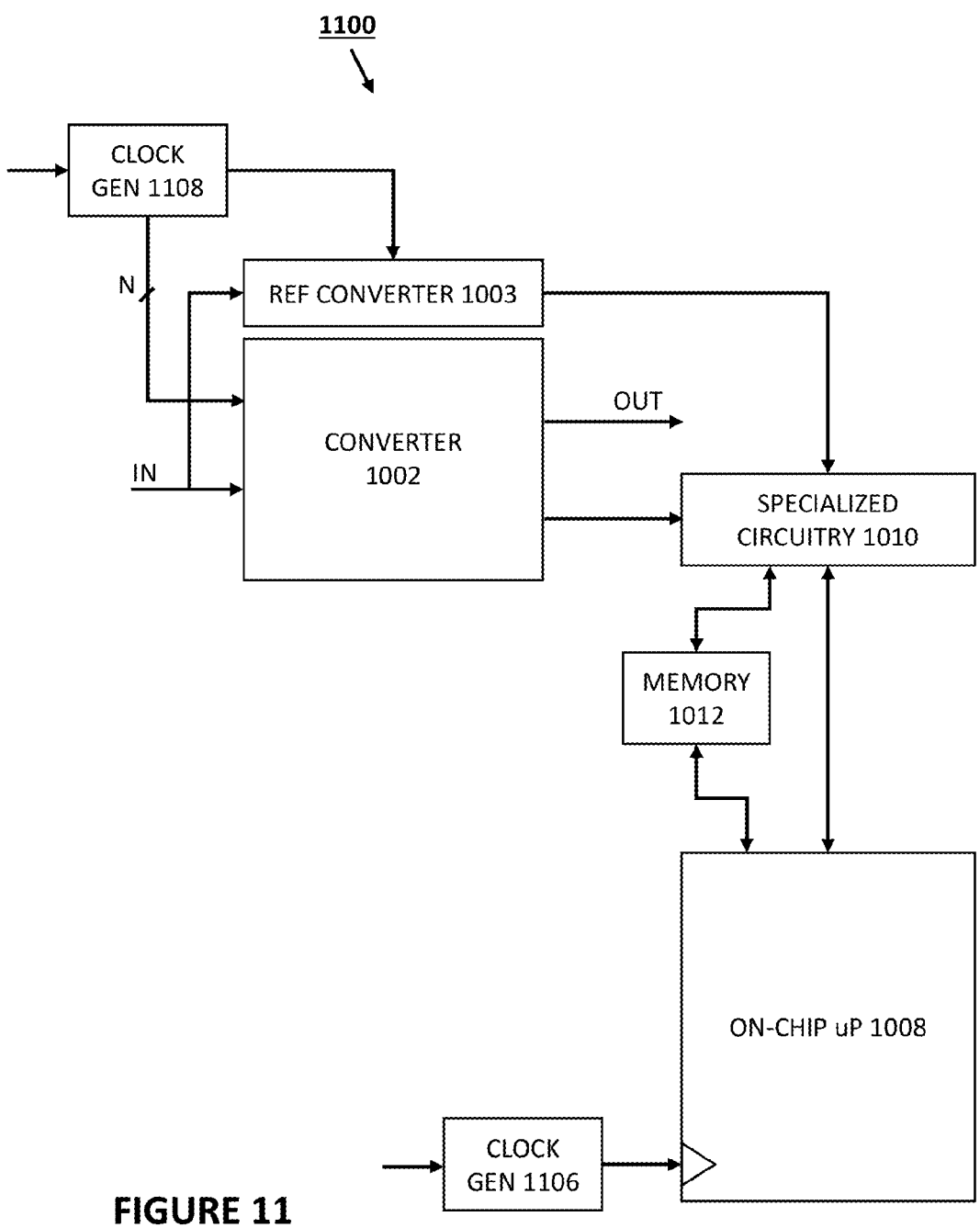
FIG. 11 shows a system diagram having a converter, an on-chip microprocessor, and clock generator(s), according to some embodiments of the disclosure.

FIG. 11 shows a system diagram having a converter, an on-chip microprocessor, and clock generator(s), according to some embodiments of the disclosure. The system 1100 shows a (main) converter 1002. In this example, for purposes of illustration, the converter 1002 include one or more channels (e.g., one ADC, or a plurality of sub-ADCs) for making a conversion of the input signal IN to generate an output signal OUT. For some embodiments, the system 1100 further includes a reference converter 1003 (the converter 1002 would then be considered as the main converter). The reference ADC 1020 provides an additional signal path (converting IN alongside with converter 1002), which can serve as a reference for the calibration algorithms. Further to converter 1002, an on-chip uP 1008 is provided to implement one or more functions assisting and/or controlling the system. For instance, the on-chip uP 1008 can implement adaptation/training algorithms for calibrating converter 1002.

The system 1100 is a complex, mixed-signal system. Also, the rates for the converter 1002, reference converter 1003, and on-chip uP 1008 can vary. For instance, the on-chip uP 1008 can run at a rate that is significantly slower than the converter 1002. The reference converter 1003 can sample the input signal IN at the same rate as the converter 1002. In some cases, the reference converter 1003 can sample the input signal IN at a different rate from the converter 1002, and/or at a different rate than the interleaved channels of the converter 1002.

One issue of such high performance mixed-signal chip is that digital circuitry tends to clock the circuitry at one or a small set of frequencies. There is usually a lot of energy at or near those frequencies. That can couple into the analog circuitry, and create tones at or near those frequencies or other undesirable frequency locations, thereby limiting performance. To address this concern, it is possible to apply randomization to the clock signals of the system, i.e., provide spread spectrum clocking. Randomization can help spread some of the tones into the noise floor. The clock signal can on average a particular frequency, but instantaneous period of the clock changes or is randomized.

The solution can include one or more of the following: providing a clock generator 1106 for spread spectrum clocking of the on-chip uP 1008, providing a clock generator 1108 for spread spectrum clocking of the (main) converter 1002 (and any interleaved channels therein) and/or the reference converter 1003. To generate the clock, clock generator 1106 and clock generator 1108 can include specialized digital circuitry. The specialized digital circuitry can include one or more clock divider circuits that can output an edge in the output signal for every X number of cycles of the input clock, and a randomization engine that can randomize X.

One embodiment includes providing spread spectrum clocking of the on-chip uP 1008. For instance, the clock generator 1106 can be configured to generate clock signals that run the on-chip uP 1008 at 100 MHz on average, but the clock signal's instantaneous frequency can range from 75 MHz to 125 MHz. Phrased differently, the period of the clock signal waveform over time varies, but on average stay around 100 MHz. Advantageously, the spectrum contribution or energy from the clock of the on-chip uP 1008 is spread over 75-125 MHz, and the amount of energy at any one frequency is greatly reduced by spread spectrum clocking of the on-chip uP 1008. Even if the energy couples back into the analog circuitry, it is generally below the noise floor of the overall system 1100 (i.e., the converter 1002).

Besides providing spread spectrum clocking for the on-chip uP 1008, spread spectrum clocking can also be used for the converter 1002 and/or reference converter 1003, where the clock signal(s) generated by clock generator 1108 can run the converter(s) at a desired frequency on average, but any instantaneous frequency of the clock signal can vary over time (having a range of clock periods). For instance, the clock signal periods can be randomized to cause the converters to sample the input signal according to randomized periods to avoid pure periodicity in the sampling systems.

Going even further, clocking of time-interleaved ADCs can also randomized, i.e., the order sequence or sampling sequence of the time-interleaved sub-ADCs, to further randomize the overall system. In some cases, normal interleaving (sequential interleaving without randomized sequence or order), certain input frequencies can cause training and/or adaptation algorithms to diverge if the input frequency is at the same frequency as the clocking frequency of the sub-ADCs. The sequential (non-randomized sampling) appears as a DC offset to each of the converters, there is no information of the gain or timing in the signal. If an algorithm attempts to try to calibrate on that signal, the algorithm will diverge and the part will cease to work.

Broadly speaking, randomization in clocking makes the system 1100 more robust and tolerant of different types of input signals when compared to systems without randomization of the clocks. Furthermore, randomization can help average out errors, or make the errors less significant, especially for errors that aren't easily corrected by other means. Spread spectrum clocking effectively help alleviate issues with signals that are harmonically related to the clock from aliasing and causing issues, e.g., Fs/2, Fs/4, Fs/8, etc (Fs=sampling frequency), For Fs/8 with 8 sequentially interleaved ADCs each sub-ADC would have a DC input, etc.

Understanding Errors in Pipeline ADCs: Gain Error and DAC Error

Figure 12:
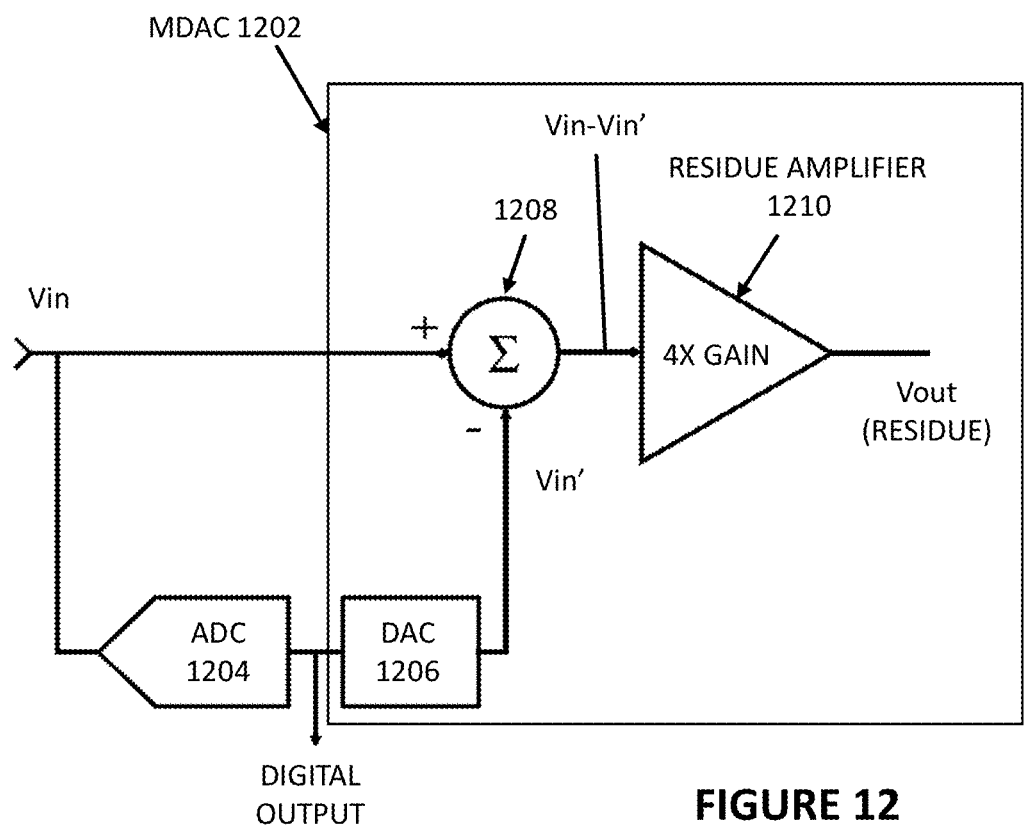
FIG. 12 shows an exemplary stage of a pipeline ADC, according to some embodiments of the disclosure.

Some converters include a main converter that is a pipeline ADCs. The present disclosure describes how some of the errors in the pipeline ADC can be corrected with the assistance from specialized digital circuitry and/or the on-chip uP. Usually, a pipeline ADC includes a plurality of stages (as previously explained in relation to FIG. 4), where each stage includes a multiplying DAC (MDAC). FIG. 12 shows an exemplary stage of a pipeline ADC, according to some embodiments of the disclosure. The exemplary stage can include ADC 1204, and MDAC 1202. The ADC 1204 can convert an input, e.g., Vin, into a digital output. Examples of the ADC 1205 include a flash ADC, 2-bit ADC, 3-bit ADC, 4-bit ADC, and any suitable low resolution ADC. The ADC 1204 may include a plurality of comparators that compare the input Vin against a plurality of different reference voltages, and accordingly, generate a digital output (e.g., an output code) representative of the input Vin. The digital output is fed to DAC 1206 such that the digital output is converted back into an analog signal Vin'. The summation/difference node 1208 finds the difference between Vin and Vin', and the difference is increased in gain by residue amplifier 1210 to generate output Vout (e.g., residue for the next stage of the pipeline ADC). In this example, the gain is 4. However, other amounts of gain are possible. The ADC 1204 can be a 2-bit, 3-bit, or 4-bit converter, and usually has some quantization error. However, the setup of the MDAC 1202 reduces the voltage swing of the input to the residue amplifier 1210 (Vin-Vin'). Each stage can generate a number of bits, which can then be combined to generate a digital output for the overall pipeline ADC.

The MDAC 1202 can include sample and hold circuitry (not shown), DAC 1206, summation/difference node 1208, and the residue amplifier 1210. The MDAC 1202 can be implemented as a single switched-capacitor circuit block. The MDAC 1202, is typically not perfect, and can exhibit one or more errors. These errors can be calibrated or mitigated through the help of the specialized digital circuitry and/or the on-chip uP through one or more digitally assisted functions. FIGS. 13-18 shows a series of exemplary voltage plots which illustrate the operation inside a pipeline ADC or a stage of the pipeline ADC, and one or more possible error sources, according to some embodiments of the disclosure.

Figure 13:
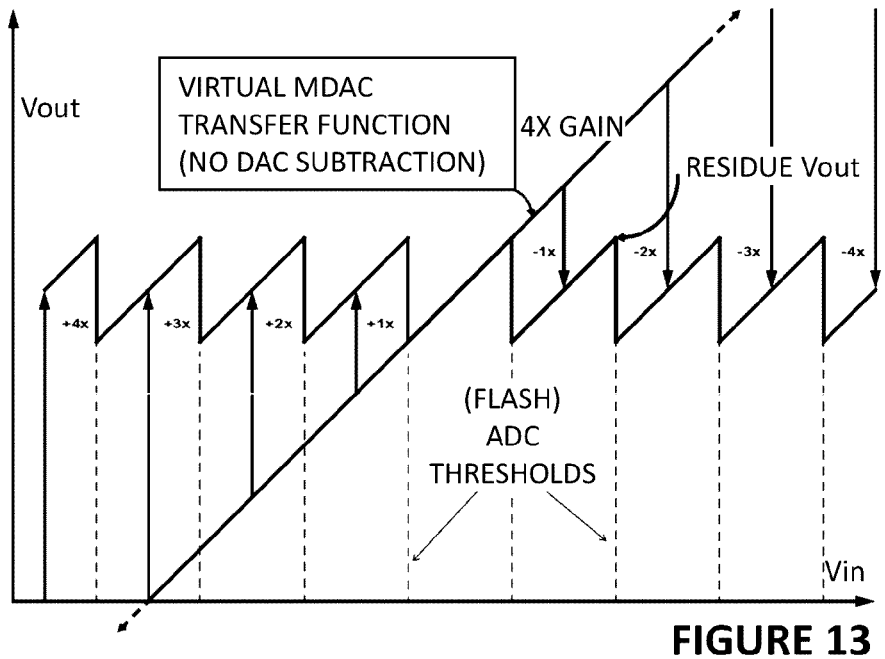
FIGS. 13-18 shows a series of exemplary voltage plots which illustrate the operation inside a pipeline ADC, and one or more possible error sources, according to some embodiments of the disclosure.
Figure 14:
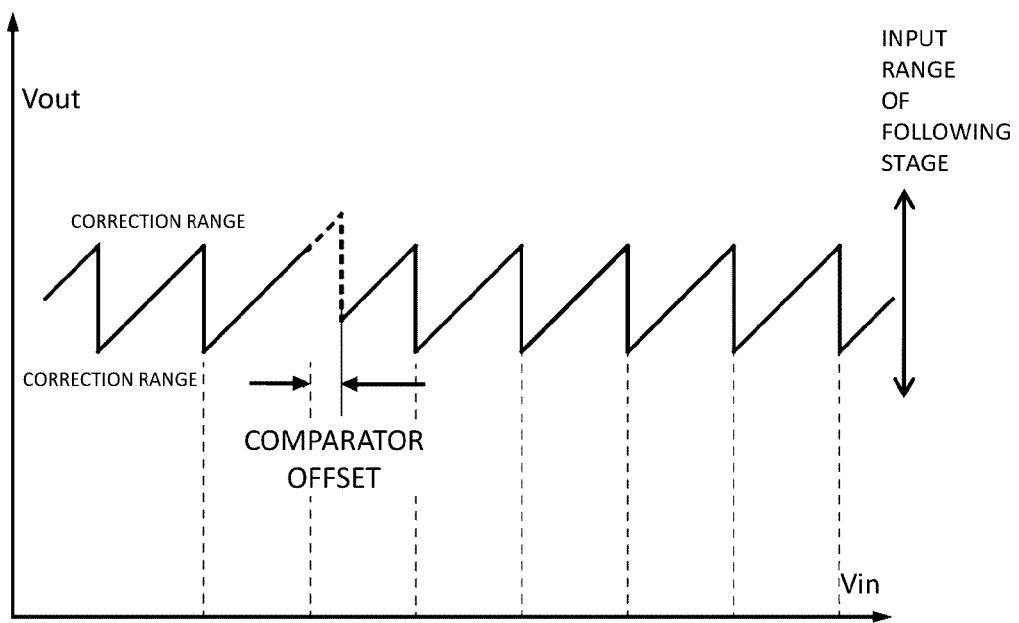

Referring to FIG. 13, a virtual (or ideal) transfer function of an MDAC is shown with an exemplary gain of 4 (e.g., Vout=4*Vin). Generally speaking, as the input increases, the output would increase with a corresponding amount. It can be seen that with DAC subtraction (i.e., the subtraction which generates Vin-Vin'), residue Vout can be limited to a reasonable range of voltages suitable for the next stage, as illustrated by the ideal waveform of the residue Vout. More often than not, the ADC in the pipeline stage (e.g., ADC 1204 of FIG. 12) is not ideal. For instance, the comparators in the ADC can have an offset, which could lead to the residue Vout having imperfect steps. Referring to FIG. 14, the waveform of residue Vout is shown, where a comparator offset is present. The residue Vout can overshoot or undershoot at the ADC thresholds due to comparator offsets. Generally speaking, trimming at test or during calibration can reduce the comparator offset, so that the error does not go beyond a reasonable range limited by the input range of the following stage. The trimming (e.g., involving fuses, non-volatile memory) and measurements of the output can be performed by specialized digital circuitry, and the specialized digital circuitry can store the measurements in a memory that is accessible by the on-chip uP for calibration. In some cases, the on-chip uP and/or the specialized digital circuitry can perform the trimming once error coefficients are determined based on the measurements. If the error gets too large and goes beyond the reasonable range, the system can have catastrophic issues. This concern is even more significant in smaller technology nodes where the range of acceptable voltages is far smaller.

Figure 15:
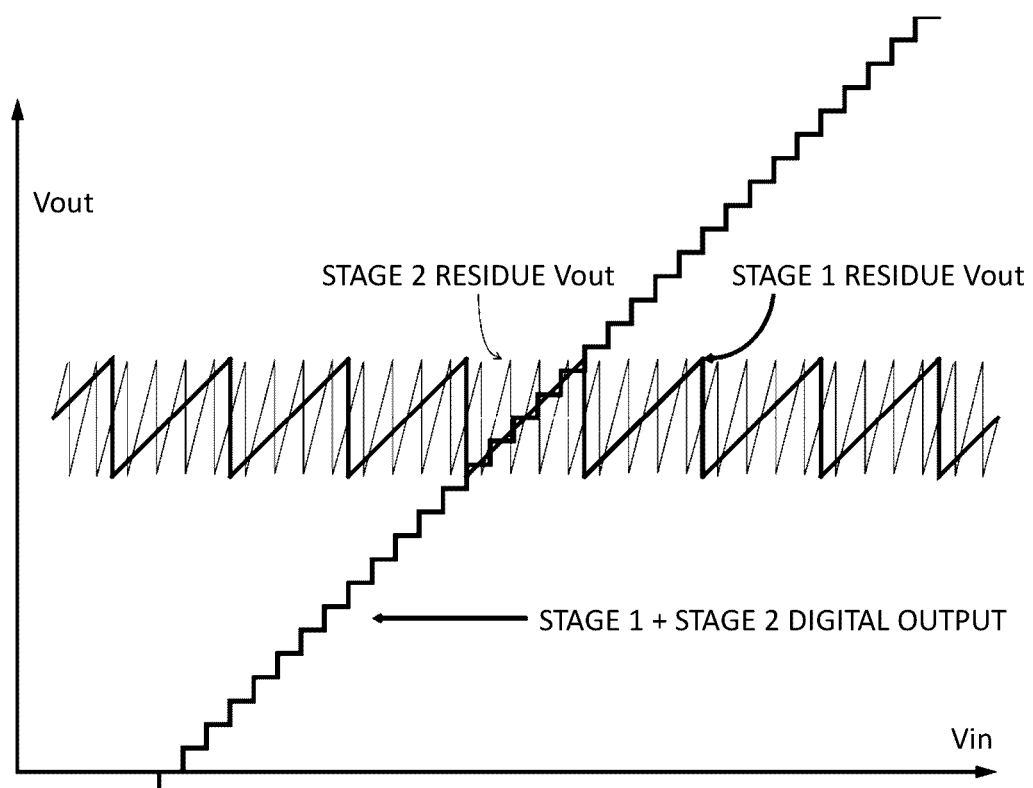

When a plurality of stages are pipelined together for the ADC, the results from each stage are combined or reconstructed to produce a (close to ideal) digital output that is representative of the original input Vin. FIG. 15 shows the residue Vout of a first stage ("STAGE 1 RESIDUE Vout") and the residue Vout of a second stage ("STAGE 2 RESIDUE Vout") and the reconstructed digital output (represented as an analog signal for illustration, and shown as "STAGE 1+STAGE 2 DIGITAL OUTPUT"). The reconstructed digital output of FIG. 15 appears close to the virtual transfer function shown in FIG. 13. To provide better performance of the overall pipeline ADC, a designer can improve the accuracy of the individual stages by addressing one or more sources of error present in the individual stages.

Figure 16:
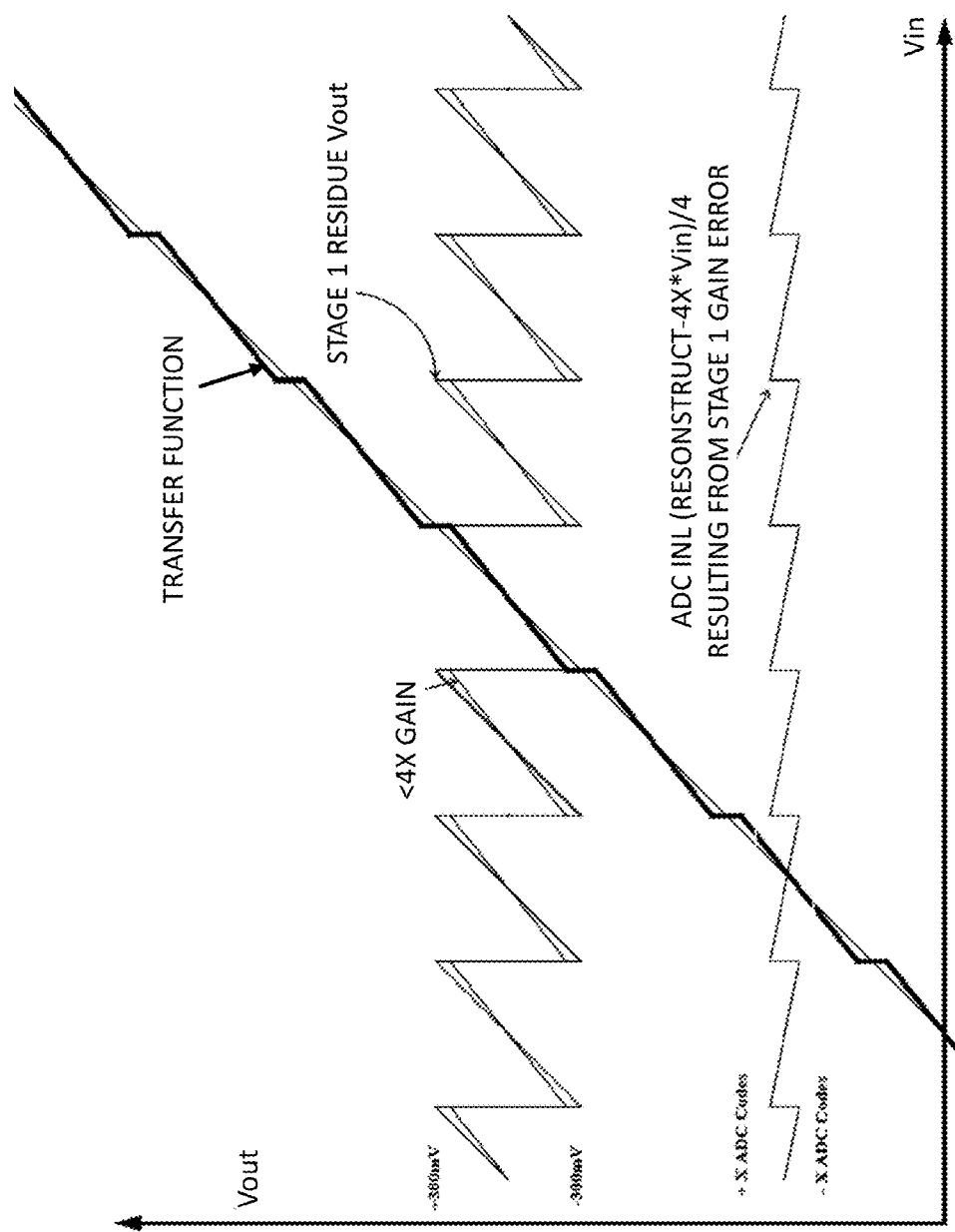

One source of error in the individual stages is the gain error, and the effect of an exemplary gain error is illustrated in FIG. 16. In the example shown, the gain of the residue amplifier is slightly less than 4. As a result, the waveform ("<4xGAIN") shows a different slope or incline when compared with the ideal waveform ("STAGE 1 RESIDUE Vout"). Furthermore, the transfer function is no longer a straight line, but has a repeated sawtooth error throughout the transfer function. The Intergral Non-Linearity (INL) of the ADC is also shown to illustrate the presence of gain error (note that ideal INL of the ADC is a flat line). Because this residue amplifier is positioned at the boundaries of the plurality of stages of a pipeline ADC, the errors associated with the gain is called the "interstage gain error". In some embodiments, the ideal gain is a gain of 4, but in reality, the gain can end up being, e.g., 3.9, 4.1, etc., and the deviation from the ideal gain can vary over voltage supply and/or temperature. Generally, to calibrate, a known (random) signal can be injected into the stage which passes through the next stage, and the output signal having the known signal is measured. Determining the error from the measurement enables the gain to be corrected in the digital domain or compensated in the analog domain.

Figure 17:
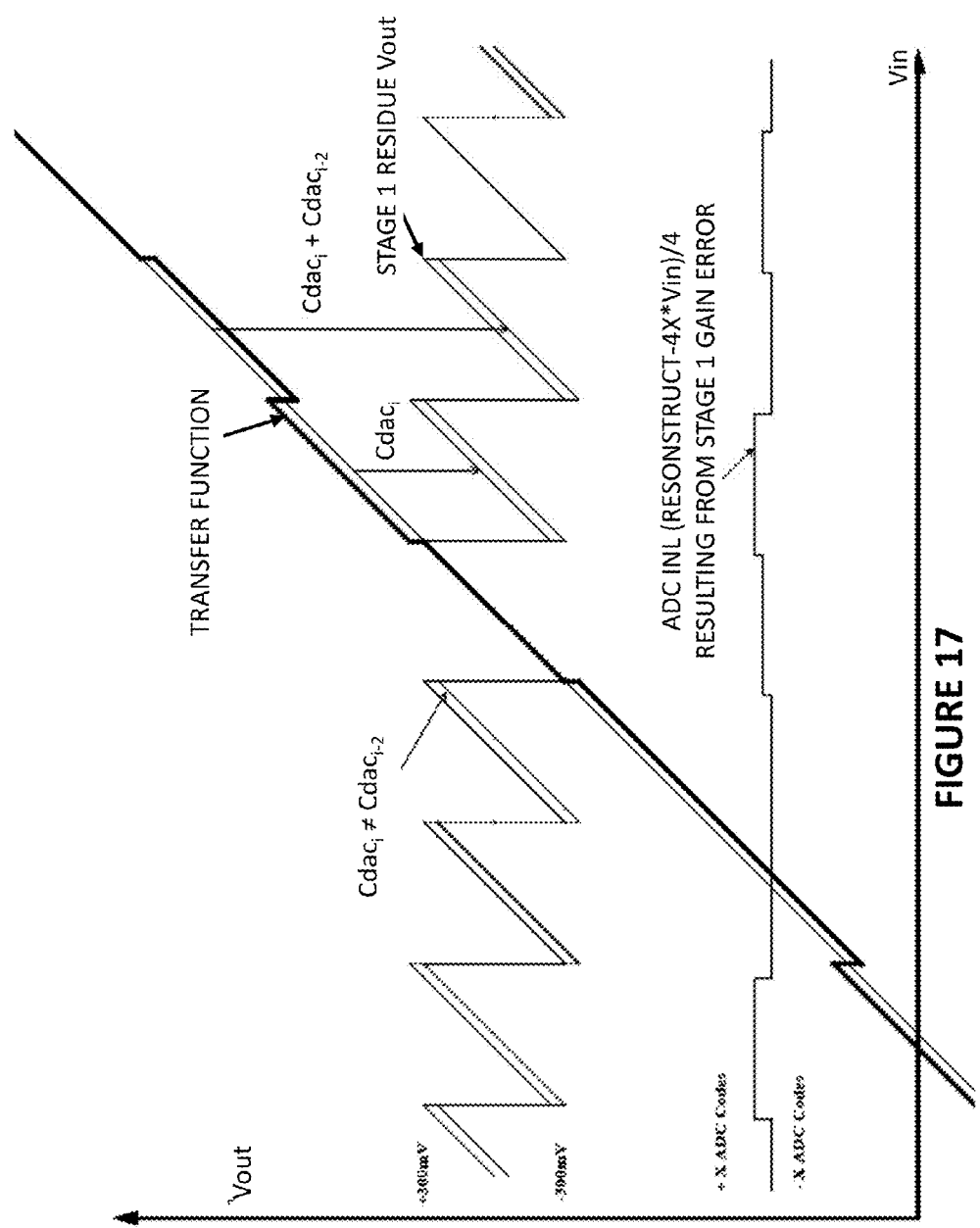

Another source of error in the individual stages is the DAC error, or in some cases, capacitor mismatch errors, and the effect of an exemplary DAC error is illustrated in FIG. 17. In some cases, the DAC includes an array of capacitors. Due to many factors, the actual capacitance of different capacitors do not match precisely as intended. In this case, the DAC includes unit sized capacitors, and a DAC error is present due to $Cdac_i \neq Cdac_{i-2}$. As a result, the waveform ("$Cdac_i \neq Cdac_{i-2}$") shows an offset when compared with the ideal waveform ("STAGE 1 RESIDUE Vout"). The INL of the ADC is also shown to illustrate the presence of capacitor (mismatch) errors or DAC errors. Furthermore, the transfer function is no longer a straight line, but has one or more steps in the transfer function.

Figure 18:
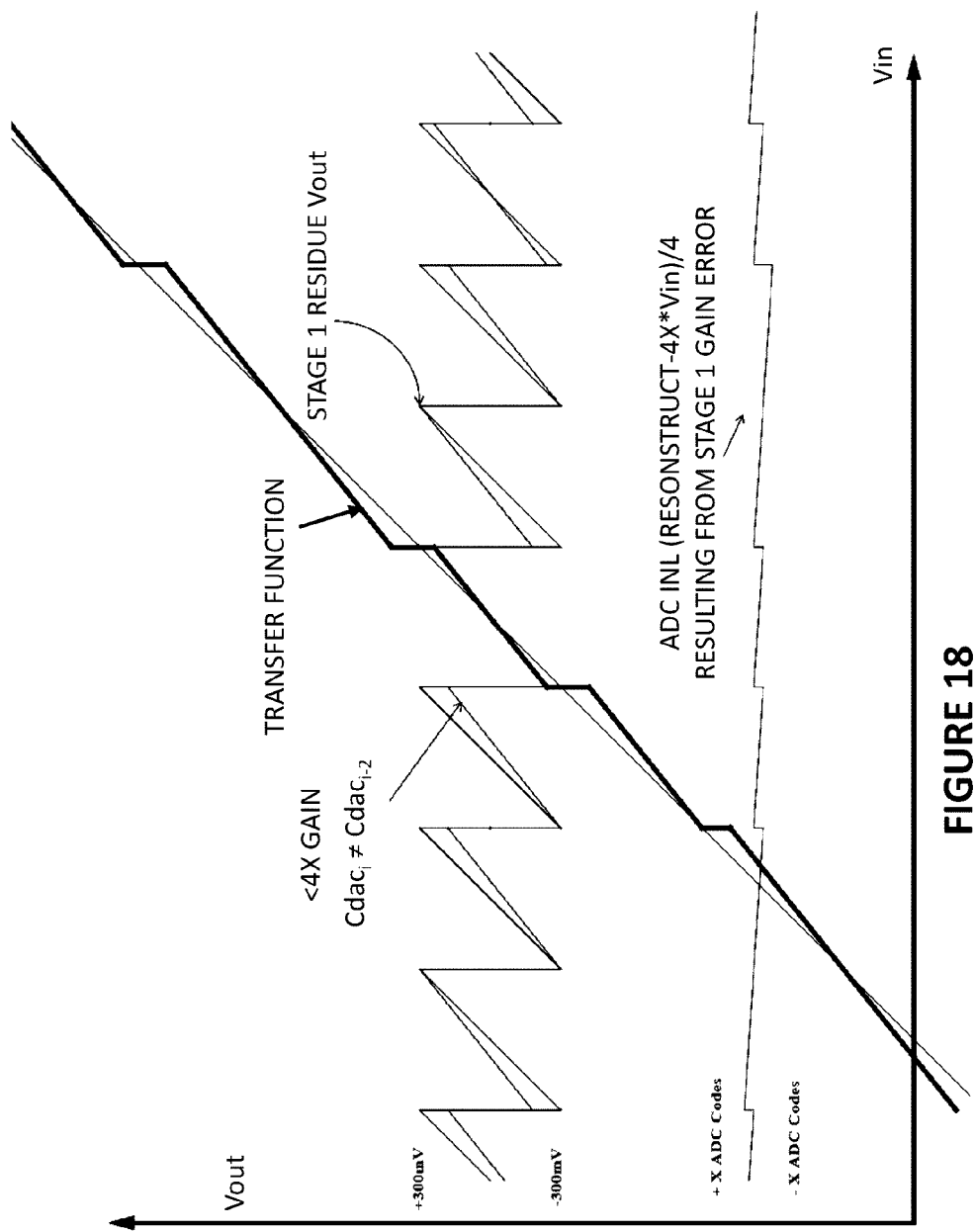

The effect of the exemplary gain error and the effect of the exemplary DAC error are shown in FIG. 18, illustrating a situation where both errors are present. The waveform ("<4x gain $Cdac_i \neq Cdac_{i-2}$") shows a combination of difference in slope and an offset when compared with the ideal waveform ("STAGE 1 RESIDUE Vout"). The INL of the ADC is also shown to illustrate the presence of both errors.

It is noted that the gain error and/or DAC errors can be measured and calibrated using the embodiments disclosed herein (e.g., through digitally assisted functions implemented by specialized digital circuitry and/or on-chip uP).

In some embodiments, the gain error can be measured using a foreground method (e.g., where the converter is not in use, but is either in factory, upon power up, in a test/calibration mode). For example, the gain can be measured using a reference capacitor, at the input of the residue amplifier, whose energy to be delivered to the output has an expected value, and the output can be observed or measured with respect to the expected value. The measurements can provide error measurements for a given temperature and voltage of the residue amplifier. The switching of the reference capacitor and measurements of the output can be performed by specialized digital circuitry, and the specialized digital circuitry can store the measurements in a memory that is accessible by the on-chip uP for calibration. In some cases, the on-chip uP and/or the specialized digital circuitry can perform gain adjustment in the converter once error coefficients are determined based on the measurements.

In some embodiments the gain error can be measured using a background method (e.g., while the converter is in use). For instance, a random (but known) signal can be added to the input then correlated out in the backend digital output to accurately measure any change in gain (e.g., due to any possible source including shifts in DC amplifier gain, amplifier settling, temperature, voltage etc.). The generation of the random signal and measurements of the output can be performed by specialized digital circuitry, and the specialized digital circuitry can store the measurements in a memory that is accessible by the on-chip uP for calibration. In some cases, the on-chip uP and/or the specialized digital circuitry can perform gain adjustment in the converter once error coefficients are determined based on the measurements.

In some embodiments, the DAC error (e.g., capacitor mismatch error) can be measured in a foreground calibration method (e.g., where the converter is not in use, but is either in factory, upon power up, in a test/calibration mode). The input is switched off (e.g., connected to ground, or set at 0 volts), the capacitors of the DAC can be switched individually up or down, and the output is observed/measured to determine whether the capacitor is delivering an expected amount of energy at the output to assess whether there are any capacitor mismatches. The measurements can provide error measurements for a given gain of the residue amplifier. In some cases, the switching of the capacitors and measurements of the output can be performed by specialized digital circuitry, and the specialized digital circuitry can store the measurements in a memory that is accessible by the on-chip uP for calibration. In some cases, the on-chip uP and/or the specialized digital circuitry can perform trimming of the capacitors in the converter once error coefficients are determined based on the measurements. In some cases, the calibration for DAC error is performed before the gain error calibration is performed.

The gain error and the DAC error can be calibrated for any one or more stages of a pipeline ADC. For instance, calibration circuitry can be tuned by the on-chip uP to digitally correct the output signal, using one or more calibration blocks which correct for errors measured for each stage being calibrated. When many stages are in a pipeline ADC, many individual calibration blocks in the calibration circuitry can be arranged in a reversed order in the signal chain when compared with the order of the stages in the conversion circuitry. In one embodiment, a first calibration block can perform correction of errors of one or more last stages of the pipeline ADC, another block later in the signal chain can perform correction of errors of a stage of the earlier stages of the pipeline ADC, and yet another block later in the signal chain can perform correction of errors of an even earlier stage of the pipeline ADC. Further calibration blocks later in the signal chain can include a block for correcting kickback error, etc.

Dithering Examples

Figure 19:
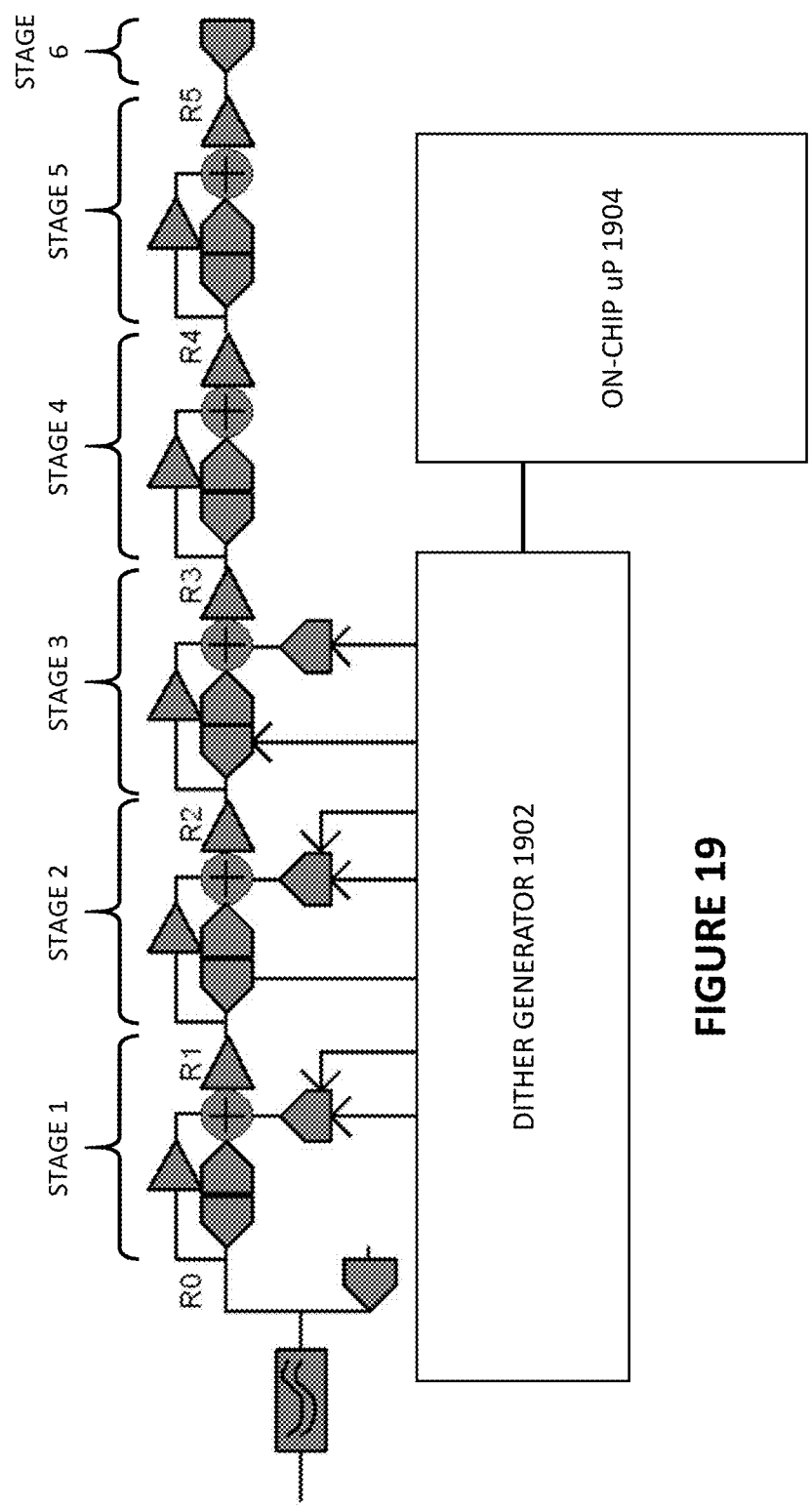
FIG. 19 shows an exemplary pipeline ADC having 6 stages, equipped with dither injection, according to some embodiments of the disclosure.

For a pipeline ADC, a dither can be injected at any one or more of the stages at the summation/difference node of the stage. FIG. 19 shows an exemplary pipeline ADC having 6 stages, equipped with dither injection, according to some embodiments of the disclosure. Dither injection can be performed using specialized circuitry, i.e., dither generator 1902. In this example, dither generator 1902 generates dither signals and injects the dither signals in the first three stages. For each stage having a dither injected thereto, the dither can have many possible levels. For instance, a stage can have 9 dither levels (e.g., the first stage and/or the second stage can have 9 dither levels). In another instance, a stage can have 3 dither levels (e.g., the third stage can have 3 dither levels). Any number of suitable dither levels can be used. With an on-chip uP 1904, dithering parameters can be controlled by the on-chip uP 1904 coupled to the dither generator 1902. For instance, if the input frequency is of a certain range, the number of dithering levels can be tuned for the particular input frequency using the on-chip uP 1904.

Generally speaking, the dither help enable the calibration algorithms to be more independent from the characteristics of the input signal. If the input signal is very small, the gain can be different when compared with a very large input signal. Dithering can help balance out or average out the differences that are dependent on the input signal. For instance, the size of the input signal can affect the number of components being used for a converter, but if a dither signal is injected, the usage of the components can be evened out. In some instances, the dithering also helps randomize the signal to spread out systematic/periodic errors or spurs in the output spectrum.

In some embodiments, the dither levels for, e.g., a stage 1 of a pipeline ADC, can be calibrated for better dithering. The dither signal can be measured in the foreground or in the background and programmed into a memory that is accessible by the calibration circuitry to adjust for or take into account any non-ideal dither signals.

Correlation Based IGE/IME Calibration with Dithering Enabled

For measuring the gain, one exemplary method leverages dithering to measure the gain, by computing the ideal dither power (IDP) divided by the measured dither power (MDP). In some cases, the IDP is measured in the factory or in the foreground. MDP can change due to changes in temperature or voltage, which suggest there is a gain error in a particular stage.

Figure 20:
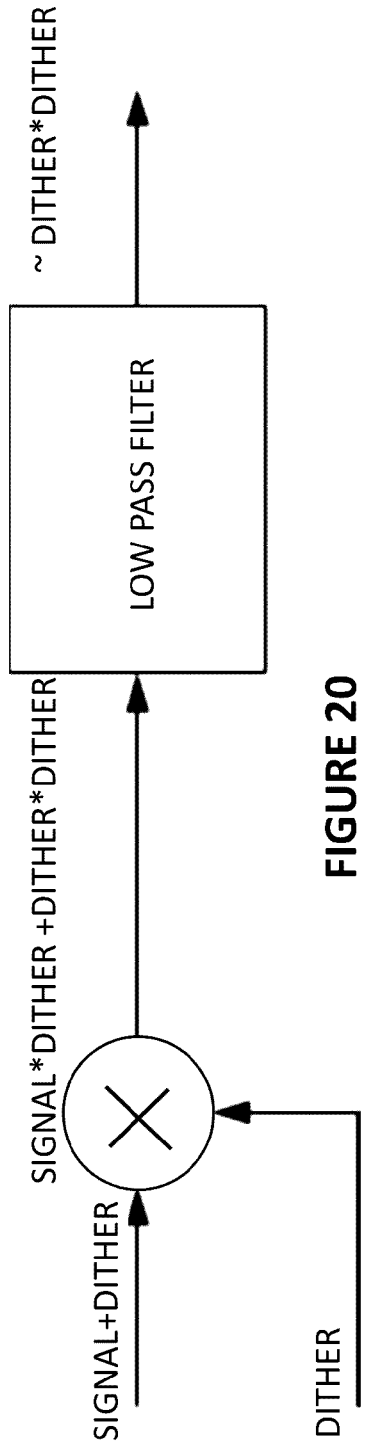
FIG. 20 illustrates a correlation scheme usable for calibration, according to some embodiments of the disclosure.

A correlation scheme can be used, which is illustrated in FIG. 20. The basis of a correlation scheme is that when two signals are uncorrelated, the cross correlation term is zero or substantially zero. The cross correlation term "Cross-Corr (x,y)" can equal to sum(x*y). When x=y then these are perfectly correlated and is equal to the power. Assuming the dither signal injected into the signal chain is random and uncorrelated with the other signals:

Cross-Corr(Signal*Dither)=Sum(Signal*Dither)~=0 for a large number of samples

Cross-Corr(Dither*Dither)=Sum(Dither*Dither) is a measure of the dither power.

Referring back to FIG. 20, the measured input signal "Signal" has the dither signal "Dither" added thereto. A multiply operation is performed using (known digital version of) "Dither" to obtain "Signal*Dither'+Dither*Dither'". When "Signal" and "Dither" are uncorrelated, the term "Signal*Dither" should average out to be zero over time (by means of the low pass filter), and the resulting term "~Dither*Dither" can be a measure of the dither power. The size of "~Dither*Dither" (measured dither power or MDP) relative to the (known digital version of) "Dither" squared (ideal dither power (IDP) can indicate a gain error in the stage. The IDP can be measured in the factory or foreground, in order to take into account any process variations that can affect the dither power. The MDP can vary from IDP due to changes in temperature or voltage.

Figure 21:
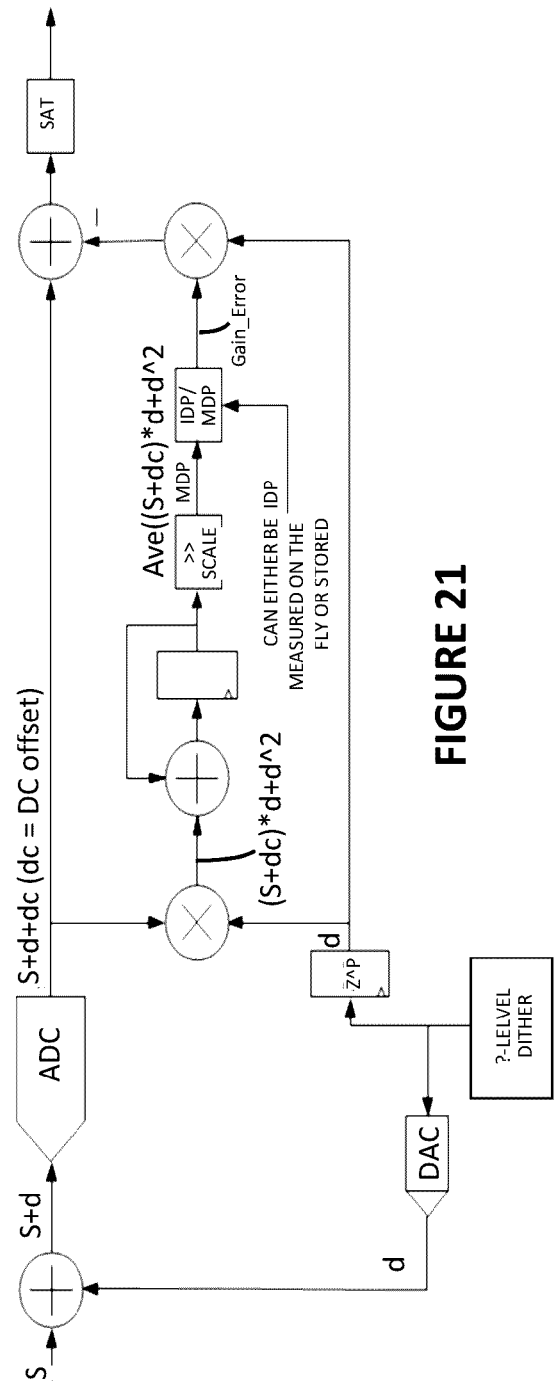
FIG. 21 illustrates a gain error calibration scheme, according to some embodiments of the disclosure.
Figure 22:
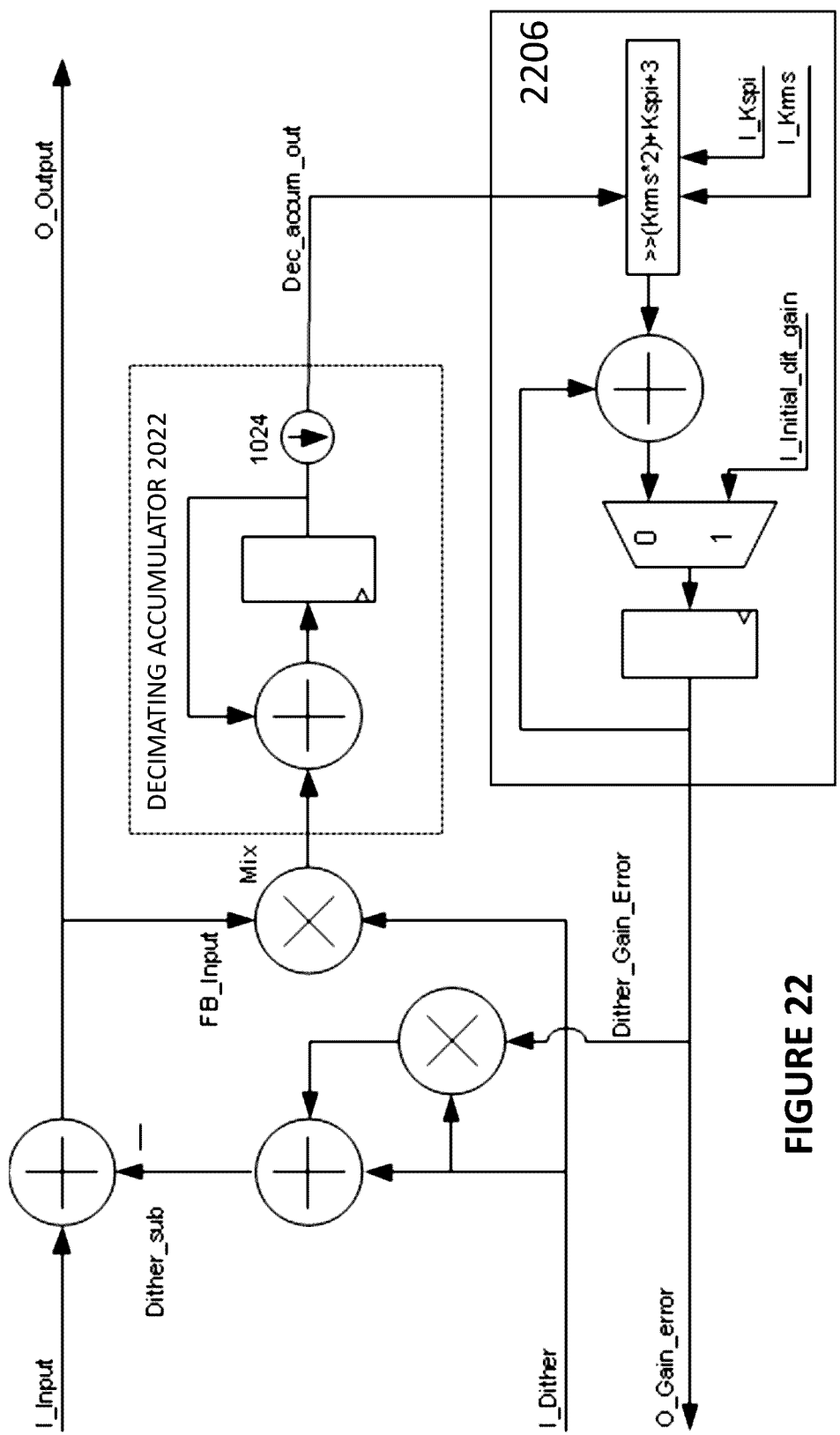
FIG. 22 illustrates another gain error calibration scheme, according to some embodiments of the disclosure.

FIG. 21 illustrates a gain error calibration scheme, according to some embodiments of the disclosure. In this example, the signal is denoted as "S", the dither signal is denoted as "d", and the DC offset is denoted as "dc". The example shows S+d+dc is multiplied with the dither signal. The result of averaging S+dc*d+d^2 should result in the MDP. Taking IDP/MDP results in the gain error ("Gain_Error"). The gain error multiplied by the dither signal (Gain_Error*d) can be used to correct the signal "S+d+dc" (by subtraction, i.e., "S+d+dc−Gain_Error*d"). It is noted that the gain error calibration scheme using correlation and averaging over a long period of time means gain error coefficients are updated rarely since long averages are needed (e.g., millions of samples). This means the gain error calibration scheme (at least in part) is particularly suitable for being carried out by the on-chip uP. Furthermore, the scheme can be performed for the whole pipeline converter, or for one or more selected stages of the pipeline converter. The illustrated scheme is considered to have a feed forward configuration.

FIG. 21 illustrates another gain error calibration scheme, according to some embodiments of the disclosure. This scheme is a least mean squared (LMS) process in a feedback configuration. The gain error, "Dither_Gain_Error" is determined and multiplied with the dither signal "I_Dither" to obtain "Dither_Gain_Error*I_Dither". The "Dither_Gain_Error*I_Dither" is added to "I_Dither" to obtain "Dither_sub". "I_input" is then subtracted by "Dither_sub" to obtain "O_Output". During the calibration process, the input "I_input-Dither_sub" ("FB_Input") is multiplied with "I_Dither". The resulting value "mix" is accumulated for a long period of time and is decimated to slow down the clock rate (e.g., by 1024 times). In some embodiments, the accumulation can be implemented using a cascaded integrator comb structure. Furthermore, the accumulated value "Dec_accum_out" is multiplied by a small number to obtain the average, and the average is used for obtaining the gain error (e.g., represented by "Dither_Gain_Error" and "O_Gain_error"). Also for this scheme, the updating of the measured gain error changes very slowly. This means the gain error calibration scheme (at least in part) is particularly suitable for being carried out by the on-chip uP. The decimating accumulator 2202 can be implemented using specialized circuitry (digital and/or analog). The part 2206 which relates to adaptation and slowly determining the gain error and computing of corresponding gain error coefficients can be implemented using the on-chip uP (at a rate that is far slower than the converter system). Furthermore, the scheme can be performed for the whole pipeline converter, or for one or more selected stages of the pipeline converter. The illustrated scheme is considered to have a feed forward configuration.

Another scheme can involve driving the dither signal in the residue to zero using the correct gain (by multiplying the digital representation of the dither signal with an error coefficient, and subtracting the residue signal with the digital representation of the dither signal*an error coefficient). One example includes using 2-tap finite impulse response filter (FIR) and LMS to background calibrate the gain/memory error. The scheme can compute error coefficients for the (flash) ADC from adapted/learned calibration and gain error. The gain from earlier stages can be applied and passed onto the later stages in from earlier stages. The scheme may include circuitry for measuring the gain error, as well as computation blocks for computing error coefficients for adjusting the (flash) ADC of the stage and/or the dither signal. The on-chip uP can be used for implementing the functions of at least some of the (algebraic/arithmetic) computation blocks for computing error coefficients for adjusting the (flash) ADC of the stage and/or the dither signal. The on-chip uP can also provide checks on the error coefficients to ensure that the error coefficient does not go beyond a suitable range, because an inappropriate error coefficient can drastically affect the gain of the system and cause catastrophic errors.

On-chip uP can Combine Capacitor Trimming and IGE Calibration

Figure 23A:
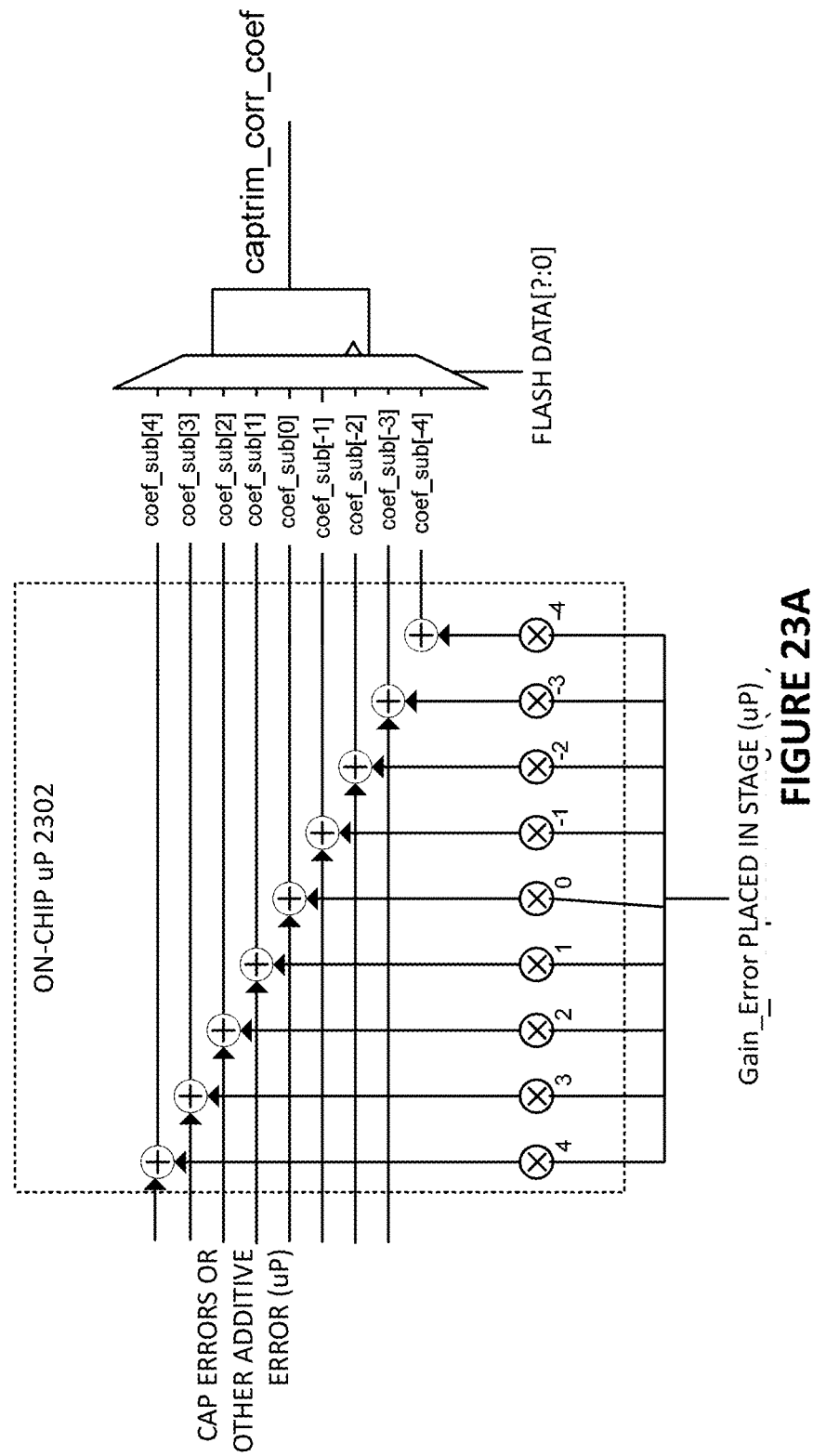
FIG. 23A-B show exemplary calibration functions suited for being carried out by the on-chip uP, according to some embodiments of the disclosure.
Figure 23B:
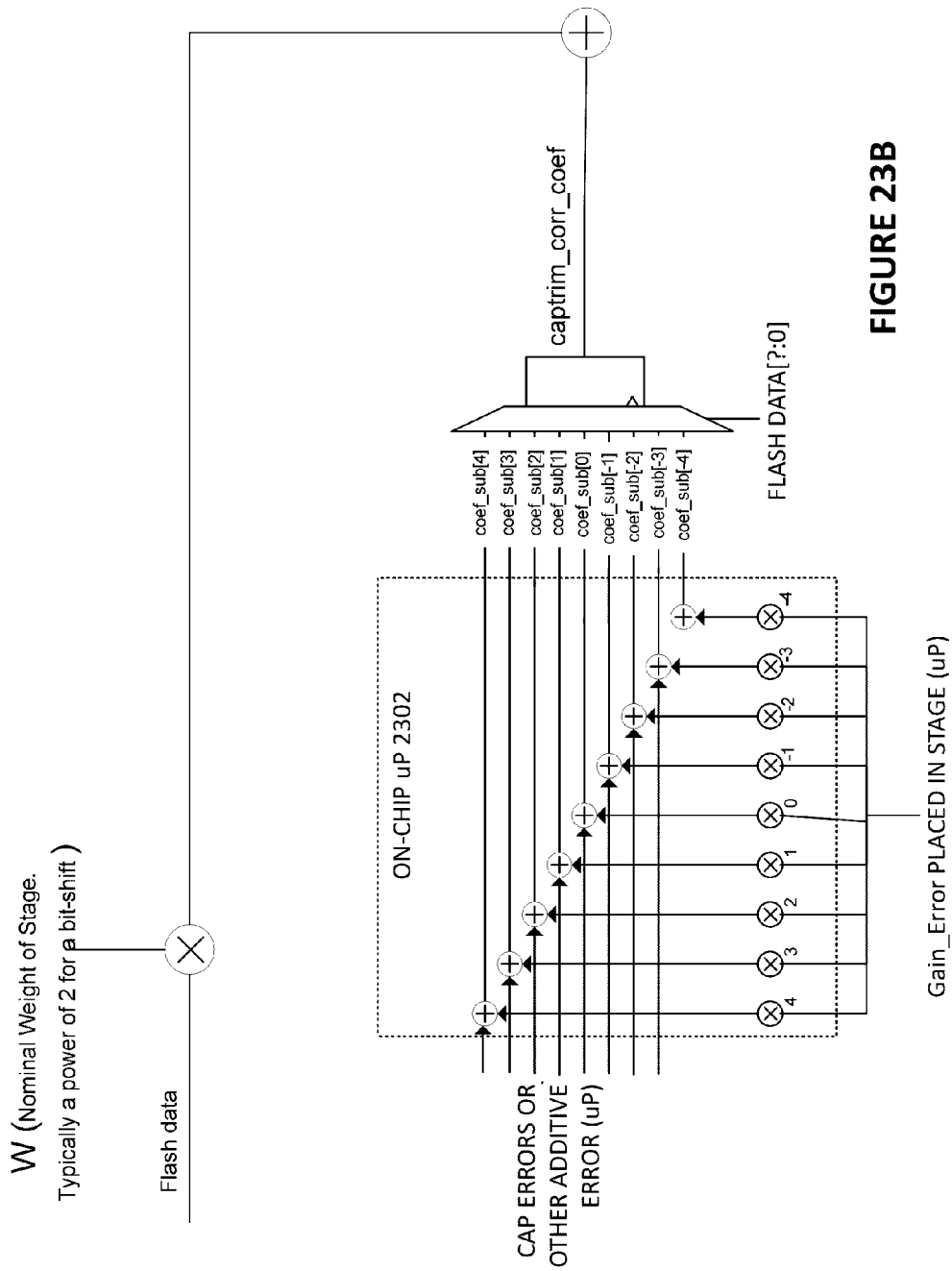

FIG. 23A-B show an exemplary calibration functions suited for being carried out by the on-chip uP, according to some embodiments of the disclosure. In some cases, the calibration involve computing a correction term, e.g., an additive correction term, for the signal path. A look up table can be used for each sub-range to look up the correction term, and the on-chip uP 2302 can advantageously perform the computations for generating the correction terms. In FIG. 23A, the look up table has the nominal bit weight of the stages built-in, e.g., for a 3-bit flash ADC. For the 3-bit flash ADC example, the captrim_corr_coef can replace the flash output data. In FIG. 23B, this lookup table assumes that the nominal weight of the flash stage is handled using an addition in the high speed path. The nominal weight W is typically applied with a bit-shift and add. This can reduce the size of the lookup table at the expense of another adder. For this example, captrim_corr_coef can be added to the residue. This example shown in FIG. 23B could require less hardware (e.g., muxes) since the correction terms are smaller than the example shown in FIG. 23A.

In the example shown, the correction for IGE and for the capacitor error (DAC INL, or capacitor trimming, or any suitable non-linearity error) can be performed together using the resulting correction term "captrim_corr_coef" (used as a correction term, or an additive correction term, e.g., a term to be added to the residue output signal of a particular stage). To generate the correction terms (that are easily selectable by the flash ADC output data "flash data" using the mux), each capacitor error coefficient per code (in this case there are 3 bits, thus 9 codes) are individually added by a gain correction term having each code multiplied by the gain error ("Gain_Error placed in stage", e.g., −4*ge, −3*ge, −2*ge, . . . , +3*ge, +4*ge). The updating or computation of correction terms coef_sub[x] (in this example, 9 coefficients) can be computed easily using the on-chip uP 2302. Performing such calculation to generate all coefficients (easily selected by the flash ADC output data via the mux) during the update using the on-chip uP 2302 instead of having to perform multiply using dedicated hardware each time the coefficient is needed by the signal chain can greatly improve the efficiency of the system. Also, when there are many stages and many channels (e.g., in an interleaved ADC), the on-chip uP can reduce the need to provide specialized multiplication circuitry for each of the stages and each of the channels.

The gain error can be combined with capacitor errors or other additive terms into a small lookup-table for each stage. This is applied by multiplying the signed integer representation of the stage's digital output data (e.g., −4, −3, −2, −1, 0, 1, 2, 3, 4,) by the gain to be applied and then adding one term per subrange, as illustrated by FIGS. 23A-B.

The following code illustrates the lookup table where the gain error (GE) is in the lookup table.

```
For subrange_index = 0 to 8
    flash_code = subrange_index − 4
    DAC_LUT[subrange_index]=(flash_code +
    subrange_err[flash_code])*GE
End For
```

On-chip uP can Change the Speed of Adaptation

Generally speaking, calibration algorithms (or training/adaptation algorithms) are implemented to adjust error coefficients (sometimes referred herein as correction terms). The adjustment of error coefficients is preferably performed at a slow rate so as to not cause abrupt changes in the system. With an on-chip uP, a program can be executed by the on-chip uP to adjust the rate of training/adaptation. For implementations where averaging is used, the rate of training/adaptation is associated with the number of samples being used for the averaging in an accumulator, or a term used for dividing the accumulated value when computing the average. The adjustment can be made based on temperature, measurements of the input signal, or other suitable measurements which may indicate whether the state of the chip is likely to be changing quickly or slowly. For instance, if the temperature (e.g., measured by a temperature sensor on the chip) indicates fast/large changes in temperature, the training/adaptation rate can be increased to more quickly. In another instance, if the input is relatively large, the rate can also be adjusted accordingly. In many cases, one or more coefficient in the training/adaptation algorithm can be adjusted by the on-chip uP to change the convergence time of the algorithm. Stability of the system can be improved.

On-chip uP can Implement Trimming or Calibration Sequence

One advantage of the on-chip uP is the ability to allow for changes or programming of the calibration sequence without having to change the underlying converter or calibration circuitry. Calibration sequence refers to the order in which parts of circuitry of the converter are calibrated, e.g., what is to be calibrated, which stage is calibrated first, which part of the stage is calibrated first, etc. During the design phase, designers have a particular calibration sequence. During the validation phase, engineers may have a different calibration sequence, or a different calibration scheme. The differences in calibration sequences can be attributed to different environments for testing the circuitry. For this reason, having an on-chip uP being able to execute any selected or desirable calibration sequence or calibration schemes can significantly reduce the need to re-design or re-implement circuitry to accommodate the new calibration sequence. The calibration sequence can be even selected at factory or at the user to improve calibration via an interface to the on-chip uP, if desired.

On-chip uP can Assist Comparator Trimming/calibration

Generally speaking, the comparators are switched in and out to measure any comparator offsets that may be present. The following outlines an exemplary method:

Step 1—Short all the comparators to the common mode (ground). Set all the offsets to all comparators to the low side. All of the comparators would have zero outputs so the −8 code would come out of the backend flash.

Step 2—Start increasing the offset control to one comparator until its output flips from 0 to 1. When this happens the output code will change from −8 to another code. As soon as it toggles then one of the trims on either side should be taken.

Step 3—Repeat Step 2 for each of the comparators individually. The output of the backend flash, indicative of the comparator offset, can be mapped to a register for this mode.

The on-chip uP can serve as a controller for switching the comparators to the proper state according to the above mentioned series of steps to measure offsets for one or more of the comparators. Furthermore, the on-chip uP can determine one or more error coefficients for compensating or correcting the error based on the measured offset.

On-chip uP can be Suitable for Performing Algebra to Compute Errors and/or Error Coefficients Determining the error from measured signals is not always trivial. Usually, a mathematical model is provided for describing the relationship of the error with respect to one or more measured signals. To determine the error, one or more algebraic computations may be executed to derive or solve for the error. For instance, the algebraic computations can involve computing correlations, and/or determining differences between the measured signals (or an average thereof) with respect to reference signal(s). These algebraic/arithmetic computations can, in some cases, be implemented and executed easily by the on-chip uP (or a combination of dedicated digital circuitry and an on-chip uP).

Furthermore, determining the error coefficients from measured or determined error is not always trivial. For example, in a pipelined ADC, the gain error coefficients can depend on the gain of the previous or later stage(s). Usually, the exactness for the gain error coefficients is important for interleaved converters where the gain for each interleaved channel is to be matched against other interleaved channels. For this reason, the gain error coefficients are computed using complex algebra to properly correct the gain error(s) in the signal chain. These algebraic computations can, in some cases, be implemented and executed easily by the on-chip uP (as opposed to dedicated hardware computation blocks). Gain error or other slow changing error is assumed to not change very often, thus, the updating of such errors can be performed by the on-chip uP (or in some cases, slow speed dedicated hardware).

Having the on-chip uP to execute at least one or more of algebraic/arithmetic operations can alleviate the need to provide specialized digital circuitry or hardware for implementing these functions. This advantage is particularly significant in interleaved pipeline ADCs where the on-chip uP can replace (at least in part) specialized digital circuitry which may have to be provided for each stage of the pipeline ADC for each the interleaved channels. Furthermore, the advantage is significant in interleaved pipeline ADCs where the inter-related stages and interleaved channels may prompt more complex algebraic computations (that the on-chip uP can easily compute).

In some embodiments, dedicated digital circuitry can be used to perform these operations (without requiring an on-chip uP).

On-chip uP can Program Analog Circuitry

With the measurements taken specialized digital circuitry, and the on-chip uP can determine error coefficients usable for programming the analog circuitry. The analog circuitry often includes many digitally controls, bias current, bias voltages, trimmable capacitors. Normally the configuration of the digital controls are determined based on reviewing many units from a number of processing lots during product characterization time to determine the best coefficients. With the flexibility of the on-chip uP, the digital controls can be configured or reconfigured after the converter is shipped to the user.

In one example, the on-chip uP can use a capture memory (e.g., capture RAM) to perform an on-chip Error Waveform (EWF) to determine transition points of the comparators in any one stage of a pipeline ADC (e.g., stage 1) or a reference ADC. Coefficients can be computed by the on-chip uP and be used to set one or more fuses to trim the capacitors. Accordingly, the on-chip uP provides the ability to digitally trim the comparators to improve the flash ADC comparators.

Exemplary Digitally-assisted Interleaved ADC

Figure 24:
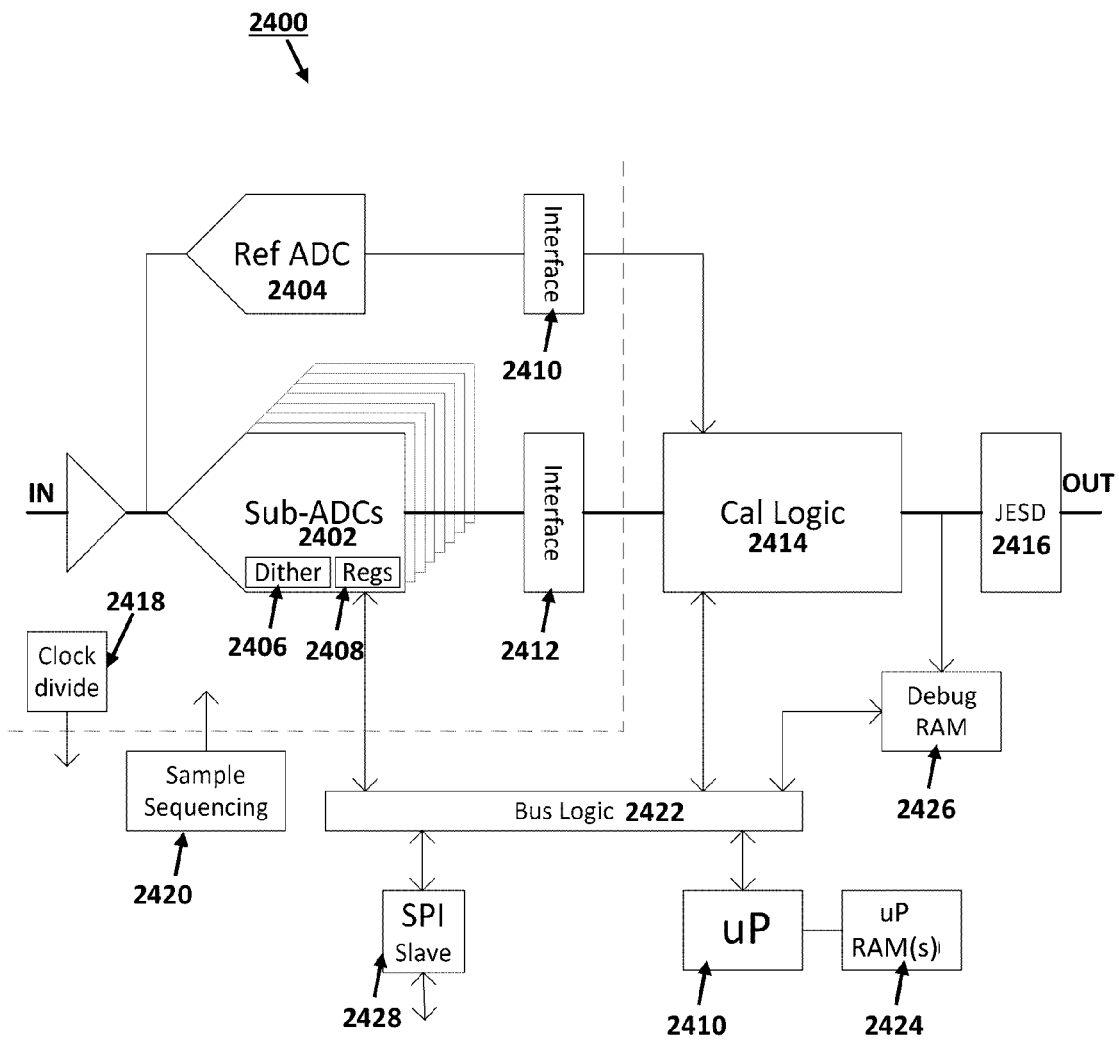
FIG. 24 shows an exemplary system diagram of an exemplary interleaved ADC having an on-chip uP, according to some embodiments of the disclosure.

FIG. 24 shows an exemplary system diagram of an exemplary interleaved ADC having an on-chip uP, according to some embodiments of the disclosure. The architecture of an interleaved ADC is described in relation to FIGS. 7A and 7B. FIG. 24 is similar to FIGS. 10-11, but shows illustrates some additional system components. The system 2400 includes a plurality of sub-ADCs 2402. Optionally, the system 2400 can include a reference ADC which can sample the input signal at a lower rate than overall interleaved ADC, but when the reference ADC is sampling, it generally samples at the same time when any one of the sub-ADCs is sampling the input signal. The reference ADC be used as a reference or provide a reference measurement signal for calibration algorithms. One or more ones of the sub-ADCs can have a respective dither generator 2406 and/or registers 2408. The registers 2408 can be accessible by the respective one or more ones of the sub-ADCs, e.g., to retrieve error coefficients to adjust the signal chain. An on-chip uP 2410 can access (read and/or write) to the registers 2408, e.g., with error coefficients usable for calibration. The output signals of the sub-ADCs 2402 and reference ADC 2404 are provided to respective interfaces 2410 and 2412, which can prepare the output signals (e.g., digital data) for the calibration logic 2414. The calibration logic 2414 can digitally correct the output signal from the sub-ADCs 2402 before the digital data is exported for output via a suitable interface, e.g., JESD interface 2416 or preferably a fast or high bandwidth data interface. The calibration logic 2414 can, in some cases, be integrated with the sub-ADCs 2402 for correcting errors in the analog domain. A clock divider 2418 and sampling sequencing 2420 can be provided to generate suitable clock signals for the sub-ADCs 2402, the reference ADC 2404, the calibration logic 2414, and the on-chip uP 2410. Sample sequencing 2420 can implement sequential sampling of the time-interleaved sub-ADCs 2402 or a randomized (or pseudo-randomized) sampling of the time-interleaved sub-ADCs 2402. Clock divider 2418 and/or sample sequencing 2420 can implement spread spectrum clocking for any one or more of the clock signals.

Advantageously, the calibration logic 2414 can implement accumulation and/or decimation to gather measurements of the outputs of the sub-ADCs 2402 and/or the reference ADC 2404 that the on-chip uP can process at a slower rate than the sampling rate of the sub-ADCs 2402 and/or the reference ADC 2404. The calibration logic 2414 and the on-chip uP 2410 can communicate over the bus logic 2422. The on-chip uP 2410 can include internal memory or closely coupled memory, e.g., on-chip uP random access memories (RAM(s)) 2424. The memory for the on-chip uP 2410 can store a variety of data used by the training/adaptation algorithm(s) implemented on the on-chip uP 2410, including one or more of the following: inputs to the algorithm(s), intermediate values of the algorithm(s), measured error(s), and error coefficient(s). The memory for the on-chip uP 2410 can store instructions executable by the on-chip uP 2410 to carry out the training/adaptation algorithm(s).

To provide a debug feature, the system 2400 can include a debug memory, e.g., debug RAM 2426, for storing or logging data measured by the calibration logic 2414, data values computed by the on-chip uP 2410, etc. The data can enable a user to gather data during a debug mode of the system 2400. To allow a user to access the system 2400, a suitable serial interface (e.g., Serial Peripheral Interface (SPI) slave) can be provided to allow a user to read and/or write to memory elements of the system 2400, including one or more of the registers 2408, debug RAM 2426, and uP RAM(s) 2424, etc. This allows a user to write and configure the system 2400, read from debug RAM to obtain data for analysis, and/or write to uP RAM(s) 2424 to configure the functions of on-chip uP 2410. These exemplary functions are for illustration and are not intended to be limiting.

In one example, system 2400 can be implemented using 28 nm technology node, with 12-bit resolution at 10 giga samples per second (GSPS), having eight interleaved sub-ADCs with random and sequential sampling modes.

An on-chip dither generator (e.g., dither generator 2406) can be provided for each sub-ADC, and the overall system 2400 can be calibrated for interstage gain, interleaving errors including, e.g., offset, gain, and timing, sample order dependent interleaving errors including, e.g., offset, gain, and timing. The on-chip uP 2410 can be used to execute slower speed processing (slower with respect to ADCs, or even the calibration logic 2414).

In some embodiments, each sub-ADC is a pipeline ADC, and the calibration logic 2414 can have a respective calibration block for one or more stages of pipeline ADC. For example, a pipeline ADC having five stages may have five calibration blocks, or less, if some stages are not to be calibrated. The calibration block can compensate for capacitor mismatch error and interstage gain error. Correlation can be run with measured signals or data from the stages of the pipeline ADC and provide data at a lower clock rate. The on-chip uP 2410 can perform adaptive coefficient updates and computes correction coefficients to be used by calibration logic 2414, and stored in registers 2408 of the sub-ADCs. The on-chip uP 2410 can write error coefficients to registers in calibration logic 2414 or registers 2408 of the sub-ADCs. Furthermore, the on-chip uP 2410 can implement control functions for system 2400. In some cases, the on-chip uP 2410 can provide supporting functions for testing, debugging, etc.

Exemplary Error Coefficients and Data Used for Calibrating a Pipeline ADC

Figure 25:
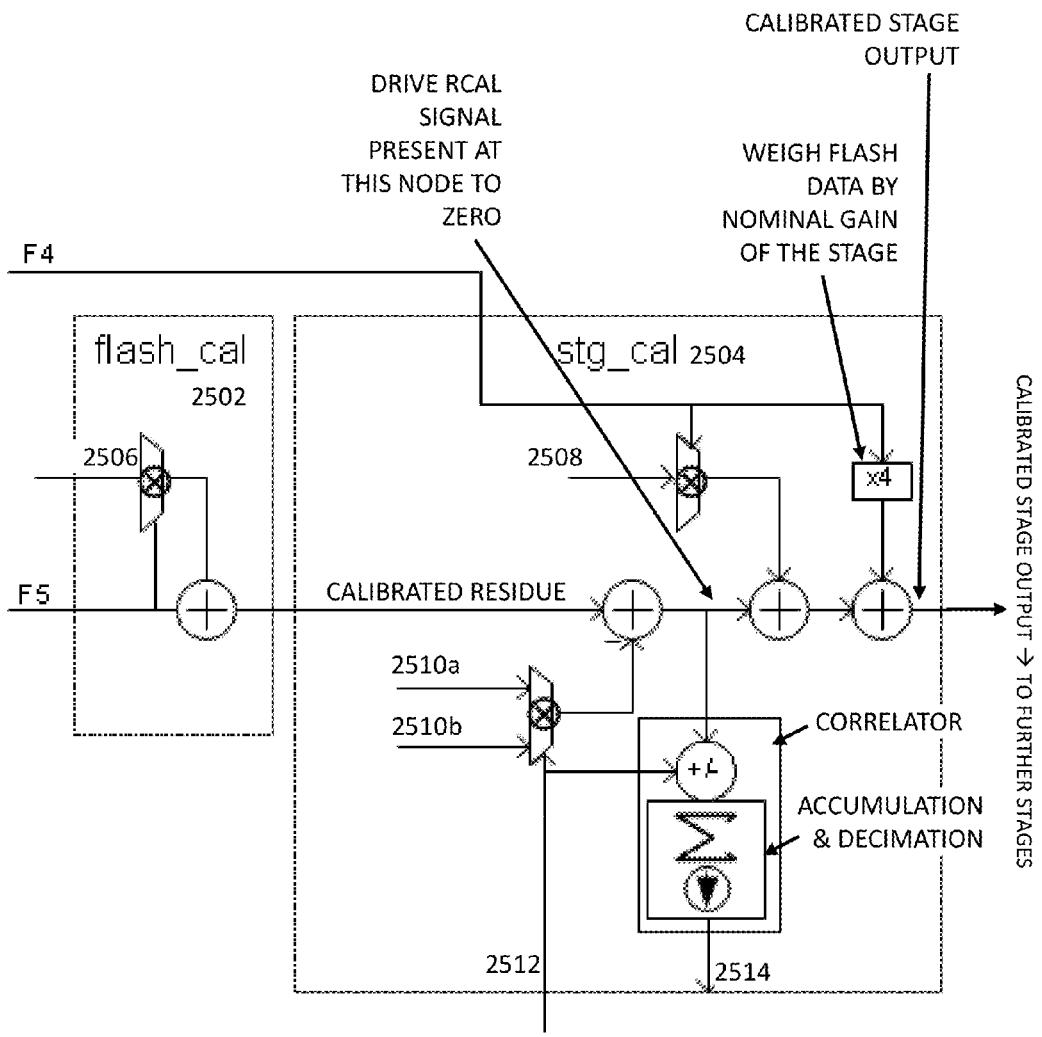
FIG. 25 shows an exemplary hardware flow for flash ADC calibration and pipeline stage calibration, according to some embodiments of the disclosure.

FIG. 25 shows an exemplary hardware flow for flash ADC calibration and pipeline stage calibration, according to some embodiments of the disclosure. This example is applicable for multi-stage ADCs (including pipeline ADCs) in general, and for pipeline ADCs used as sub-ADCs in time interleaved ADCs. The FIGURE shows a flash ADC calibration block, e.g., flash_cal 2502 (for compensating errors of the back end flash ADC), a pipeline stage calibration block, e.g., stg_cal 2504 (for compensating errors in a particular stage of a pipeline ADC). Multiple ones of the pipeline stage calibration block can be provided for multiple stages of the ADC (e.g., one per stage). The calibration blocks can be implemented digitally, where coefficients can be selected using a mux, and applied to an output signal to digitally compensate for one or more errors. For some calibration blocks, the following list provides an exemplary description for the signals, which can be provided to the on-chip uP for calibration or can be written in registers by the on-chip uP for calibration:

| | | |
|---|---|---|
| 2506 | Can be generated by on-chip uP | 2506 can be implemented as a look-up table using a mux; 2506 can be used to calibrate the back end flash ADC of a pipeline ADC. The mux can select the appropriate error coefficient based on the digital data such that the appropriate error coefficient can be added or applied to the signal to digitally correct for comparator mismatches (effectively trim the comparators) in the back end flash ADC. |
| 2508 | Can be generated by on-chip uP | 2508 can correct for gain change and/or provide capacitor trimming; This represents a look up table for storing coefficients or correction terms that can adjust the transfer function of a stage for correcting errors in a stage. The transfer function can take into account gain, capacitor errors, etc. Rather than a single look up table (as shown in this FIGURE), delay block(s) and multiple look up tables can be used to implement a finite impulse response filter to adjust the transfer function of the stage or correct an error of a particular stage. |
| 2510a, 2510b, | Can be generated by on-chip uP | 2510a and 2510b are programmed by the on-chip uP to be two different (expected) levels to be used as the random or dither signal for the correlation (the random or dither signal referred herein as RCAL, in some cases correct for offset trim), and the two different levels are selected by RCAL 2512. |
| 2512 | Generated by RCAL cap (or dither DAC for generating RCAL) | 2512 can be provided to the correlator for error measurement, which can be used to measure capacitor transitions and/or drive the RCAL signal level present at node (node with the expected level of RCAL 2510a/b has been subtracted from the calibrated residue) to zero. |
| 2514 | Provided to on-chip uP | 2514 comprises data of a lower rate (e.g., generated by accumulation and decimation) usable by the on-chip uP to compute error(s) and/or error coefficients for correcting errors of the stage (e.g., to update 2508). |

Example:Calibrating Capacitors ("Caps") of a Stage of a Pipeline ADC ("Cap-Cal")

One task is to remove step errors in the transfer function so that a bit toggle in a particular stage matches the change in the backend residue. For example, in stage two, each bit is weighted by 64, when toggled the residue should nominally toggle +Vref/4 to −Vref/4 which should nominally resolve to +32/−32, offsetting the step. If cap is too small, it may only jump from +32 to −29. DAC capacitor calibration ("DAC cap-cal") can compute this difference and subtract 3 from the output when in this subrange.

In some embodiments, calibration can start at stage 4 and calibrate backwards ending at stage 1. Such a scheme can allow a corrected backend to be used for measurements.

In some embodiments, calibration involves biasing the stage to +/−Vref/4 using the stage 1 dither-DAC. Toggling the cap of interest from +/−Vref can toggle the residue to −/+Vref/4. The change in the backend can be measured and averaged over N samples. Deviation from expected value can be calculated and saved as cap-error values. Dedicated hardware correlator used in interstage gain error calibration can be reused or used for this measurement. Subrange correction values are computed as cumulative sums of cap-error values. The cumulative sums of cap-error values can be applied for calibration the capacitors.

In embodiments, a dither search algorithm is used to bias each stage to +/−Vref/4. Caps 1-8 can be nominally tied to +Vref; these need stage to be biased to +Vref/4 so that when they toggle we jump to −Vref/4. Caps 9-16 can be nominally tied to −Vref; need bias to −Vref/4. Dither search algorithm can be performed in each stage immediately before DAC capacitor calibration ("DAC cap-cal"). The algorithm is useful because due to non-idealities it is not known exactly how much dither is required to bias a later stage to +/−Vref/4. Expected backend output for +/−Vref/4 bias is:

expected_output[stg]=+/−stage_weight[stg]/2.

Dither search algorithm can involve a series of steps:
Unlock all flash stages
Start with dither at full scale negative
For i=1:7 loop
  Average output for N cycles
  If difference between average and expected greater than nominal dither[i], toggle dither[i] for next round
Repeat twice, once for +/−Vref/4, and save dither values for each to use in biasing during DAC cap-cal
During DAC cap-cal, LOCK the front-end flash stages so that biasing point is maintained
Measuring DAC-caps involves computing size of each DAC step:

$$cap_{size[n]} = \frac{1}{N} * \sum_{i=0}^{N-1} cap\_sign[i] * residue[i], n = 0, 1, \ldots 15$$

Compute cap error can involve computing the following:

expected_cap_size[stg]=stage_weight[stg]/2 cap_error[n]=expected_cap_size[stg]−cap_size[n]

Sum to form final adjustment for subrange:

subrange_err[k]=$\Sigma_{i=0}^{k-1}$cap_error[i]−$\Sigma_{i=k}^{15}$cap_error [i], k=0,1,2 . . . 16

Example: Forming Baseline for Random or Dither Signal ("RCAL") DAC or RCAL Capacitor Calibration ("Cap-Cal")

The task is to measure the RCAL cap in each stage (used in a DAC to generate the random/dither signal being used for the correlation) using the corrected backend to form the baseline for the interstage gain error calibration. The task involves calculating rcal_weight variable for IGE, which is used as the baseline for interstage gain error background calibration. This task, "RCAL cap-cal", can be performed after the DAC cap-cal for that stage.

In some embodiments, RCAL cap is nominally ⅛th size of DAC-cap; toggling it swings the output by Vref/16 magnitude (Vref/2 for DAC-caps). Due to amplifier nonlinearity, gain is larger near 0 than Vref/4. Where we offset the amp before toggling RCAL can affect how large it appears in backend. To get a "best fit", dither can be used during RCAL cap measurement. Let dither-DAC in stage 1 run freely at half-speed. Toggle each RCAL cap at full speed, and use existing correlators to measure RCAL size. By running at half-speed, dither can cancel for each RCAL cap toggle, so it doesn't need to be averaged out as noise. Measuring RCAL caps can involve computing the following:

$$\text{rcal\_weight}^\wedge[n] = \frac{1}{N} * \sum_{i=0}^{N-1} rcal[i] * \text{residue}[i] \Big|_{\substack{dith=rand(div2clk) \\ rcal\ toggle\ every\ clk}}$$

Example: Dither Capacitor Calibration

The task is to measure each binary-weighted dither cap in the S1 dither-DAC using the corrected backend so that the dither can be accurately subtracted out digitally (to avoid a hit to the signal-to-noise ratio). This task can be performed after DAC cap-cal and/or RCAL cap-cal. Similar to RCAL cap-cal, the task tries to get a "best fit" of the nonlinearity.

In some embodiments, cap-cal is performed one capacitor at a time (e.g., there are 7 dither caps). The cap-cal lets the 6 other dither caps randomly toggle on a div2 clk, and toggles the other cap (the cap under calibration) every clk cycle, similar to RCAL cap-cal. The 6 other dither bits cancel out, so averaging them out as noise is not necessary. Measuring dither caps can involve computing:

$$\text{dith\_weight}^\wedge[n] = \frac{1}{N} * \sum_{i=0}^{N-1} \text{dith\_n}[i] * \text{residue}[i] \Big|_{\substack{dith[j\neq n]=rand(div2clk) \\ dith[n]toggle\ every\ clk}}$$

Example: Interstage Gain Error (IGE) Correction

Interstage gain error (IGE) correction or calibration involves calibrating the Inter-stage Gain Error of stages 1-4 in all 8 subADCs. A known signal, e.g., a random signal, is injected onto the summing node of each stage. Injecting the random signal to each stage allows the interstage gain of each stage to be separately and independently determined. Calibration signal can be a 2 level pseudo-random RCAL signal, which can be run at Fs/2, Fs/4, Fs/8, Fs/16 for FG/debug. It can be forced to +/−1. RCAL progresses through the same amplifier and ADC backend (BE) stages as the desired signal. A Foreground or Factory Measurement of the baseline power out of the backend stages sets a baseline operating point. At the baseline, IGE˜=0 (foreground cap-cal can make this zero). Any changes in the power of the RCAL during operation is considered to be because of a change in the gain of the amplifier and BE Stages. These changes are usually presumed to be changes in the Voltage/Temperature (VT) operating point. This gain change is assumed to be correct and applied to the main path. A correlation based LMS algorithm can be used to minimize the RCAL out of the backend (BE). This removes RCAL and senses the gain at the same time. The analog sub-ADC pipeline can be modeled by the following equation:

$$R=[(S-DAC[flash\_code])*Gnom+rcal*rcal\_weight]*(1+IGE)$$

The RCAL signal is the 1-bit random signal injected into each stage. rcal_weight represents the size of the RCAL (analog) injection for the foreground process-voltage-temperature (PVT) operating condition. This reflects the cap size and the baseline amplifier gain.

For IGE the digital tries to minimize the following error signal (e.g., signal which is left behind when the random signal is removed):

$$\text{error}=(R*(1+IGE\_corr))-rcal*rcal\_weight^\wedge$$

This only happens when the:

$$rcal\_weight^\wedge=rcal\_weight*(1+IGE)*(1+IGE\_corr)$$

IGE is variation from the baseline PVT. Assuming rcal_weight rcal_weight (Assuming cap-cal was accurate), then:

$$IGE\_corr = \left(\frac{1}{1+IGE}\right) - 1$$

The "error" signal to be driven to zero is used in the correlation process:

$$\text{error}=(R*(1+IGE\_corr))-rcal*rcal\_weight^\wedge$$

A hardware correlator can be used to average N samples of the error*rcal.

$$rcal_{corr} = \sum_{sn=0}^{sn=N-1} \text{error}*rcal$$

This is a 1-bit rcal*error so it is just a mux and an accumulator. The Correlator outputs are read directly by the on-chip uP and further averaging can be applied:

$$IGE\_corr\mathrel{+}=\mu*rcal_{corr}$$

μ Can be controlled by the on-chip uP to control how quickly the error coefficient is to be updated.

The IGE_corr from this stage is then applied to the Residue to form a feedback loop. IGE_corr is combined with the cap information and mapped to the correction hardware (as illustrated by FIGS. 23A-B). Note that the gain correction IGE_corr is being applied to the residue signal R $$\text{error}=(R*(1+IGE\_corr))-rcal*rcal\_weight^\wedge$$

In order to avoid a high resolution multiplier for this multiplication, the multiplication is distributed through the back-end gain stages. For example for Stage 1, the correction is the following:

$$R1\_corr=(1+IGE\_corr\_stg1)*[F2\!<\!<\!6+F3\!<\!<\!4+F4\!<\!<\!2+F5]$$

Since the equation is linear the multiply can be distributed to all the flash stages. For stages 2-5 the flash is multiplied by a term that includes the stage 1 gain. For stages 3-5 we have a term that includes the Stage 1 and Stage 2 gain, etc.

For instance, the stage 3 IGE correction term can include the stage 1 and stage 2 gain:

IGE_corr_stg3=(1+IGE_corr_stg1)*(1+IG-
E_corr_stg2)−1

−1 in the above equation is due to the additive error model being used. A new variable applied_gain_corr can be introduced to reflect that the gain accumulates as the process goes from Stage 1 to Stage 5. Also, a "Stage 0" gain can be used to change the overall gain of a subADC. The variable(s) are useful for Interleaving Cal or for general gain adjustment (interleaving gain calibration). The computation of applied_gain_corr can be performed by the on-chip uP. Pseudo code for computing applied_gain_corr is as follows:

```
//Compact C description for computing cumulative gain
gain_cum[0] = 1 + Gain_Error; // Channel Gain of subADC for other
purposes
for( stg_index=1;stg_index<5;++stg_index)
{
   applied_gain_corr[stg_index] = gain_cum[tg_index − 1] − 1.0;
   gain_cum[stg_index] = applied_gain_corr[stg_index] *
   (1 + ige_corr[stg_index]) ;
   rcal_level[stg_index] = rcal_weight^ *
   applied_gain_corr[stg_index] ;
}
```

In some embodiments, capacitor trim and IGE correction as mentioned above can be combined into one look up table, using the following equation, whose computation can be performed by the on-chip uP:

DAC_LUT[flash_code]=(flash_code+subrange_err
[flash_code])*applied_gain_corr

The procedure for computing the values of the lookup table using a mux was previously illustrated in FIG. 23A-B, where both IGE and capacitor errors (or other additive errors) are both taken into account by the values in the look up table selectable by the flash output code. Generally, the uP can compute values for the DAC_LUT[*] and writes the values to hardware. Advantageously, the uP alleviates the need to implement dedicated hardware multipliers, since the computation involving multiplications are performed by the uP. A further advantage involves combining the IGE and capacitor trip values together in one look-up table where the values from the look up tables can be added to the residue (as an additive correction term).

The following outlines, as another example, how the gain can be applied to later stages of the ADC.

R*: Digital residue of a particular stage
S*: Flash data of a particular stage
W*: Weight of a particular stage
GE*: Gain Error of that stage.
Gain*: Gain for that stage, expressed as (1+GE)
W_Gain*: The actual gain applied for a particular stage. This is a function of the gain error measured for that stage and gain error from earlier stages.

$R4=S5*W5$ (residue of stage 4 is the flash data of stage 5*the weight of stage 5)

$R3=R4+S4*W4$ $R2=R3+S3*W3$ $R1=R2+S2*W2$ $R0=R1+S1*W1$ (ADC Output)

$R0=ADC=(S1*W1+S2*W2+S3*W3+S4*W4+S5*W5)$
$*IL\_GAIN*CH\_GAIN$

IL_GAIN: Interleaving gain (optional), a possible coefficient for changing the gain of the entire subADC channel for interleaving calibration CH_GAIN: Channel gain (optional), a gain setting for the ADC channel for use by the customer or for Quadrature Error Correction (QEC). CH_GAIN would be applied to all subADCs.

$W1=256*(1+GE1)$ - - - Represents only the gain of that stage.

$W2=64*(1+GE2)$ $W3=16*(1+GE3)$ $W4=4*(1+GE4)$ $W5=1$

Math passing the gains down the pipe to change the gain of each stage, using recursion, so that gain of a stage takes into account for gain of the previous stage(s)

W_GE*: accumulated weight or gain to be applied, or "cumulative gain term"

$W\_GE1=(1+IL\_GAIN)*(CH\_GAIN)$ $W\_GE2=W\_GE1*(1+GE2)$ $W\_GE3=W\_GE2*(1+GE3)$ $W\_GE4=W\_GE3*(1+GE4)$ $W\_GE5=W\_GE4$

Note: The accumulated weight (or "cumulative gain term") replaces the weight of the particular stage to correct for IGE. The accumulated weight (or "cumulative gain term") is a function of everything that came before (as outlined above).

$ADC=(S1*W\_GE1+S2*W\_GE2+S3*W\_GE3+$
$S4*W\_GE4+S5*W\_GE5)*IL\_GAIN*CH\_GAIN$

This equation is linear, thus the gain term for each stage can be distributed to individual stages, and the multiplication for computing the additive correction terms taking the cumulative gain term into account can be calculated by the on-chip uP.

Using the above calculations for IGE, a dedicated memory element can be provided for each residue to be corrected. The dedicated memory element can serve as a look up table to store additive correction terms being used for each possible digital output code of the particular stage (or each subrange of the residue). Typically, a small look up table is being provided to correct capacitor errors already, thus, correcting the gain using the same small look up table (e.g., as illustrated in FIG. 23A-B) means it would not incur additional circuitry. The result is a very efficient architecture for correcting IGE. In some conventional approaches, a single large look up table having thousands of coefficients are used to store calibration coefficients, or a dedicated high speed multiplier is provided to correct each stage. Large look up tables (storing thousands of coefficients) not only take up area, the look up operation is considerably slower than smaller look up tables (storing tens of coefficients). In the other conventional approach, using a dedicated high speed multiplier is problematic because it is larger and more power hungry then using a small look up table and an adder for correcting IGE.

Generally speaking, the correction term (or error coefficients) stored in these look up tables can be additive, or it could replace data in the signal path with a corrected value. The choice of either option can depend on the application and implementation.

Applying Linear Filters as Additive Correction Terms to the Residue

Applying a multiplicative gain term can be considered as applying a one-tap linear filter to the residue of a stage. Leveraging the same concepts as above, it is possible to apply a linear filter, e.g., implemented with multiple taps, and to apply the linear filter to correct a particular stage using multiple look up tables (one look up table for the residue, one or more look up tables for delayed version(s) of the residue). Linear filters implemented with multi-tap filters can be useful for addressing memory effects when correcting the particular stage (e.g., the residue output signal). The current output code can select one (additive) correction term from one look up table; a delayed version of the output code can select a further (additive) correction term from a further look up table. The final (additive) correction term to be applied to correct the stage (e.g., the residue output signal) can be a sum of the selected (additive) correction term and the further (additive) correction term. For more taps, additional delay can be applied and further look up tables can be used. Outputs from the look up tables are summed together to generate the final correction term When dealing with linear filters being applied to cascaded stages, calculating (additive) correction terms for a given stages (i.e., values in the look up tables) can take linear filter(s) of previous stage(s) into account. Phrased differently, a cumulative linear filter can be individually applied for each stage, where the cumulative linear filter would take into account the linear filter of a given stage with the linear filter(s) of previous stage(s). To compute taps of the cumulative linear filter, the filter taps of the linear filter of the given stage and filter taps of the linear filter(s) of the previous stage(s) can be convolved with each other to generate the cumulative linear filter for the given stage.

A linear filter for each stage can be determined using a multi-tap form of the least means squared algorithm (similar to ones described herein). Frequency dependent errors of the stage can then be corrected, e.g., in addition to the gain term. Errors corrected this way are often referred to as memory errors where the current sample of the residue depends partially on a weighted sum of correction terms for the present sample and one or more previous samples. Separate look up tables can be provided for the current output code and delayed version(s) of the output code. Phrased differently, the filter (if implemented as a finite impulse response filter) can have multiple taps taking the output code as input, and each tap of the filter can have a respective look up table. Since the look up tables are small, implementing and using such look up tables can be done very efficiently (especially when the on-chip uP can be used to compute updated coefficients).

Note that the mathematical formulation for applying the linear filters to the stages of the converter is similar to the mathematical formulation outlined above for gain error. The weights for the gain error can be modeled in the frequency domain as a function of z, and multiplication is replaced with convolution. This allows a single high speed digital filter to be replaced with smaller digital filters where the word widths are in the flash data (output code). In a similar fashion as correcting gain, the (additive) correction terms can correct each stage in a very efficient manner, even when the linear filters have multiple taps. Small look up tables replace any multipliers which would have been otherwise needed to provide the linear filters. If capacitor errors are to be included in the look up tables, the first tap can include such additive capacitor error term.

Suppose the linear filter for each stage is modeled as a 2-tap filter, the mathematical formulation can be as follows:

The first stage can be modeled using the following, where C* refers to the coefficients of the filter taps of the linear filter corresponding to a particular stage $$C1_0 + C1_1 \cdot z^{-1}$$

If stage 2 and stage 3 have similar 2-tap filter forms as above, then the cumulative linear filter to be applied into stage 2 would be given by the product of the polynomials or by a convolution of the coefficients:

$$(C1_0 + C1_1 \cdot z^{-1}) \cdot (C2_0 + C2_1 \cdot z^{-1})$$

$$C1_1 \cdot C2_1 \cdot \left(\frac{1}{z}\right)^2 + \frac{C1_0 \cdot C2_1 + C1_1 \cdot C2_0}{z} + C1_0 \cdot C2_0$$

The cumulative linear filter to be applied into stage 3 would be:

$$(C1_0 + C1_1 \cdot z^{-1}) \cdot (C2_0 + C2_1 \cdot z^{-1}) \cdot ((C3_0 + C3_1 \cdot z^{-1}))$$

$$C1_1 \cdot C2_1 \cdot C3_1 \cdot$$

$$\left(\frac{1}{z}\right)^3 + [(C1_0 \cdot C2_1 + C1_1 \cdot C2_0) \cdot C3_1 + C1_1 \cdot C2_1 \cdot C3_0] \cdot \left(\frac{1}{z}\right)^2 +$$

$$\frac{(C1_0 \cdot C2_1 + C1_1 \cdot C2_0) \cdot C3_0 + C1_0 \cdot C2_0 \cdot C3_1}{z} + C1_0 \cdot C2_0 \cdot C3_0$$

The computation of the cumulative linear filter is preferably computed at a slow rate by the on-chip uP (or in some cases, by dedicated hardware/fixed logic). The convolution and the algebraic equations are equivalent implementations.

Note: The taps for the cumulative filter can be seen to be products of the filter responses. Since most of the coefficients are small and less than 1, the products are even smaller which can make some of the calculated taps negligible. Using information about the expected ranges of the coefficients C1, C2, and C3, it is possible to determine which ones are not significant and these coefficients can be omitted from the hardware. This means that "Approximations" to the convolved transfer functions can also be used. This can be particularly useful since each tap (i.e., each coefficient) requires its own lookup table in the hardware for adjusting the residue or a delayed version of the residue. If a coefficient can be omitted, the look up table implementing that coefficient can be omitted. Convolution of multiple filters by definition expands the number of taps, and thus the ability to remove certain taps can greatly reduce the complexity of the system.

Exemplary Error Coefficients for Dither Subtraction

Dithering involves injecting a random signal (e.g., from an output of a DAC) to help remove spurs in the output spectrum. When dithering is used, in some cases, the injected signal is not precisely known because the dither signal is generated using a DAC, and is the dither signal is injected on the analog side. Because the actual amplitude is not necessarily well known enough, the dither signal is calibrated or measured so that it can be subtracted out properly.

Figure 26:
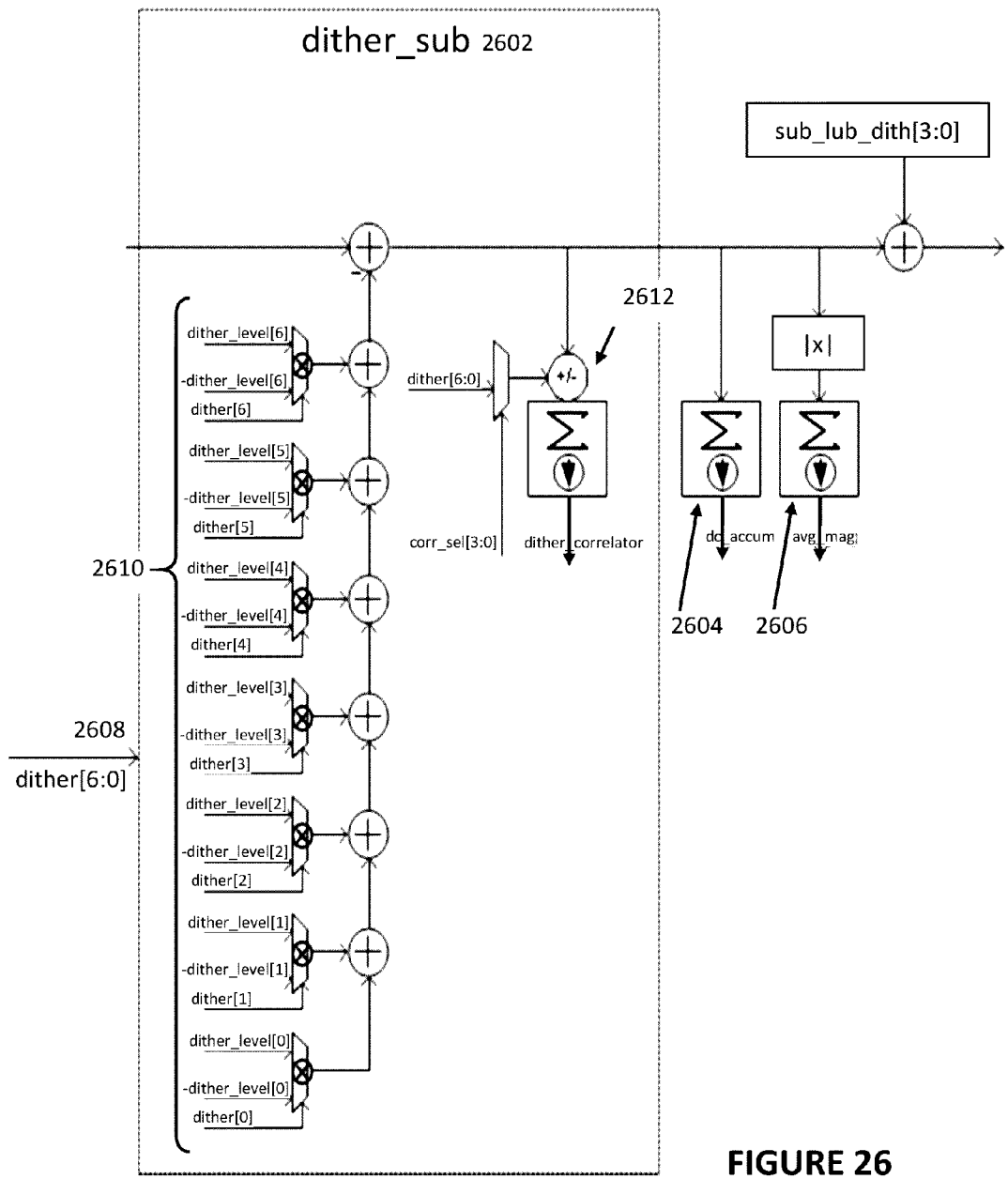
FIG. 26 shows an exemplary hardware flow for dither subtraction and exemplary accumulation and decimation blocks, according to some embodiments of the disclosure.

FIG. 26 shows an exemplary hardware flow for dither subtraction and exemplary accumulation and decimation blocks, according to some embodiments of the disclosure. This example is applicable for pipeline ADCs in general, and for pipeline ADCs used as sub-ADCs in time interleaved ADCs. The FIGURE shows a dither subtraction block, e.g., dither_sub 2602 (for subtracting the dither signal that was previously inserted in the converter signal chain), DC accumulation/decimation block 2604, and average magnitude accumulation/decimation block 2606.

Referring to the dither_sub 2602, the on-chip uP can provide signal 2608 to enable different dither signal levels (also provided by the on-chip uP) to be selected through muxes using circuitry 2610. The signal 2608 is also provided to perform correlation, using correlator 2612 to measure any dither DAC errors, as illustrated by the following series of steps implemented for a 7-bit Binary DAC for dither with 4 most significant bits injected in FLASH/MDAC (which keeps from using excessive Error Correction Range) and with 3 least significant bits injected into MDAC only. The binary weighted DAC has each bit viewed as 2 level DAC with separate correlations for each bit. To foreground or background calibrate the Dither DAC, the on-chip uP can force circuitry 2610 to round robin or go through the dither DAC one bit at a time, and run the LMS algorithm to minimize the RMS error (with the possibility to add de-correlation for $2^{nd}$ and $3^{rd}$ order products of dither[2:0] for non-linear estimation).

In some embodiments, the dither_sub 2602 subtracts the (large) dither signal which was injected in the front-end of the overall ADC. Assuming the DAC which generated the dither signal is a binary DAC, each capacitor for generating each bit for generating a particular voltage level are weighted in a binary manner. For example, the MSB-1 bit would be weighted ½ of the weight of the MSB bit. It is possible to correlate the weight of each bit using a dither correlator. The estimate weights can be determined independently for each bit of the dither DAC.

Further accumulation/decimation blocks are provided to collect measurements representative of the DC component of the output signal (using DC accumulation/decimation block 2604), and measurements representative of (using the magnitude |x| block and the average magnitude accumulation/decimation block 2606). The outputs from the accumulation/decimation blocks can be provided to the on-chip uP for calibration, debug, or testing purposes.

Example: Interleaving Offset Calibration

The average offset for each of the interleaved sub-ADCs may not be matched exactly, and the interleaving offset can be calibrated.

Two basic modes can be supported.
  a. Average offset of all subADCs and drive mismatch to zero.
    i. Equivalent to a DC coupled system. Preserves DC content.
  b. Independently drive the offset of each subADC to zero.

In both methods the correction is simply
  a. subADC[sn]=subADC[sn]−dc_corr[sn]
DC Coupled Method
  a. Use the subADC offset averaged over N samples to correct offset
    i. meas_dc[sn]=mean(subADC[sn]), every N samples
  b. Correction term is based off of deltas between each measured offset and the mean across all subADCs.
    c. dc_corr[sn]+=mu*(meas_dc[sn]−mean(meas_dc))
      i. The on-chip uP can compute this, or even perform further averaging of the meas_dc[sn] data.
  AC Coupled Method
    a. dc_corr[sn]+=dc_corr[sn]+mu*(meas_dc[sn])
      i. The on-chip uP can compute this, or even perform further averaging of the meas_dc[sn] data.

In some embodiments, the reference ADC can be used to speed up convergence of the calibration process (e.g., by almost 200×). Without the reference ADC, many samples are used for the average to measure the offset, especially when the signal is large. Using a reference ADC, the signal content is removed, and the averaging can focus on the noise or variations of the sub-ADCs. The above calculations are adjusted according to the following:
  mean(subADC[sn]) has to average out the signal that looks noise like.
  Replace by mean(subADC[sn]−RefADC)
  RefADC and the subADC sample at the same time instant so this first order nulls the signal.

Example: Interleaving Gain Calibration

The gain for each of the interleaved sub-ADCs may not be matched exactly, and the interleaving gain can be calibrated.

In both methods the correction is simply
  a. subADC[sn]=subADC[sn]*gain_corr[sn]
    i. Gain_corr placed in look-up tables used for IGE calibration. Does not require a separate multiplier (thereby saving area and power). The on-chip uP can advantageously perform algebra/arithmetic to combine this into a look-up table.
  b. Use the magnitude of the subADC averaged over N samples to correct offset (measured by taking the absolute value, e.g., abs( ))
    i. meas_mag[sn]=mean(abs(subADC[sn]))
  c. One subADCs magnitude is used as a reference.
    i. subADC_ref_mag
  d. Correction term is based off of deltas between each measured offset and the mean across all subADCs. The correction term can be computed using the on-chip uP.
    i. gain_corr[sn]+=mu*(meas_mag[sn]−subADC_ref_mag)

In some embodiments, the reference ADC can be used to speed up convergence of the calibration process (e.g., by almost 200×). Without the reference ADC, many samples are used for the average to measure the offset, especially when the signal is large. Using a reference ADC, the signal content is removed, and the averaging can focus on the noise or variations of the sub-ADCs. The above calculations are adjusted according to the following:
  mean(abs(subADC[sn])) has to average out the signal that looks noise like.
  Replace by mean(abs(subADC[sn])−abs(RefADC))
  RefADC and the subADC sample at the same time instant so this first order nulls the signal.

Example: Interleaving Skew Calibration

Figure 27:
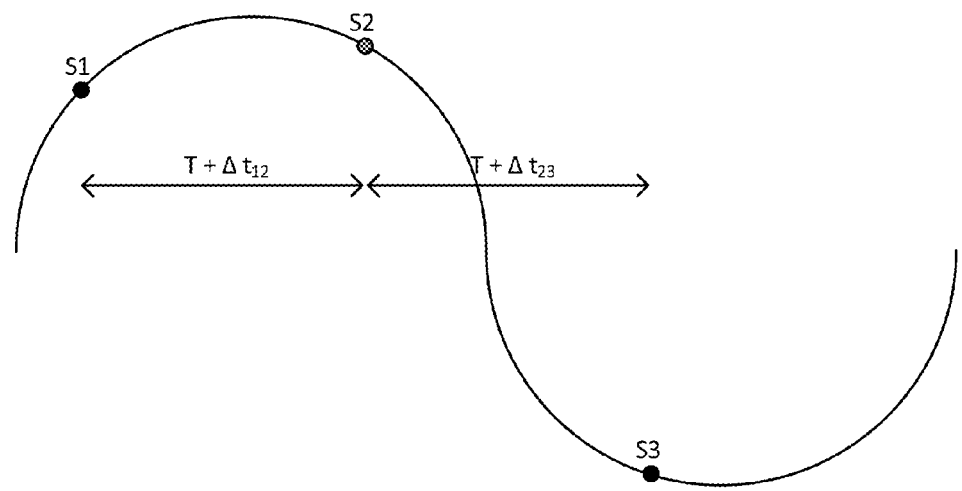
FIG. 27 illustrates sampling of adjacent sub-ADCs, according to some embodiments of the disclosure.
Figure 28:
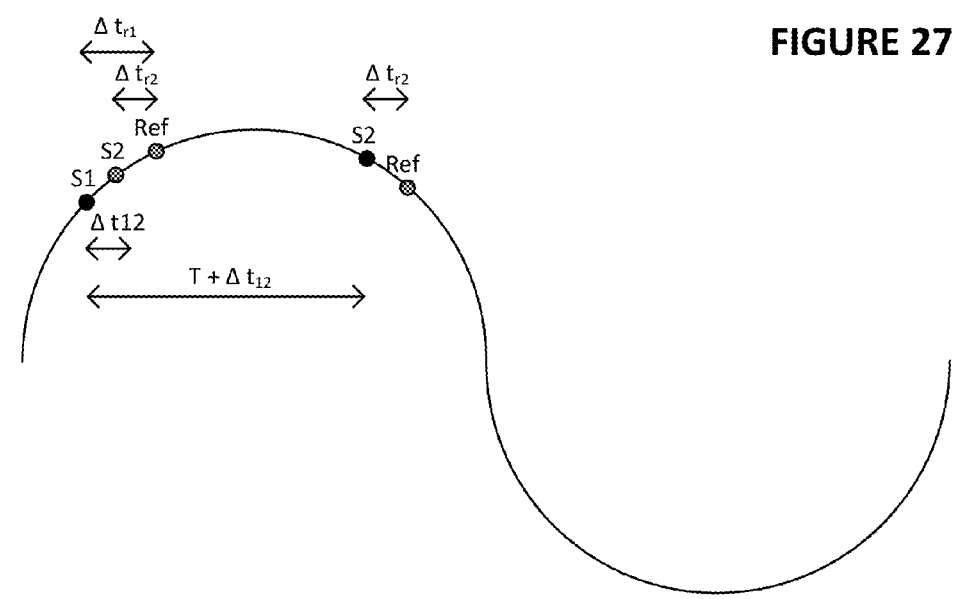
FIG. 28 illustrates sampling of reference and adjacent sub-ADCs, according to some embodiments of the disclosure.

Sampling times for interleaved for each of the interleaved sub-ADCs may not be matched exactly over time, and the interleaving skew can be calibrated. FIG. 27 illustrates sampling of adjacent sub-ADCs, according to some embodiments of the disclosure. S2 is the reference ADC in this picture. Ideally times between S1,S2 and S2,S3 are equal. FIG. 28 illustrates sampling of reference and adjacent sub-ADCs, according to some embodiments of the disclosure. The reference ADC generally samples data at a lower rate but is generally guaranteed to sample along with all sub- ADCs over time. Cross-correlation can also be applied for interleaving skew calibration. The cross-correlation of two signals can be defined as:

$$AC(\tau) = \frac{1}{N} \sum_{n=0}^{n=N-1} \sin(\omega*nT + \omega*\tau) * \sin(\omega*nT)$$

For sufficiently large N and signals not around Fs/2 this reduces to $$AC(\tau) = \frac{1}{2N} \sum_{n=0}^{n=N-1} \cos(\omega*\tau)$$

Term is proportional to the input frequency and the time delay. This can work across one Nyquist (e.g., DC-5 GHz or 5 GHz-10 GHz) zone at a time. Tau=$T_s$+$t_{mismatch}$. At Fs/2 we change 180 degrees between phases. Based on the cross-correlation and the measured mismatch, it is possible to correct the timing of each sub-ADC by skewing the sample clock in the analog domain. Error coefficients can be calculated by on-chip uP and fed back to the analog side for adjusting the sample clock. A number of schemes can be used to find timing skew, and the on-chip uP can configure the circuitry to make the desired measurements and perform the desired error coefficient updates.

In one example, cross correlation between adjacent sampling sub-ADCs can be used to determine skew. The difference between any 2 sub-ADCs should be zero. One sub-ADC is chosen as the timing reference. Equations for the lag and lead measurements are as follows:
  Ccorr_lag_meas=mean(ref_subADC*sub_adc_lag[sn])
  Ccorr_lead_meas=mean(ref_subADC*sub_adc_lead[sn])
  Thus—Tskew[sn]+=mu*(Ccorr_lag_meas−Ccorr_lead_meas), where Tskew is computed by the on-chip uP and written back to the analog side.

In another example, a reference ADC can be chosen as the timing reference. Equations for the measurements are as follows:
  Ccorr_ref=mean(ref_ADC*ref_subADC)
  Ccorr_2[sn]=mean(ref_ADC*sub_adc_lead[sn])
  Thus—Tskew[sn]+=mu*(Ccorr_ref−Ccorr_2[sn]), where Tskew is computed by the on-chip uP and written back to the analog side.

In some embodiments, one or both of the RefADC and subADCs can be replaced by just the sign bit (e.g., +1 or −1) in any the above equations. For example:

Ccorr_ref=mean(sign(ref_ADC)*sign(ref_subADC [sn]))

Reference ADC Enables More Nyquist Zones and Provides Faster Calibration Loops

Generally, the reference ADC is of a lower resolution (very noisy), sometimes, when the main ADC takes a sample, the reference ADC also samples along with and in parallel with the main ADC. In embodiments where the main ADC has a plurality of time-interleaved sub-ADCs which are operating in a pseudo-randomized sequence (i.e., the time-interleaved sub-ADCs are randomly sampling the analog input), the reference ADC can be randomly sampling the analog input. A randomly sampling ADC means that the (instantaneous or any given) sampling period can vary or can be randomized so that the sampling frequency is spread out across multiple frequencies or a range of frequencies, as related to spread spectrum clocking described herein). Advantageously, the randomly sampling reference ADC can avoid issues caused by periodicity in the system, etc.

In some cases, the reference ADC has a maximum sampling rate that is slower than the effective sampling rate of the main ADC (e.g., effective rate of the time-interleaved sub-ADCs). The sampling rate of the reference ADC may be closer to the sampling rate of one of the time-interleaved ADCs. When one of sub-ADCs in the main ADC is sampling, the reference ADC may not necessarily be sampling along with the one ADC that is sampling since the sampling rate of the reference ADC is slower than the effective rate of the time-interleaved sub-ADCs. However, over time, the reference ADC is expected to sample substantially the same number of times with each of the sub-ADCs in the main ADC.

In some cases, the reference ADC is a fast but noisy ADC (the faster the reference ADC is, the more information it can generate for the calibration algorithms). To provide a fast ADC, it is possible to provide a fast ADC (which can sample as fast as the main ADC), but digitizes the data at a slower rate. The main ADC and the reference ADC generally do not sample at exactly the same time, but the sampling of the reference ADC and the sampling of the main ADC is done substantially close together in time (e.g., 10-15 picoseconds apart). By design, the reference ADC can be guaranteed to sample just after the main ADC takes a sample, or the reference ADC can be guaranteed to sample just before the main ADC takes a sample. Ideally the two samples should equal, or at least on average the two samples should be equal. The digital output of the reference ADC should be representative of the digital output generated by the main ADC (or one of the sub-ADCs in the ADC that was sampling). Based on this assumption, calibration algorithms can run in a mode that drives the main ADC to be equal to the reference ADC on average.

In some implementations of interleaved calibration, restrictions are imposed on what the input signal can be, e.g., that the input signal can normally occupy 1 Nyquist zone. For an exemplary 10 GHz converter, the input signal may then occupy from DC to 5 GHz, or 5 GHz to 10, but not both. However, with a reference ADC sampling at the same time as the main ADC (instead of relying on one of the sub-ADCs as a reference, or use only information from the main ADC to calibrate the ADC), the one-Nyquist zone limitation is no longer a restriction, and the input can occupy any frequency. Effectively, the reference ADC can allow the converter to work across multiple Nyquist zones.

Another benefit of the reference ADC, as explained above, is the ability to speed up the calibration loops. The reference ADC can be used as the reference so that less number of samples is needed to obtain the average of the input signal. If you don't have a reference ADC, and you are calibrating within the channels, you only unique information shows up at 10 GHz (the sample rate of your converter). The faster the reference ADC, the faster the calibration algorithm can converge.

Generally speaking, many of the calibration schemes leverages random sampling for best performance. Random sampling avoids issues with input signals that are harmonically related to the clock (e.g., Fs/2, Fs/4, Fs/8, etc.). For instance, with 8 sequentially interleaved ADCs each sampling at Fs/8, each interleaved ADC would have a DC input. The DC offset in the interleaved ADCs would be corrupted. The DC, Gain, and timing information cannot be separated. Having the main ADC randomly sampling the input signal helps make the calibrations more robust for different types of input signals. Furthermore, the randomly sampling reference converter helps to make sure any interference the reference converter causes to the main ADCs look more noise like and minimizes any degradation in spurious-free dynamic range (SFDR).

On-chip uP can Control Error Coefficient Update Rate

In the many of the calibration processes described herein, μ or "mu" is a variable which can be used to change the rate of how quickly the error coefficients (e.g., dc_corr[sn]) are being updated. The effect of "mu" filters changes to the error coefficient according to a desirable step size set by the value of "mu". The on-chip uP can be used to control "mu", e.g., based on operating conditions (e.g., temperature changes, age, etc.). Advantageously, the "mu" can be optimized for a given time.

On-chip uP as a Controller

One advantage of an on-chip uP is its ability to assert start signals to correlators of calibration blocks to initiate averaging and correlation of samples. Once the correlator has completed averaging and correlating a specified number of samples (e.g., can be specified by the on-chip uP), the correlator can assert an interrupt signal to the on-chip uP to indicate the data for calibration is ready to be read by the on-chip uP.

Overview of Technical Advantages of the on-Chip uP

Providing an on-chip uP (as opposed to using solely specialized digital hardware) is the ability to shorten design and/or test time by moving hardware resistor-transistor logic (RTL) into software code that can be executed by the on-chip uP. The on-chip uP can potentially reduce power and/or area by moving some processing to the on-chip uP (which operates in a lower sample rate domain). While the on-chip uP is clocked fast, the on-chip uP can further reduce power by operating in a low power state when the on-chip uP is not needed. Furthermore, the on-chip uP can reduce dedicated hardware. Precision requirements are easier to meet with an on-chip uP because, e.g., 32-bit integers and single-precision floating point re available. The need to optimize math is reduced. The on-chip uP provides a great amount of flexibility to improve trim/calibration on silicon. In some embodiments, firmware can be updated or selected using fuses, which can provide the ability to tailor parts for market segments or customers. The on-chip uP can possibly speed up test time by providing on-chip computation.

Overview of the on-chip uP (Subsystem) and Connections of the on-chip uP

Figure 29:
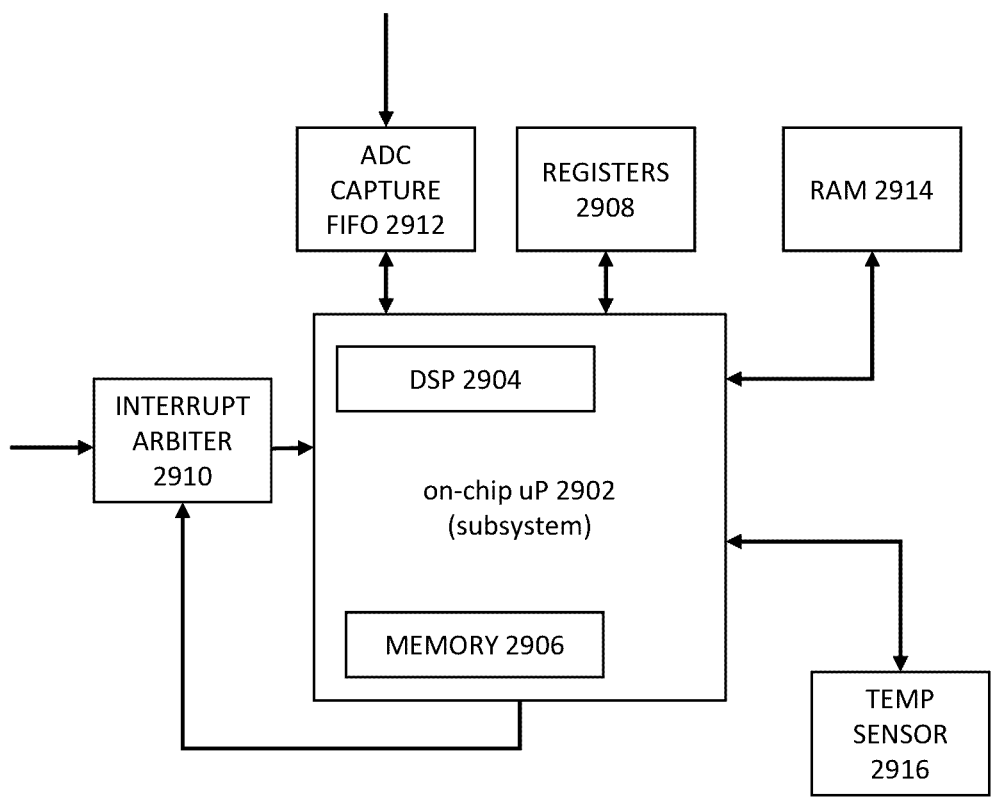
FIG. 29 shows an exemplary on-chip uP and connections of the on-chip uP to communicate with the rest of the chip, according to some embodiments of the disclosure.

FIG. 29 shows an exemplary on-chip uP and connections of the on-chip uP to communicate with the rest of the chip, according to some embodiments of the disclosure. The on-chip uP 2902 (subsystem) can include a digital signals processor 2904, or some suitable processor which can execute instructions to carry out data processing such as arithmetic logic, etc. The instructions and data associated with the data processing can be stored in internal memory 2906. Generally speaking, the on-chip uP 2902 can write and/or read registers 2908 which can store a variety of data including error coefficients, measured error, states of the on-chip uP 2902, parameters for calibration processes, states of the calibration processes, etc. An address decode block can be used to map memory addresses used by the processor to addresses used by the registers. Usually, measurements can readable by the on-chip uP 2908 through registers. A serial peripheral interface (or some other suitable interface) can provide external access to the on-chip uP 2902 (e.g., such as access to memory 2906). The interface can also provide external access to the memor(-ies) and/or register(s) to which the on-chip uP 2902 can access. Furthermore, the interface can also provide external access to memor(-ies) and/or register(s) to which the on-chip uP 2902 do not have access.

An interrupt arbiter 2910 can include circuitry which can generate an IRQ (an interrupt signal) from one or more DONE signals (signal indicating measurements are ready, e.g., from a correlator) and provide IRQ to the on-chip uP 2902 to signal to the on-chip uP that the measurements are ready. Advantageously, the interrupt arbiter can reduce interrupt count from the hardware to the on-chip uP 2902. For instance, eight DONE signals from sub-ADC calibration blocks can be reduced to one. In another instance, eight DONE signals from interleaving measurements can be reduced to one. This interrupt arbiter can simplify software coding and reduces simulation set. Furthermore, the interrupt arbiter can lower context switching overhead/power.

The ADC Capture first in first out (FIFO) buffer 2912 accessible by the on-chip uP 2902 allows capture of ADC data or debug information.

In some embodiments, a random access memory (RAM) 2914 or some other suitable memory element is accessible (read and/or write) by the on-chip uP 2902 as spare memory for storing data and/or instructions. For instance, parameters and/or instructions for the calibration algorithms can be loaded onto RAM 2914 and the on-chip uP 2902 can execute calibration algorithms using on the parameters and/or instructions (thereby allowing calibration algorithms to be tuned/changed on the fly).

One or more sensors can provide sensor measurements to the on-chip uP 2902 to improve calibration algorithms, including a temperature sensor 2916. In one example, the temperature measurement can enable rates for updating error coefficients to change accordingly (e.g., big changes in temperature may suggest error coefficients should be updated faster). In another example, temperature measurement can be used to select a set of error coefficients to be used.

The following describes an exemplary sequence of operation of the on-chip uP, such as on-chip uP 2902:

1. The processor issues a START command (e.g., using a START signal, or transmitting a signal to set a START bit in register to a state that indicates "START") to one or more dedicated measurement hardware to capture measurements. Examples include correlators, DC offset accumulation/decimation blocks, average magnitude accumulation/decimation blocks. The register of the dedicated measurement hardware can include a separate ENABLE Bit, so the on-chip uP can enable only what it needs. Clocks can be gated off to save power if not enabled.
2. Each dedicated measurement hardware, or groups of dedicated measurement hardware (e.g., 8 sub-ADCs) can return a DONE signal once the measurement is complete.
3. The signals from the dedicated measurement hardware, or groups of dedicated measurement hardware can be synchronized in hardware (e.g., using interrupt arbiter) to provide a reduced set of interrupts to the on-chip uP.
4. On interrupt, memory mapped coefficients are read from the hardware. The memory mapped coefficients can be placed in the (32-bit) registers for speed.
5. The (32-bit) data is read back, and is either further averaged in the on-chip uP or is immediately used for adaptive updates. Adaptive updates can occur using the read back measurement data, using LMS or any suitable method, e.g., Coef=Coef+μ*step
6. These updates are the state variables or "memory" in the system. The coefficients are adjusted when needed, but is generally not cleared unless the on-chip uP is reset. If one variable is messed up the performance could suffer until background calibration reconverge. In some cases, software redundancy can be provided to improve reliability. For example, the redundancy function can enforce rules on the coefficients, e.g., 2 of 3 memory locations must agree for the update to occur.

7. The adapted coefficients are mapped to coefficients to drive the high speed hardware. Look up tables (e.g., muxes) and other values are calculated by the on-chip uP for the high-speed hardware and written back to the 32-bit registers.

8. The on-chip uP can, if desired, signals a new START and repeats the process. The on-chip uP can also go into a low power state until conditions indicate the on-chip uP should signal a new START.

Besides implementing calibration, the on-chip uP (serving as the controller of the overall system), can also provide functionality in debug mode. For instance, the on-chip uP can use a capture FIFO to obtain ADC data from all sub-ADCs and reference ADCs in any debug mode. Furthermore, the on-chip uP can allow other calibrations to be done in a block processing manner. While the on-chip uP can have slower convergence, the on-chip uP offers huge flexibility. Moreover, the on-chip uP can generate hardware Error Waveform and integral non-linearity curves, which can be used for factory/foreground trim if an input can be provided.

Besides reducing design and/or test time by moving processing on chip, having the same firmware code used during the design, test, and product phases can promote code reuse.

Besides providing arithmetic calculations, the on-chip uP can provide digital signal processing functions such as discrete Fourier transforms and fast Fourier transforms that can enable better estimation of spectral content (of the input and/or output), which can in turn allow better tuning for some calibration algorithms.

Examples Illustrating Microprocessor-Assisted Calibration for Analog-to-digital Converter Example 1 is a randomized time-interleaved analog-to-digital converter comprising: two or more analog-to-digital converters (ADCs) for sampling, interleaved in time according to a pseudo-randomized sequence, an analog input signal and generating respective digital output signals, a microprocessor on-chip with the two or more analog-to-digital converters for executing instructions stored on-chip configured to assist the randomized time-interleaved analog-to-digital converter, first circuitry (can be digital or analog) for adjusting the two or more analog-to-digital converters, and second circuitry (dedicated specialized circuitry, or high speed circuitry) for processing signals in the two or more analog-to-digital converters to generate and record measurements of the signals in an on-chip memory, and making the measurements accessible to the microprocessor at a rate slower than a clock rate of the microprocessor.

When interleaved in time, these two or more ADCs can effectively sample the analog input faster than the rate of just one ADC. In some cases, the randomized time-interleaved analog-to-digital converter can include three or more ADCs (e.g., 4 sub-ADCs, 8 sub-ADCs, etc.). In some embodiments, the second circuitry is clocked at the rate of one ADC. Since the microprocessor generally can run at a much slower rate than one ADC, and the microprocessor can be limited to how fast and how much data the microprocessor can process. The second circuitry is provided to reduce the amount of data (i.e., by converting raw data to measurements), and reduce the rate of the data so that it is at a rate low enough for the data/measurements to be processed by the microprocessor. This second circuitry is in contrast to a capture memory (e.g., a first in first out memory) for capturing raw data of the ADCs, because the second circuitry processes the data to generate measurements for the microprocessor. In some embodiments, a capture memory can be implemented in addition to the second circuitry, e.g., for debugging purposes. The microprocessor can be provided on a same semiconductor substrate as the two or more analog-to-digital converters.

In some cases, the first circuitry comprises calibration circuitry for correcting signals in a digital domain. In some cases, the first circuitry comprises calibration circuitry for compensating errors of the two or more analog-to-digital converters in an analog domain.

In Example 2, the randomized time-interleaved analog-to-digital converter of Example 1 can optionally include a clock generator for generating a clock signal for the microprocessor to provide spread spectrum clocking, wherein the clock signal has on average a particular frequency but an instantaneous period of the clock signal is randomized.

In Example 3, the randomized time-interleaved analog-to-digital converter of Example 2 can optionally include the clock generator generating clock signal(s) for running one or more of the following: any one or more of the two or more analog-to-digital converters, and a reference analog-to-digital converter sampling in parallel with the two or more analog-to-digital converters.

In Example 4, the randomized time-interleaved analog-to-digital converter of any one of Examples 1-3 can optionally include the second circuitry for processing signals in the two or more analog-to-digital converters comprises one or more of the following: correlator logic, accumulation logic, decimation logic, absolute value logic, and squaring logic.

In Example 5, the randomized time-interleaved analog-to-digital converter of any one of Examples 1-4 can optionally include the first circuitry comprising registers for storing coefficients, said registers accessible by one or more of the following: any one or more of the two or more analog-to-digital converters, the second circuitry, and a reference analog-to-digital converter sampling in along with the two or more analog-to-digital converters.

In Example 6, the randomized time-interleaved analog-to-digital converter of any one of Examples 1-5 can optionally comprise wherein the instructions includes a code portion selected from a plurality of code portions for different applications, wherein the code portion is selected using one or more of the following: one or more fuses, non-volatile memory, and one or more input pins. In some implementations, the instructions are generated from code that is partitioned for different applications. Code portions can encompass code partition, code segment, etc. Depending on the application (or product), different code portion or sets of code portions can be selected for generating instructions to be executed by the microprocessor. The result is a highly flexible system.

In Example 7, the randomized time-interleaved analog-to-digital converter of Example 6 can optionally include the code portions corresponding to different calibration sequences or different calibration schemes for the randomized time-interleaved analog-to-digital converter.

In some cases, the instructions are loaded and stored in volatile memory on chip by a user via an interface. In some cases, the microprocessor includes an interface for changing parameters of the randomized time-interleaved analog-to-digital converter. The parameters can include one or more of the following: modes of operation, whether an analog-todigital converter is used, resolution of the analog-to-digital converter, and dynamic range of the analog-to-digital converter. In some cases, includes an interface for accessing error logs or abnormal events of the randomized time-interleaved analog-to-digital converter.

In Example 8, the randomized time-interleaved analog-to-digital converter of any one or Examples 1-7 can optionally include the microprocessor polling the on-chip memory for measurements. The on-chip memory can encompass any one or more of the following: on-chip storage circuitry or on-chip storage elements, on-chip memory hardware, on-chip memory circuitry, on-chip registers for storing data or values, etc.

In Example 9, the randomized time-interleaved analog-to-digital converter of any one of Examples 1-8 can optionally include the microprocessor asserting a start signal to the second circuitry to initiate processing of signals in the two or more analog-to-digital converters by the second circuitry, and the second circuitry transmitting an interrupt to the microprocessor to signal to the microprocessor that the measurements are ready.

In Example 10, the randomized time-interleaved analog-to-digital converter of any one of Examples 1-9 can optionally include a digital-to-analog converter (DAC) for generating bits of a random signal being injected into a first one of the two or more analog-to-digital converters; and a subtraction circuit for subtracting the injected random signal, the subtraction circuit comprising two registers per each bit of the digital-to-analog converter, wherein values stored in the two registers are selectable by a respective bit of the random signal for subtracting the random signal. The second circuitry can comprise a one-bit correlator and an accumulator block for estimating errors of a particular bit in the dither digital-to-analog converter, and the microprocessor can update values stored in the two registers per each bit based on the estimated errors. In some cases, this digital-to-analog converter is a dither digital-to-analog converter, and the random signal is a dither signal being injected into an ADC. The subtraction circuit would aim to subtract the dither signal completely. This system treats the DAC as a sum of multiple two-level DACs, and tries to find the error for each two-level DAC separately/independently. A single set of the one-bit correlator and accumulator block can be provided in the system and the error estimation can be performed bit by bit (one by one). In some cases, multiple sets of the one-bit correlator and accumulator block can be provided so that the multiple bits can be correlated at a time (in parallel).

In Example 11, the randomized time-interleaved analog-to-digital converter of Example 10 can optionally include the dither digital-to-analog converter being configured to toggle between two values corresponding to a bit under calibration every clock cycle, and randomly toggle between two values for other bits on a divide by two clock, to allow an error of the bit under calibration to be measured by the one-bit correlator and the accumulator block.

Example 12 is a method for assisting a randomized time-interleaved analog-to-digital converter comprising two or more analog-to-digital converters for sampling, interleaved in time according to a pseudo-randomized sequence, an analog input signal and generating respective digital output signals. The method comprises executing, by a microprocessor on chip with the two or more analog-to-digital converters, instructions stored on-chip configured to assist the randomized time-interleaved analog-to-digital converter, processing, by dedicated circuitry, signals in the two or more analog-to-digital converters, recording, by the dedicated circuitry, measurements of the signals in a memory accessible to the on-chip microprocessor at a rate slower than a clock rate of the microprocessor, and writing, by the on-chip microprocessor, coefficients to calibration circuitry for adjusting the two or more analog-to-digital converters, wherein the coefficients are determined by the on-chip microprocessor based on the measurements and the instructions executable by the on-chip microprocessor.

In Example 13, the method of Example 12 can optionally include detecting, by the on-chip microprocessor, condition(s) in the randomized time-interleaved analog-to-digital converter based on measurements recorded by the dedicated circuitry, and adjusting, by the on-chip microprocessor, one or more parts of an adaptation algorithm based on the condition(s) being detected. An example of a condition is overranging (sometimes referred to as clipping due to the input signal being too large). When such a condition is detected, the on-chip microprocessor can halt the updating or writing of error coefficients to the calibration circuitry (e.g., on-chip memory that is accessible by the randomized time-interleaved ADC)

In Example 14, the method of Examples 12 or 13 can optionally include ensuring, by the on-chip microprocessor, error coefficient(s) being written to the calibration circuitry do not go beyond a suitable range or do meet one or more expected characteristics. This can involve checking whether the error coefficient is within the suitable range or whether the error coefficient is outside of the suitable range. This can involve checking the error coefficient against one or more expected characteristics (e.g., a coefficient cannot be zero, a coefficient cannot be negative, a coefficient cannot be more than N number of standard deviations from a mean, a coefficient cannot be an outlier based on a certain statistical probability distribution, etc.).

In Example 15, the method of any one of Examples 12-14 can optionally include adjusting, by the on-chip microprocessor, the dedicated circuitry based on measurements of a state of the randomized time-interleaved analog-to-digital converter, wherein adjusting the second circuitry comprises adjusting a number of samples being used for averaging in an accumulator or a term used for dividing an accumulated value when computing an average.

In Example 16, the method of any one of Examples 12-15 can optionally include executing, by the on-chip microprocessor, an adaptation algorithm for updating error coefficients being written to the calibration circuitry, adjusting, by the on-chip microprocessor, a rate of the adaptation algorithm based on a state of the randomized time-interleaved analog-to-digital converter.

In Example 17, the method of any one of Examples 12-16 can optionally include determining whether an input frequency is of a certain range, and tuning a number of dithering levels of the randomized time-interleaved converter in response to determining the input frequency is of the certain range.

Example 18 is a system on-chip with a time-interleaved analog-to-digital converter for assisting the time-interleaved analog-to-digital converter. The system comprises a microprocessor comprising a digital signal processor for executing instructions for carrying out arithmetic logic associated with calibration of the time-interleaved analog-to-digital converter, dedicated circuitry for (processing raw data and) making measurements of the time-interleaved analog-to-digital converter, internal memory for storing instructions and data associated with the arithmetic logic, registers for storing data for assisting the time-interleaved analog-to-digital converter, wherein the registers are accessible to the microprocessor, the dedicated circuitry, and the time-interleaved analog-to-digital converter, and an interrupt arbiter including circuitry for generating an interrupt signal to the microprocessor in response to receiving one or more signals from dedicated circuitry indicating measurements are ready.

In Example 19, the system of Example 18 can optionally include the registers storing one or more of the following: error coefficients, measured error, states of the microprocessor, parameters for calibration processes, and states of the calibration processes.

In Example 20, the system of Example 18 or 19, can optionally include one or more sensors for providing sensor measurements to the microprocessor to change one or more rates for updating error coefficients associated with the calibration according to the sensor measurements.

Example 21 is an apparatus for performing any one of the methods in Examples 12-17.

Examples Illustrating Randomly Sampling Reference ADC for Calibration

Example 101 is a randomized interleaved analog-to-digital converter comprising: two or more analog-to-digital converters to sample, interleaved in time according to a pseudo-randomized sequence, an analog input of the randomized interleaved analog-to-digital converter and generate respective digital outputs, a digital combiner to combine the respective digital outputs of the two or more analog-to-digital converters to generate a digital output of the randomized interleaved analog-to-digital converter based on the pseudo-randomized sequence, a reference analog-to-digital converter for randomly sampling the analog input and generating reference digital outputs that are representative of the digital outputs of the two or more analog-to-digital converters, and calibration logic for measuring interleaving errors of the two-or analog-to-digital converters based on the respective digital outputs of the two-or more analog-to-digital converters and the reference digital outputs. Note that the reference ADC may not sample the analog input each time one of the two-or-more analog to digital converters is sampling the input. When the reference ADC is sampling, the reference ADC would sample along with a particular one of the two or more ADCs that is selected to sample the input so that a reference digital output generated by the reference ADC would be representative or would represent the digital output generated by that particular selected ADC. In some cases, the reference ADC samples just after that particular selected ADC (by a fixed delay, but very small delay). In some cases, the reference ADC samples ahead of that particular selected ADC (by a fixed lead, but very small lead). The difference in sampling time is sufficiently small to ensure that the reference digital output is still representative of the digital output generated by the particular selected ADC (as such the reference ADC can be considered to sample at substantially the same time as the particular selected ADC). In some cases, over time, the number of times the reference ADC samples along with a particular ADC is roughly the same across the two or more ADCs (even though the reference ADC randomly samples the analog input).

In Example 102, the randomized interleaved analog-to-digital converter of Example 101 can optionally include that each time the reference analog-to-digital converter samples the analog input, the reference analog-to-digital converter samples the analog-input along with one of the analog-to-digital converters that is sampling the analog input. The reference ADC samples the analog input in parallel with one of the analog-to-digital converters that is sampling the analog input, thus the reference ADC serves as additional path, or a path parallel to the two or more ADCs.

In Example 103, the randomized interleaved analog-to-digital converter of Example 101 or 102 can optionally include the reference analog-to-digital converter having (instantaneous) sampling periods which are randomized.

In Example 104, the randomized interleaved analog-to-digital converter of any one of Examples 101-103 can optionally include a clock generator for generating a clock signal having a range of clock periods for the reference analog-to-digital converter to randomly sample the analog input.

In Example 105, the randomized interleaved analog-to-digital converter of any one of Examples 101-104 can optionally include one or more clock divider circuits that output an edge of a clock signal for driving the reference analog-to-digital converter to sample the analog input for every X number of clock cycles of an input clock, and a randomization engine to randomize X used by the one or more clock divider circuits.

In Example 106, the randomized interleaved analog-to-digital converter of any one of Examples 101-105 can optionally include a first resolution of any one of the two or more analog-to-digital converters is higher than a second resolution of the reference analog-to-digital converter.

In Example 107, the randomized interleaved analog-to-digital converter of any one of Examples 101-106 can optionally include the reference analog-to-digital converter serving as an additional signal path for converting the analog input signal in parallel with the two or more analog-to-digital converters.

Example 108 is a method for calibrating a randomized interleaved analog-to-digital converter comprising: generating, by a clock generator, first clock signals for controlling two or more analog-to-digital converters of the randomized time-interleaved analog-to-digital converter to sample, interleaved in time according to a pseudo-randomized sequence, an analog input of the randomized time-interleaved analog-to-digital converter; generating, by the clock generator, a second clock signal for controlling a reference analog-to-digital converter for randomly sampling the analog input, wherein, when the reference analog-to-digital converter samples the analog input, one of the two or more analog-to-digital converters is also sampling the analog input at substantially the same time, processing respective digital outputs of the two or more analog-to-digital converters and digital outputs of the reference analog-to-digital converter over a period of time to generate measurements, determining interleaving errors associated with the two or more analog-to-digital converters based on the measurements. As noted before, depending on the implementation, the reference ADC can sample along with a particular one of the two or more ADC selected to sample the analog input with a (small) constant time delay (or in some cases the particular one of the two or more ADCs selected to sample the analog input lags behind the reference ADC).

In Example 109, the method of Example 108 can optionally include processing respective digital outputs of the two or more analog-to-digital converters and digital outputs of the reference analog-to-digital converter to generate measurements comprising for each one of the two or more analog-to-digital converters, determining a mean of differences between digital outputs of a particular analog-to-digital converter and corresponding digital outputs of the reference analog-to-digital converter generated when the reference analog-to-digital converter is sampling along the particular analog-to-digital converter.

In Example 110, the method of Example 109 can optionally include determining interleaving errors comprising updating an offset correction term for the particular analog-to-digital converter based on the mean.

In Example 111, the method of Example 108 or 109 can optionally include processing respective digital outputs of the two or more analog-to-digital converters and digital outputs of the reference analog-to-digital converter to generate measurements comprising for each one of the two or more analog-to-digital converters, determining a mean of differences between magnitudes of digital outputs of a particular analog-to-digital converter and magnitudes of corresponding digital outputs of the reference analog-to-digital converter generated when the reference analog-to-digital converter is sampling along the particular analog-to-digital converter.

In Example 112, the method of Example 111 can optionally include determining interleaving errors comprising updating an interleaving gain correction term for the particular analog-to-digital converter based on the mean.

In Example 113, the method of any one of Examples 108-112 can optionally include processing respective digital outputs of the two or more analog-to-digital converters and digital outputs of the reference analog-to-digital converter over a period of time to generate measurements comprising for each one of the two or more analog-to-digital converters, determining a cross correlation of a first signal representing digital outputs of a particular analog-to-digital converter and a second signal representing digital outputs of the reference analog-to-digital converter generated when the reference analog-to-digital converter is sampling along the particular analog-to-digital converter.

In Example 114, the method of Example 113 can optionally include determining interleaving errors comprising updating an interleaving skew correction term for the particular analog-to-digital converter based on the cross correlation of the first signal and the second signal.

In Example 115, the method of Example 113 or 114 can optionally include the digital outputs of the particular analog-to-digital converter and the digital outputs of the reference analog-to-digital converter are represented by a single bit. In some cases, the single bit is a sign bit for a bi-polar converter.

Example 116 is a randomized converter system on a single chip for converting an analog input to a digital output. The system comprises two or more analog-to-digital converters to sample, interleaved in time according to a pseudo-randomized sequence, the analog input of the randomized converter system and generate respective digital outputs, a reference analog-to-digital converter for sampling the analog input along with one of the two or more analog-to-digital converters at random and generating reference digital outputs, dedicated logic for recording measurements of digital outputs of the two or more analog-to-digital converters and reference digital outputs of the reference analog-to-digital converter, and an on-chip microprocessor for assisting the randomized converter system based on the measurements.

In Example 117, the randomized converter system of Example 116 can optionally include a clock generator for generating clock signals to the two or more analog-to-digital converters to sample, interleaved in time according to the pseudo-randomized sequence, and a clock signal to the reference analog-to-digital converter for randomly sampling the analog input.

In Example 118, the randomized converter system of Example 117 can optionally include the clock generator further generating a spread spectrum clock signal for clocking the on-chip microprocessor, wherein instantaneous period of the spread spectrum clock signal is randomized.

In Example 119, the randomized converter system of any one of Examples 116-118 can optionally include the on-chip microprocessor executing instructions for computing one or more of the following: interleaving offset correction term (for any one of the two or more ADCs); interleaving gain correction term (for any one of the two or more ADCs), interleaving skew correction term (for any one of the two or more ADCs), frequency response (e.g., transfer function of any one of the two or more ADCs), and linearity of any one of the two or more analog-to-digital converters.

In Example 120, the randomized converter system of any one of Examples 116-119, wherein the reference analog-to-digital converter and the two or more analog-to-digital converters are each sampling the analog input according to randomized periods.

In Example 121, the randomized converter system can include means for performing any one of the methods in Examples 108-115.

Examples Illustrating Efficient Calibration of Errors in Multi-stage Analog-to-digital Converter Example 1001 is a multi-stage analog-to-digital converter with digitally assisted calibration. The multi-stage analog-to-digital converter comprises: (A) a plurality of analog-to-digital converter stages in cascade, each analog-to-digital converter stage for generating a respective output code and a respective amplified output residue signal; (B) digital correction logic for each analog-to-digital converter stage comprising: (1) a dedicated memory element for storing correction terms, (2) a multiplexer selecting one of the correction terms in the dedicated memory element based on the respective output code, and (3) an adder (or equivalent circuitry) for correcting an error of the multi-stage analog-to-digital converter based on the selected correction term; and (C) digital circuitry on-chip with the plurality of analog-to-digital converter stages for computing the correction terms in the dedicated memory elements, wherein computing correction terms used for a given analog-to-digital converter stage takes into account an error term from one or more earlier analog-to-digital converter stage. This example can be beneficial for correcting errors in the transfer function(s) of the multi-stage analog-to-digital converter. These errors can encompass gain errors, linearity errors, etc. The correction terms can replace a signal in the signal chain of the multi-stage analog-to-digital converter to change the transfer function of interest. The correction terms, in some cases, can be added to a signal in the signal chain of the multi-stage analog-to-digital converter to change the transfer function of interest.

In Example 1002, the multi-stage analog-to-digital converter of Example 1001 can optionally include the adder adding the correction term to a sum of the respective output code multiplied by a predetermined weight and the respective amplified output residue signal. An example of this adder function is illustrated in FIG. 25 in stg_cal 2504.

In Example 1003, the multi-stage analog-to-digital converter of Example 1001 or 1002 can optionally include the digital circuitry being a microprocessor on-chip with the plurality of analog-to-digital converter stages configured to execute instructions to compute the correction terms.

In Example 1004, the multi-stage analog-to-digital converter of any one of Examples 1001-1003 can optionally include the correction term being an additive correction term.

In Example 1005, the multi-stage analog-to-digital converter of any one of Examples 1001-1004 can optionally include the plurality of analog-to-digital converter stages comprising a first stage and a second stage following the first stage, and computing correction terms for the second stage comprising computing a first cumulative gain term which includes an interstage gain error of the first stage and an interstage gain error of the second stage.

In some cases, the multi-stage analog-to-digital converter can optionally include the plurality of analog-to-digital converter stages further comprising a third stage following the second stage (or even more stages), and computing correction terms for the third stage comprising computing a second cumulative gain term which includes the interstage gain error of the first stage, the interstage gain error of the second stage, and an interstage gain error of the third stage. Phrased differently, correction terms in subsequent stages takes into account the interstage gain error of earlier stages.

In Example 1006, the multi-stage analog-to-digital converter of any one of Examples 1001-1005 can optionally include computing correction terms comprising determining a gain correction term for the given analog-to-digital converter stage, determining a capacitor error term per output code of the given analog-to-digital converter stage, and adding each capacitor error term by the gain correction term multiplied by an output code to which the capacitor error term corresponds to obtain the correction terms selectable by the output codes.

In Example 1007, the multi-stage analog-to-digital converter of any one of Examples 1001-1006 can optionally include computing correction terms comprising determining a gain correction term for the given analog-to-digital converter stage, determining a linearity error term per output code of the given analog-to-digital converter stage, adding each linearity error term by the gain correction term multiplied by an output code to which the linearity error term corresponds to obtain the correction terms selectable by the output codes.

In Example 1008, the multi-stage analog-to-digital converter of any one of Examples 1001-1007 can optionally include for each analog-to-digital converter stage, the multi-stage analog-to-digital converter further comprising a further dedicated memory element for storing further correction terms, a further multiplexer selecting one of the further correction terms in the further dedicated memory element based on a delayed version of the respective output code. Correcting the error of the multi-stage analog-to-digital converter based on the selected correction term by the adder is further based on the selected further correction term. For instance, correcting the error can include summing the selected correction term and the selected further correction term to obtain a final correction term to be used by the adder.

In Example 1009, the multi-stage analog-to-digital converter of any one of Examples 1001-1008 can optionally include the plurality of analog-to-digital converter stages comprising a first stage and a second stage following the first stage, and computing correction terms for the second stage comprising computing a first cumulative linear filter which includes a linear filter corresponding to the first stage and a linear filter corresponding to the second stage.

In Example 10, the multi-stage analog-to-digital converter of Example 1009 can optionally include computing the first cumulative linear filter comprising computing a convolution of taps of the linear filter corresponding to the first stage and taps of the linear filter corresponding to the second stage. In some cases, the plurality of analog-to-digital converter stages further comprises a third stage following the second stage (or even further subsequent stages), and computing correction terms for the third stage comprises computing a second cumulative linear filter which includes the linear filter corresponding to the first stage, the linear filter corresponding to the second stage, and a linear filter corresponding to the third stage. Phrased differently, correction terms for subsequent stages takes into account linear filters of earlier stages.

Example 1011 is a digitally assisted method for calibrating a multi-stage analog-to-digital converter comprising: measuring, by dedicated circuitry, errors in a plurality of analog-to-digital converter stages in cascade, wherein the analog-to-digital converter stages generate respective output codes and respective residue signals, computing, by digital circuitry on-chip with the plurality of analog-to-digital converter stages, correction terms to be used for correcting residue signals of the analog-to-digital converter stages based on the measured errors, wherein computing correction terms used for a given analog-to-digital converter stage takes into account an error measured for one or more earlier analog-to-digital converter stage, writing, by the digital circuitry, the correction terms to separate look up tables provided for each residue signal to be corrected, wherein each look up table is indexed by output codes of a respective analog-to-digital converter stage. In some cases, the digital circuitry comprises an on-chip microprocessor.

In Example 1012, the digitally assisted method of Example 1011 can optionally include errors measured by the dedicated circuitry comprising interstage gain errors of the analog-to-digital converter stages.

In Example 1013, the digitally assisted method of Example 1012 can optionally include measuring the interstage gain errors comprising: injecting a random signal to a particular analog-to-digital converter stage, and removing the random signal based on a previously determined gain of the particular analog-to-digital converter stage to measure an interstage gain error of the particular analog-to-digital converter stage.

In Example 1014, the digitally assisted method of Example 1013, can optionally include the random signal being a two-level pseudo-random signal.

In Example 1015, the digitally assisted method of Example 1014 can optionally include correlating, by the dedicated circuitry comprising correlator circuitry, the random signal with an error signal left behind after the random signal is removed.

In Example 1016, the digitally assisted method of Example 1015, can optionally include reading, by the digital circuitry, correlation measurements made by the dedicated circuitry, and updating the interstage gain error of the particular analog-to-digital converter stage based on the correlation measurements and a predetermined time constant.

In Example 1017, the digitally assisted method of any one of Examples 1011-1016, wherein computing correction terms used for the given stage comprises multiplying an interstage gain error term for the given stage and one or more interstage gain error terms from the one or more earlier analog-to-digital converter stages.

In Example 1018, the digitally assisted method of any one of Examples 1011-1017, wherein computing correction terms used for the given stage comprises combining linear filter for the given stage and linear filter(s) of the one or more earlier analog-to-digital converter stages.

In Example 1019, the digitally assisted method of any one of Examples 1011-1018, wherein computing correction terms comprises: determining a gain correction term for the given analog-to-digital converter stage, determining a capacitor error term per output code of the given analog-todigital converter stage, and adding each capacitor error term by the gain correction term multiplied by an output code to which the capacitor error term corresponds to obtain the correction terms selectable by the output codes.

Example 1020 is an apparatus comprising: a plurality of cascaded analog-to-digital converting means for generating respective output codes and respective residue signals, dedicated circuitry means for measuring errors in the plurality of analog-to-digital converter means, separate storage means provided for each residue signal to be corrected, each storage means for storing correction terms selectable by a respective output code for correcting a respective residue signal, adding means for correcting respective residue signals based on selected correction terms, and digital circuitry means on-chip with the plurality of analog-to-digital converter for updating correction terms in the separate storage means based on the measured errors, wherein updating the correction terms used for a given analog-to-digital converter stage takes into account an error measured for one or more earlier analog-to-digital converter stage. The digital circuitry means can include an on-chip microprocessor for executing instructions to update the correction terms.

In some cases, updating correction terms used for the given stage comprises multiplying an interstage gain error term for the given stage and one or more interstage gain error terms from the one or more earlier analog-to-digital converter stages. In some cases, updating correction terms used for the given stage comprises combining linear filter for the given stage and linear filter(s) of the one or more earlier analog-to-digital converter stages.

In Example 1021, the apparatus can include means for performing any one of the methods in Examples 1011-1019.

Variations and Implementations

The present disclosure describes many embodiments related to analog-to-digital converters (ADCs), but it is envisioned by the disclosure that the embodiments are applicable to other converters, e.g., digital to analog converters, especially converters which can provide digital circuitry and/or a microprocessor on the same substrate. Furthermore, the embodiments disclosed herein are also applicable to a vertically integrated converter and processor on different sides or on different layers of a vertically integrated circuit with a through-silicon via (TSV) connecting them. In some embodiments, the on-chip uP is provided with the same package as the ADC, but not necessarily on the same semiconductor substrate. Moreover, the embodiments disclosed herein can have on-chip memory and/or on-board memory for supporting the described functions.

Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and converter functions (or some other desired functions): all of which may be provided on a single chip substrate. Other embodiments may include a multi-chip-module (MCM), with a plurality of separate ICs located within a single electronic package and configured to interact closely with each other through the electronic package.

In certain contexts, the features discussed herein can be applicable to converters being used in many different applications. The features herein are also applicable to other signal processing systems that can be assisted by specialized digital circuitry and/or an on-chip uP. Various exemplary applications include medical systems, scientific instrumentation, transportation systems, aerospace systems, wireless and wired communications, radar, industrial process control, audio and video equipment, consumer devices, and other converter-based systems.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various apparatuses for providing digitally assisted function can include electronic circuitry to perform the functions described herein. In some cases, one or more parts of the apparatus can be provided by an on-chip uP specially configured for carrying out the functions described herein. For instance, the on-chip uP may include one or more application specific components, or may include programmable logic gates which are configured to carry out the functions describe herein. The circuitry can operate in analog domain, digital domain, or in a mixed signal domain (but preferably in the digital domain). In some instances, the processor may be configured to carrying out the functions described herein by executing one or more instructions stored on a non-transitory computer medium accessible by the on-chip uP.

In one example embodiment, the chip providing the converter and the on-chip uP may be provided on a board of an associated electronic device. The board can be a general circuit board that can hold various components of the internal electronic system of the electronic device and, further, provide connectors for other peripherals. For instance, the chip having the converter and the on-chip uP can communicate with the components of the associated electronic device (e.g., signal generators, processors, memory, transmitters, receivers, etc.) More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the examples and appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the examples and appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the digitally assisted functions, illustrate only some of the possible functions that may be executed by, or within, systems (e.g., specialized digital circuitry and/or on-chip uP) illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

What is claimed is:

1. A randomized interleaved analog-to-digital converter comprising:
    two or more analog-to-digital converters to sample, interleaved in time according to a pseudo-randomized sequence, an analog input of the randomized interleaved analog-to-digital converter and generate respective digital outputs;
    a digital combiner to combine the respective digital outputs of the two or more analog-to-digital converters to generate a digital output of the randomized interleaved analog-to-digital converter based on the pseudo-randomized sequence;
    a reference analog-to-digital converter for randomly sampling the analog input and generating reference digital outputs that are representative of the digital outputs of the two or more analog-to-digital converters based on randomized sampling periods; and
    calibration logic for measuring interleaving errors of the two-or analog-to-digital converters based on the respective digital outputs of the two-or more analog-to-digital converters and the reference digital outputs.

2. The randomized interleaved analog-to-digital converter of claim 1, wherein each time the reference analog-to-digital converter samples the analog input, the reference analog-to-digital converter samples the analog-input along with one of the analog-to-digital converters that is sampling the analog input.

3. The randomized interleaved analog-to-digital converter of claim 1, wherein the reference analog-to-digital converter has as sampling frequency which is spread out across a range of frequencies.

4. The randomized interleaved analog-to-digital converter of claim 1, further comprising:
    a clock generator for generating a clock signal having a range of clock periods for the reference analog-to-digital converter to randomly sample the analog input.

5. The randomized interleaved analog-to-digital converter of claim 1, further comprising:
    one or more clock divider circuits that output an edge of a clock signal for driving the reference analog-to-digital converter to sample the analog input every X number of clock cycles of an input clock; and
    a randomization engine to randomize X used by the one or more clock divider circuits.

6. The randomized interleaved analog-to-digital converter of claim 1, wherein:
    a first resolution of any one of the two or more analog-to-digital converters is higher than a second resolution of the reference analog-to-digital converter.

7. The randomized interleaved analog-to-digital converter of claim 1, wherein the reference analog-to-digital converter serves as an additional signal path for converting the analog input signal in parallel with the two or more analog-to-digital converters.

8. A method for calibrating a randomized interleaved analog-to-digital converter comprising:
    generating, by a clock generator, first clock signals for controlling two or more analog-to-digital converters of the randomized time-interleaved analog-to-digital converter to sample, interleaved in time according to a pseudo-randomized sequence, an analog input of the randomized time-interleaved analog-to-digital converter;
    generating, by the clock generator, a second clock signal for triggering a reference analog-to-digital converter to randomly sample the analog input and generate digital outputs at randomized periods, wherein, when the reference analog-to-digital converter samples the analog input, one of the two or more analog-to-digital converters is also sampling the analog input at substantially the same time;
    processing respective digital outputs of the two or more analog-to-digital converters and the digital outputs of the reference analog-to-digital converter over a period of time to generate measurements; and
    determining interleaving errors associated with the two or more analog-to-digital converters based on the measurements.

9. The method of claim 8, wherein processing respective digital outputs of the two or more analog-to-digital converters and digital outputs of the reference analog-to-digital converter to generate measurements comprises:

for each one of the two or more analog-to-digital converters, determining a mean of differences between digital outputs of a particular analog-to-digital converter and corresponding digital outputs of the reference analog-to-digital converter generated when the reference analog-to-digital converter is sampling along the particular analog-to-digital converter.

10. The method of claim 9, wherein determining interleaving errors comprises updating an offset correction term for the particular analog-to-digital converter based on the mean.

11. The method of claim 8, wherein processing respective digital outputs of the two or more analog-to-digital converters and digital outputs of the reference analog-to-digital converter to generate measurements comprises:

for each one of the two or more analog-to-digital converters, determining a mean of differences between magnitudes of digital outputs of a particular analog-to-digital converter and magnitudes of corresponding digital outputs of the reference analog-to-digital converter generated when the reference analog-to-digital converter is sampling along the particular analog-to-digital converter.

12. The method of claim 11, wherein determining interleaving errors comprises updating an interleaving gain correction term for the particular analog-to-digital converter based on the mean.

13. The method of claim 8, wherein processing respective digital outputs of the two or more analog-to-digital converters and digital outputs of the reference analog-to-digital converter over a period of time to generate measurements comprises:

for each one of the two or more analog-to-digital converters, determining a cross correlation of a first signal representing digital outputs of a particular analog-to-digital converter and a second signal representing digital outputs of the reference analog-to-digital converter generated when the reference analog-to-digital converter is sampling along the particular analog-to-digital converter.

14. The method of claim 13, wherein determining interleaving errors comprises updating an interleaving skew correction term for the particular analog-to-digital converter based on the cross correlation of the first signal and the second signal.

15. The method of claim 13, wherein the digital outputs of the particular analog-to-digital converter and the digital outputs of the reference analog-to-digital converter are represented by a single bit.

16. A randomized converter system on a single chip for converting an analog input to a digital output, the system comprising:

two or more analog-to-digital converters to sample, interleaved in time according to a pseudo-randomized sequence, the analog input of the randomized converter system and generate respective digital outputs;

a reference analog-to-digital converter for sampling the analog input along with one of the two or more analog-to-digital converters at random and generating reference digital outputs according to randomized sampling periods; and logic for recording measurements of digital outputs of the two or more analog-to-digital converters and the reference digital outputs of the reference analog-to-digital converter; and an microprocessor on-chip with the two or more analog-to-digital converters for assisting the randomized converter system based on the measurements.

17. The randomized converter system of claim 16, further comprising:

a clock generator for generating clock signals to the two or more analog-to-digital converters to sample, interleaved in time according to the pseudo-randomized sequence, and a clock signal to the reference analog-to-digital converter for randomly sampling the analog input.

18. The randomized converter system of claim 17, wherein the clock generator further generates a spread spectrum clock signal for clocking the on-chip microprocessor, wherein instantaneous period of the spread spectrum clock signal is randomized.

19. The randomized converter system of claim 16, wherein the on-chip microprocessor executes instructions for computing one or more of the following: interleaving offset correction term, interleaving gain correction term, interleaving skew correction term, frequency response, and linearity of any one of the two or more analog-to-digital converters.

20. The randomized converter system of claim 16, wherein the reference analog-to-digital converter and the two or more analog-to-digital converters are each sampling the analog input according to randomized periods.

* * * * *

UNITED STATES PATENT AND TRADEMARK OFFICE
CERTIFICATE OF CORRECTION

PATENT NO. : 9,525,428 B2
APPLICATION NO. : 14/955905
DATED : December 20, 2016
INVENTOR(S) : Siddharth Devarajan It is certified that error appears in the above-identified patent and that said Letters Patent is hereby corrected as shown below:

In the Claims

Column 52, Lines 5-7, Claim 1, delete "two-or analog-to-digital converters based on the respective digital outputs of the two-or more analog-to-digital converters and the reference digital outputs." and insert -- "two or more analog-to-digital converters based on the respective digital outputs of the two or more analog-to-digital converters and the reference digital outputs." --

Column 52, Line 46, Claim 8, delete "the randomized time-interleaved analog-to-digital con-" and insert -- "the randomized interleaved analog-to-digital con-" --

Column 52, Line 49, Claim 8, delete "randomized time-interleaved analog-to-digital converter." and insert -- "randomized interleaved analog-to-digital converter." --

Column 54, Line 21, Claim 16, delete "an microprocessor" and insert -- "a microprocessor." --

Signed and Sealed this
Twenty-first Day of February, 2017

Michelle K. Lee
*Director of the United States Patent and Trademark Office*